United States Patent
Schattenburg et al.

(10) Patent No.: US 6,882,477 B1
(45) Date of Patent: Apr. 19, 2005

(54) METHOD AND SYSTEM FOR INTERFERENCE LITHOGRAPHY UTILIZING PHASE-LOCKED SCANNING BEAMS

(75) Inventors: Mark Schattenburg, Wayland, MA (US); Patrick N. Everett, Concord, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/711,019

(22) Filed: Nov. 9, 2000

Related U.S. Application Data
(60) Provisional application No. 60/164,655, filed on Nov. 10, 1999.

(51) Int. Cl.[7] .............................................. G02B 27/00
(52) U.S. Cl. ......................................... 359/577; 359/35
(58) Field of Search ............................. 359/35, 577, 1, 359/34, 10, 28

(56) References Cited

U.S. PATENT DOCUMENTS

| | | | |
|---|---|---|---|
| 3,622,794 A | 11/1971 | Pond et al. | 250/201.9 |
| 3,632,214 A | 1/1972 | Chang et al. | 356/457 |
| 3,650,605 A * | 3/1972 | Little Jr. | 359/15 |
| 3,659,947 A | 5/1972 | Neumann | 356/457 |
| 4,289,403 A | 9/1981 | Allington | 356/491 |
| 4,305,666 A | 12/1981 | Becherer et al. | 356/457 |
| 4,498,740 A | 2/1985 | Caulfield | 359/9 |
| 4,655,539 A | 4/1987 | Caulfield et al. | 359/9 |
| 4,703,994 A | 11/1987 | Leib et al. | 359/19 |
| 4,725,110 A * | 2/1988 | Glenn et al. | 359/3 |
| 5,052,765 A | 10/1991 | Moss et al. | 359/9 |
| 5,066,133 A * | 11/1991 | Brienza | 359/570 |

(Continued)

OTHER PUBLICATIONS

M. L. Schattenburg, C. Chen, P. N. Everett, J. Ferrera, P. Konkola, H. I. Smith, "Sub–100 nm Metrology using Interferometrically Produced Fiducials", J. Vac. Sci. Tech. B, vol. 17, No. 6, pp. 2692–2697, 1999.*

(Continued)

*Primary Examiner*—Thong Nguyen
*Assistant Examiner*—Arnel C. Lavarias
(74) *Attorney, Agent, or Firm*—Gauthier & Connors LLP

(57) ABSTRACT

A method and system of interference lithography (also known as interferometric lithography or holographic lithography) which utilizes phase-locked, scanning beams (so-called scanning beam interference lithography, or SBIL). The invention utilizes a high-precision stage that moves a substrate under overlapped and interfering pairs of coherent beams. The overlapped beams interfere, generating fringes, which form a pattern "brush" for subsequent writing of periodic and quasi-periodic patterns on the substrate. The phase of the fringes in the overlapped region is phase-locked to the motion of the precision stage. The invention includes methods for forming, overlapping, and phase-locking interfering pairs of beams on a variety of substrates; methods for measuring and controlling the period, phase, and angular orientation of fringes generated by the overlapping beams; and methods for measuring and controlling the effects of stage mechanical and thermal drift and other disturbances during the writing process.

31 Claims, 70 Drawing Sheets

U.S. PATENT DOCUMENTS

| | | | |
|---|---|---|---|
| RE34,010 E | | 7/1992 | Magome et al. ............ 356/349 |
| 5,142,385 A | * | 8/1992 | Anderson et al. ........ 250/201.9 |
| 5,151,799 A | | 9/1992 | Ansley ........................ 359/11 |
| 5,291,317 A | | 3/1994 | Newswanger ................ 359/15 |
| 5,479,273 A | | 12/1995 | Ramsbottom .................. 359/9 |
| 5,621,497 A | | 4/1997 | Terasawa et al. ............. 355/53 |
| 5,694,248 A | | 12/1997 | Erdogan et al. ............ 359/570 |
| 5,712,715 A | | 1/1998 | Erdogan et al. ................ 359/8 |
| 5,822,092 A | | 10/1998 | Davis .......................... 359/10 |
| 5,822,479 A | | 10/1998 | Napier et al. .................. 385/37 |
| 5,892,597 A | | 4/1999 | Iwata et al. .................... 359/11 |
| 5,912,999 A | | 6/1999 | Brennan, III et al. ......... 385/37 |
| 6,035,083 A | | 3/2000 | Brennan, III et al. ......... 385/37 |
| 6,072,926 A | | 6/2000 | Cole et al. ..................... 385/37 |
| 6,284,437 B1 | | 9/2001 | Kashyap ..................... 430/321 |
| 6,304,318 B1 | * | 10/2001 | Matsumoto .................. 355/53 |
| 6,404,956 B1 | | 6/2002 | Brennan, III et al. ......... 385/37 |
| 6,414,746 B1 | | 7/2002 | Stettner et al. ............. 356/4.01 |
| 6,437,886 B1 | | 8/2002 | Trepanier et al. ............. 359/35 |
| 6,548,225 B1 | | 4/2003 | Hammon et al. ........... 430/321 |

OTHER PUBLICATIONS

Schattenburg, M.L. et al., "Sub–100 nm metrology using interferometrically produced fiducials," $43^{rd}$ International Conference on Electron, Ion, and Photon Beam Technology and Nanofabrication, Marco Island, Fl., USA, Jun. 1–4, 1999, vol. 17, No. 6, pp. 2692–2697. XP000955448 *Journal of Vacuum Science & Technology B (Microelectronics and Nanometer Structures)*, Nov. 1999, AIP for American Vacuum Soc, USA, ISSN: 0734–211X, p. 2696.

Patent Abstracts of Japan, vol. 14, No. 524 (E–1003), Nov. 16, 1990–&JP 02 220489 A (Mitsubishi Electric Corp), Sep. 3, 1990.

"Large–Area Achromatic Interferometric Lithography for 100 nm Period Gratings and Grids," Savas et al. *J. Vac. Sci. Technol.*, Nov./Dec. 1995. vol. 14.

* cited by examiner

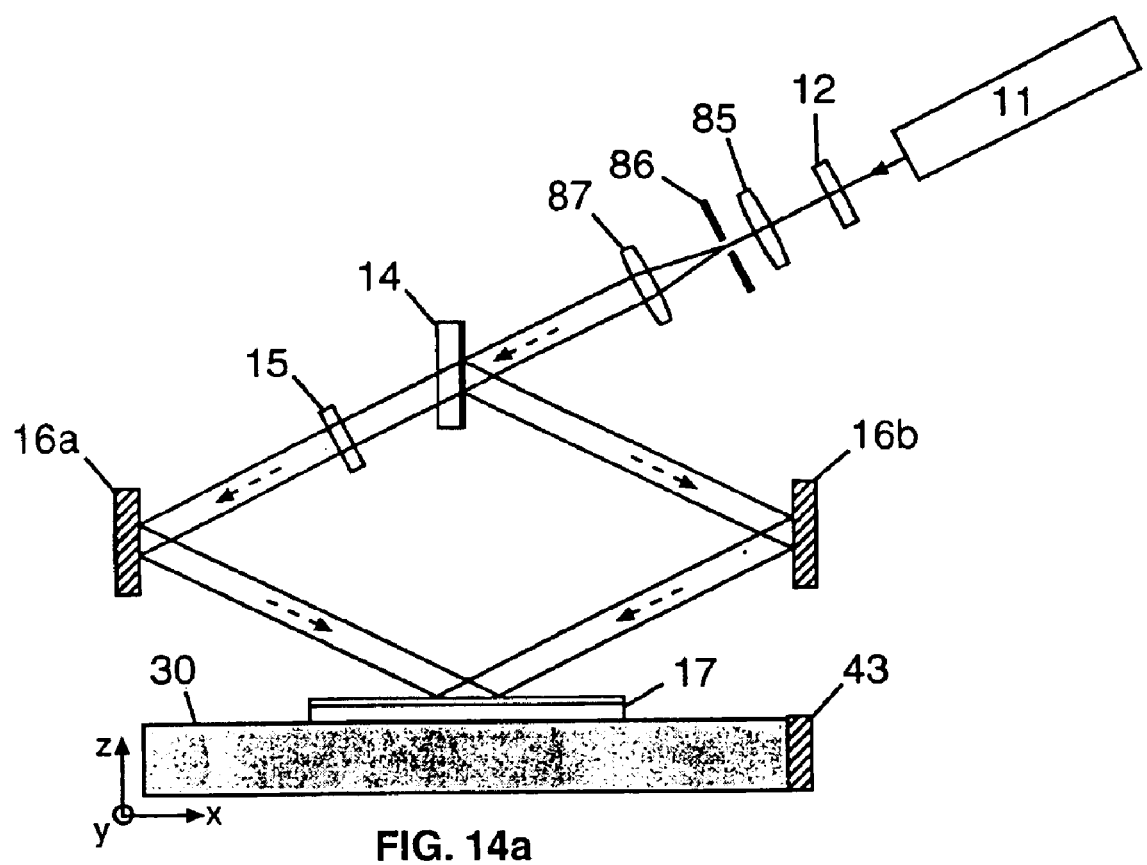
FIG. 14a
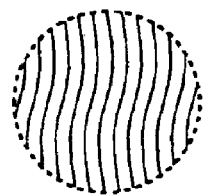
FIG. 14b   FIG. 14c

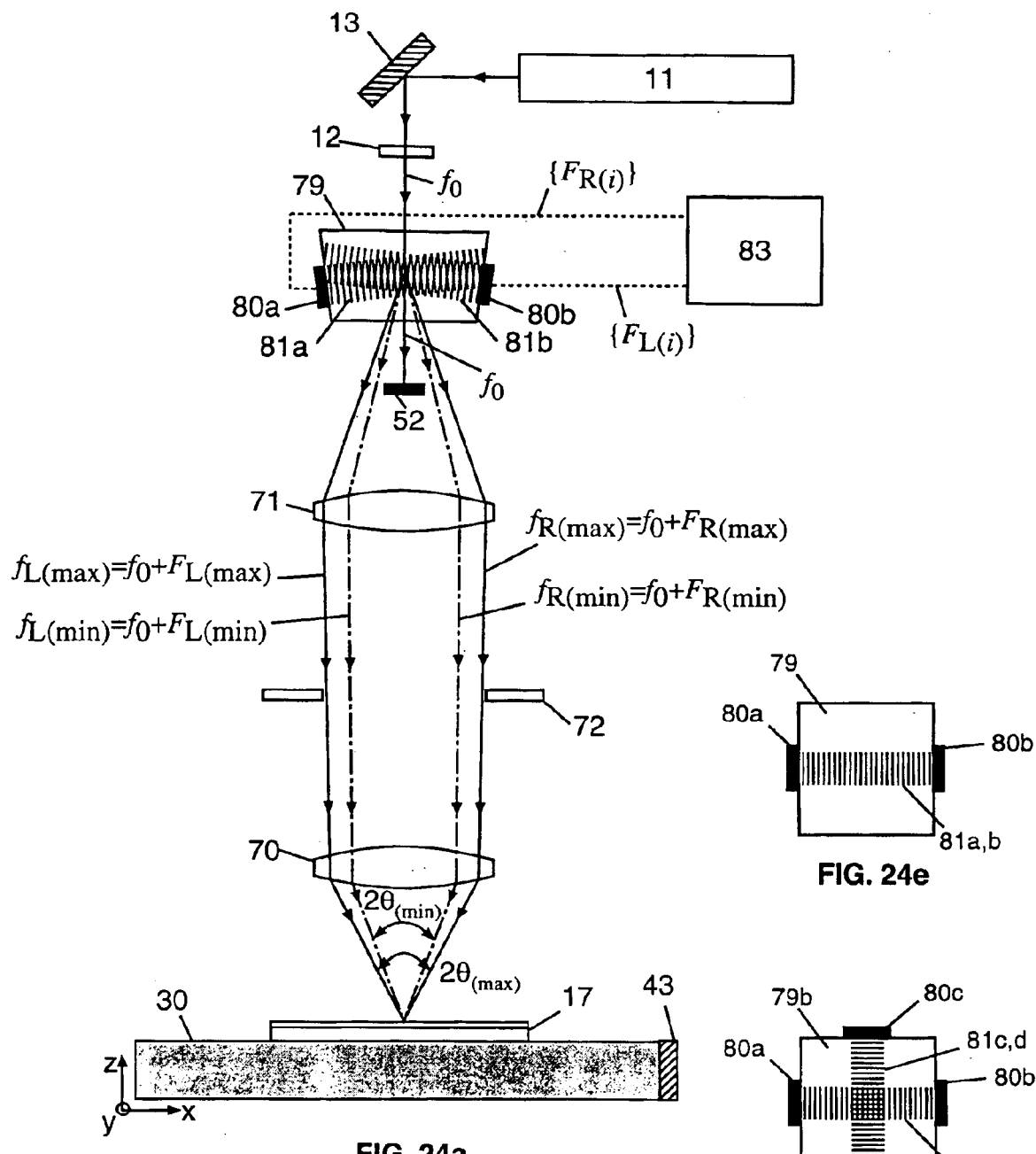
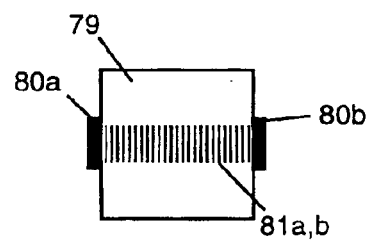
FIG. 24e
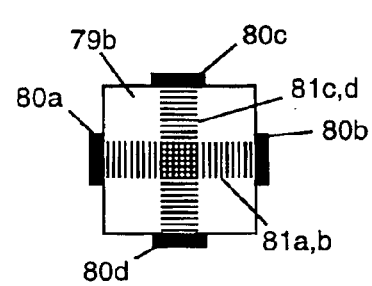
FIG. 24f
FIG. 24a $f_{DP}=(u_s/\lambda)(\sin\theta+\sin\beta)$ $f_{DP}=2\sin\theta\ u_s/\lambda=u_s/p$

METHOD AND SYSTEM FOR INTERFERENCE LITHOGRAPHY UTILIZING PHASE-LOCKED SCANNING BEAMS

PRIORITY INFORMATION

This application claims priority from provisional application Ser. No. 60/164,655 filed Nov. 10, 1999.

GOVERNMENT SPONSORSHIP INFORMATION

The government has rights to this invention pursuant to contract number NAG5-5105 awarded by the National Aeronautics and Space Administration, and contract number DAAG55 -98-1-0130 awarded by the Defense Advanced Projects Research Administration.

BACKGROUND OF THE INVENTION

1. Field of the Invention

The invention relates to interference lithography (IL), also known as interferometric lithography or holographic lithography, a method wherein periodic or quasi-periodic patterns are exposed into a photosensitive material (in thin-film form, usually called a resist), by overlapping pairs of phase-locked beams from a laser or other intense source of radiation. In general, a beam, such as emitted from a laser, is split into pairs of beams, which are then directed to recombine at a resist-coated substrate. At the intersection of the beams a periodic interference pattern is created with period $p=\lambda/(2 \sin \theta)$, where $\lambda$ is the beam wavelength and $\theta$ is intersection half-angle of a particular beam pair.

2. Description of Prior Art

A controlled phase relationship must hold between the two halves of a beam pair, and between all sets of beam pairs (i.e., they must be "phase-locked") in order to form stable, high-contrast fringes. This can be achieved passively, by the use of a rigid, compact optical system designed for thermal and mechanical stability, or alternatively by the use of active optical components and phase-error measuring sensors in conjunction with phase-locking feedback electronics (see E. H. Anderson, H. I. Smith, and M. L. Schattenburg, "Holographic Lithography," U.S. Pat. No. 5,142,385).

When a coherent source of light is used, such as a laser, the beam is typically split with a dielectric beamsplitter and recombined with mirrors (see H. I. Smith, "Fabrication techniques for surface acoustic wave and thin-film optical devices," *Proc. IEEE* 62, 1361–1387 [1974]). In an alternative configuration, known as achromatic interference lithography (AIL), the beam is split and recombined using diffraction gratings (see T. A. Savas, M. L. Schattenburg, J. M. Carter, and H. I. Smith, "Large-area achromatic interferometric lithography for 100 nm period gratings and grids," *J. Vac. Sci. Technol. B* 14, 4167–4170 [1996]). In this second case, beams lacking high spatial and temporal coherence can still be used to make useful gratings. The AIL method utilizes much more compact optics that the IL method, resulting in a very stable interferometer. However, a disadvantage is that each AIL system can pattern only a single period.

IL has been used commercially for many years to produce large-area diffraction gratings for spectroscopy. Other industrial and research applications for IL-patterned gratings and grids include: optical components for filtering, polarizing, diffracting and other manipulations of light, x-rays, and particle beams; length-scale standards for metrology; positional encoders in motion control equipment; fiducial grids used during spatial-phase locked electron-beam lithography (see H. I. Smith, E. H. Anderson, and M. L. Schattenburg "Energy beam locating," U.S. Pat. No. 5,136,169); arrays of field emitter tips for flat panel display manufacturing (see C. O. Bozler et al., "Arrays of gated field-emitter cones having a 0.32 $\mu$m tip-to-tip spacing," *J. Vac. Sci. Technol. B* 12, 629 (1994)); and high density magnetic storage (see M. Farhoud et al., "Fabrication of large area nanostructured magnets by interferometric lithography," *IEEE Trans. Mag.* 34, 1087–1089 (1998)).

Competitive non-IL means of producing precision periodic patterns' suffer from a number of well-known deficiencies. For example, the technique of mechanical ruling suffers from extremely slow speed, poorly-controlled grating groove profile, inability to pattern very fine periods, distortions due to limited servo-loop gain, and incompatibility with semiconductor lithographic processing. The method of energy beam writing (e.g., electron, beam lithography or ion beam lithography) suffers from slow speed and large grating distortions due to poor beam positioning control (e.g., stitching errors).

In general, IL methods are presently superior to competing methods for rapidly producing precision periodic patterns. In current IL practice, large-area patterns are generally achieved by expanding the beams with lenses, after which they are caused to overlap and interfere. Beams with spherical wavefronts can be achieved by using a short-focal-length lens followed by an (optional) spatial-filter pinhole at the lens focus. However, the interference of spherical beams produces gratings with large hyperbolic distortions. Gratings substantially free of hyperbolic distortions can be achieved by following the spatial filter with a second, collimating lens. However, in this case, distortions in the collimating lens due to inevitable manufacturing errors are directly translated into distortions in the grating. In addition, the collimating lens must be at least as large as the substrate being patterned. Thus, for good results, an IL system with large, precisely figured optics and/or very long optical paths is required. Such a system is bulky, expensive, and vulnerable to the distorting effects of vibration, air turbulence, and thermal fluctuations. Uniform exposure dose is also difficult to achieve. It is also difficult, expensive, and time consuming to reconfigure such a system in order to fabricate other types of general periodic patterns such as gratings with other periods, grids (crossed gratings), and "chirped" gratings with variable periods.

The AIL method, on the other hand, avoids the need for a highly coherent source and is also more stable than the traditional IL method due to its compact design, but does require splitter and recombiner grating optics of superb quality which are at least as large as the desired substrate size. In addition, the AIL method is even less flexible that the IL method for patterning general periodic patterns, since each AIL interferometer is designed to pattern only one period.

Thus, current practice does not allow the rapid and low-cost patterning of large, low distortion, general periodic and quasi-periodic patterns with highly uniform and controlled properties. The object of this invention is to provide these benefits by utilizing novel means of conducting IL with phase-locked scanning beams.

SUMMARY OF THE INVENTION

The invention provides a lithographic method and system of scanning beam interference lithography (SBIL). In the most general embodiment, this method and system utilizes matched pairs of coherent, phase-locked, overlapped writing beams incident on a substrate, which is coated with a photo-definable layer such as a lithographic resist. Alternatively, substrates incorporating regions of photosensitive material, such as sheets of lithium niobate, or optical fibers with SiGe oxide cores, may be used. The writing beam pairs are generated such that a carefully-controlled phase relationship exists between left and right beam pair halves, and between all beam pairs, which results in coherent interference and thus the generation of periodic patterns in the area of overlap (the "image"). The writing beams are typically much smaller in diameter than the substrate. Any number of overlapping beam pairs may be used, wherein the overlap region of all beam pairs on the substrate coincide. The substrate is chucked to a commercial, high-precision, three-axis (x-motion, y-motion, γ-rotation) motion stage, which is controlled by servo motors, a stage-position sensor such as a laser interferometer or optical encoder, a substrate surface z-height sensor, and control electronics. As the substrate is scanned by the x-y stage, the angles, phases, and amplitudes of the writing beams are controlled in a prescribed way to inscribe useful precision periodic patterns on the substrate.

Numerous other features and advantages of the invention will become apparent from the following descriptions when read in connection with the accompanying drawings.

BRIEF DESCRIPTION OF THE DRAWINGS

FIG. 14a is a schematic block diagram of an exemplary embodiment showing a writing interferometer utilizing beam expander to control image diameter;

FIG. 14b shows distortion in a grating image due to imperfections in writing interferometer optics;

FIG. 14c shows reduced distortion in a grating image resulting from reduced beam diameter;

FIG. 24a is a schematic block diagram of an exemplary embodiment of a writing interferometer with similar functionality as that depicted in FIG. 23b, but which employs a special dual crossed-beam acoustic-beam modulator to achieve a more compact system, however, bandwidth considerations limit the angular range between $\theta_{(min)} < \theta < \theta_{(max)}$, as depicted;

FIG. 24e is a top-view of a two-crossed-beam acousto-optic deflector;

FIG. 24f is a top-view of a four-crossed-beam acousto-optic deflector;

FIG. 49c is a schematic diagram of an exemplary embodiment of a reading interferometer utilizing stage reflection grating, image phase is measured by interfering beams from each arm diffracted by the grating with beams from the opposite arm diffracted by the grating;

FIG. 49d is a schematic diagram of an exemplary embodiment of a reading interferometer utilizing stage reflection grating, image phase is measured by interfering beams from each arm diffracted by the grating with beams from the opposite arm diffracted by the grating, where the diffracted beamns are coincident;

FIG. 49e is a schematic diagram of an exemplary embodiment of a reading interferometer utilizing stage reflection grating, image phase is measured by interfering beams from each arm diffracted by the grating with beams from the same arm;

FIG. 49f is a schematic diagram of an exemplary embodiment of a reading interferometer utilizing stage reflection grating, image phase is measured by interfering beams from each arm diffracted by the grating with beams from the opposite arm reflected by the grating;

FIG. 49g is a schematic diagram of an exemplary embodiment of a reading interferometer utilizing stage reflection grating, image phase is measured by interfering beams from each arm diffracted by the grating with light from the opposite arm reflected by the grating, where the incident, diffracted, and reflected beams are coincident;

Figure 49A:
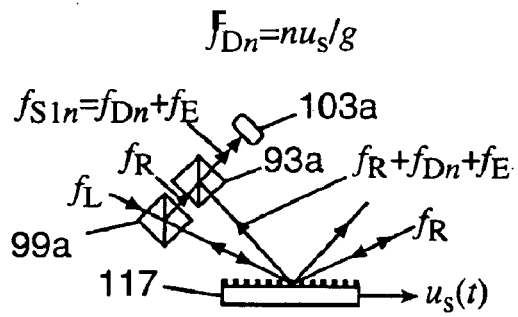
FIG. 49a is a schematic diagram of an exemplary embodiment of a reading interferometer utilizing stage reflection grating, image phase is measured by interfering beam from each arm diffracted by the gratings with beams from the same arm reflected from the grating.
Figure 49B:
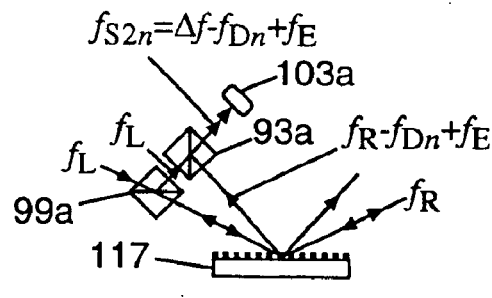
FIG. 49b is a schematic diagram of an exemplary embodiment of a reading interferometer utilizing stage reflection grating, image phase is measured by interfering beams from each arm diffracted by the grating with beams from the opposite arm.
Figure 49C:
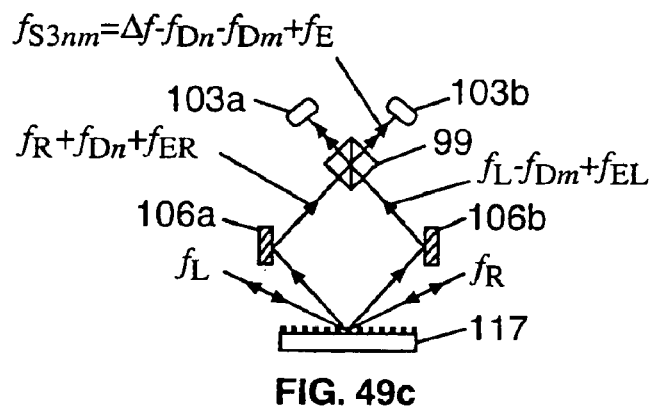
Figure 49D:
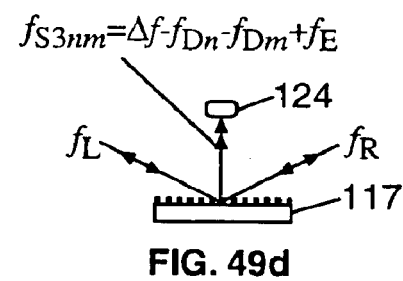
Figure 49E:
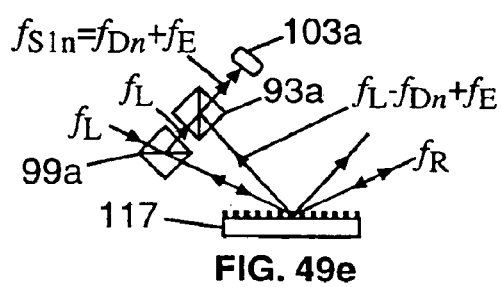
Figure 49F:
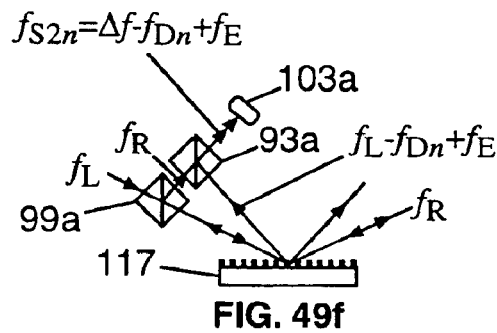
Figure 49G:
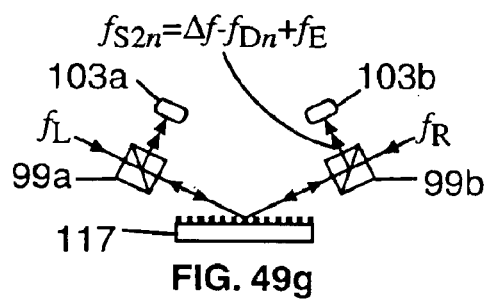
Figure 49H:
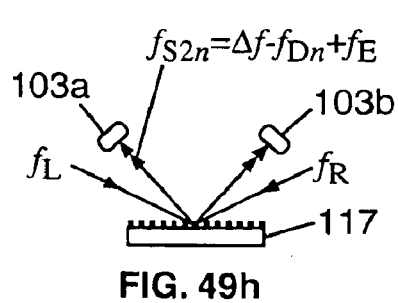
Figure 50:
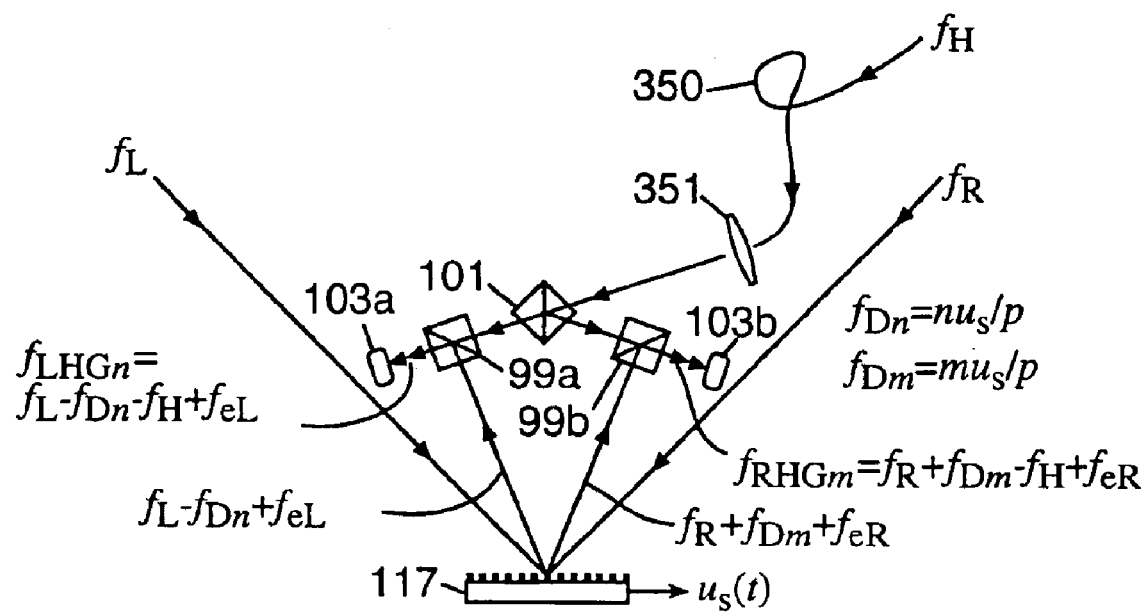
Figure 51A:
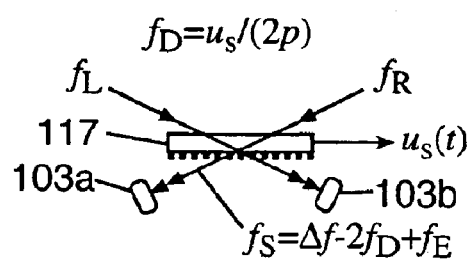
Figure 51B:
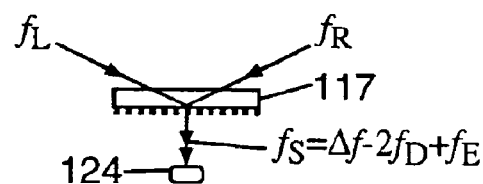
Figure 51C:
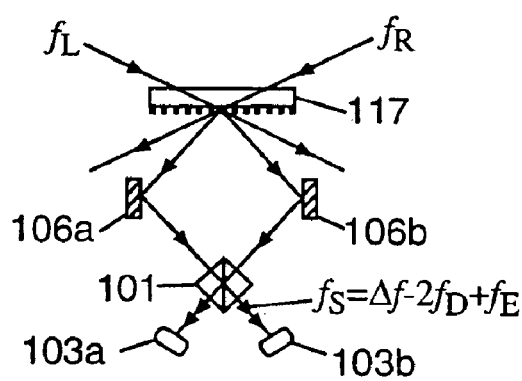
Figure 52:
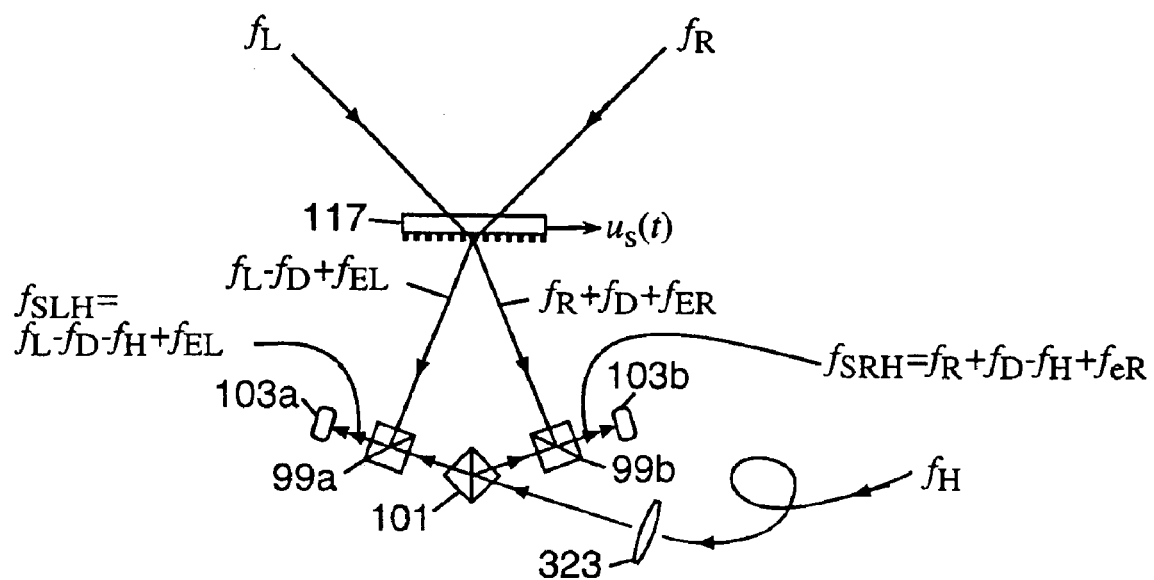

FIG. 49h is a schematic diagram of an exemplary embodiment of a reading interferometer utilizing stage reflection grating, image phase is measured by interfering beams from each arm diffracted by the grating with beams from the opposite arm reflected by the grating, where the diffracted and reflected beams are coincident, and cast into a different plane than the incident beams by tilting the plane of incidence;

FIG. 50 is a schematic diagram of an exemplary embodiment of a heterodyne reading interferometer utilizing a stage reflection grating, interfering beams diffracted from each arm with heterodyne beams measure image phase;

FIG. 51a is a schematic diagram of an exemplary embodiment of a reading interferometer utilizing a stage transmission grating, image phase is measured by interfering beams from each arm transmitted by the grating with beams from the opposite arm diffracted from the grating, such that the zero order of each arm is coincident with a diffracted order of the opposite arm;

FIG. 51b is a schematic diagram of an exemplary embodiment of a reading interferometer utilizing a stage transmission grating, image phase is measured by interfering beams from each arm diffracted by the grating with beams from the opposite arm diffracted by the grating, such that diffracted beams are coincident;

FIG. 51c is a schematic diagram of an exemplary embodiment of a reading interferometer utilizing a stage transmission grating, image phase is measured by interfering beams from each arm diffracted by the grating with light from the opposite arm diffracted by the grating, such that diffracted beams are not coincident; and FIG. 52 is a schematic diagram of an exemplary embodiment of a heterodyne reading interferometer utilizing a stage transmission grating, interfering beams diffracted from each arm with heterodyne beams measure image phase.

DETAILED DESCRIPTION OF ILLUSTRATED EMBODIMENTS

Figure 1:
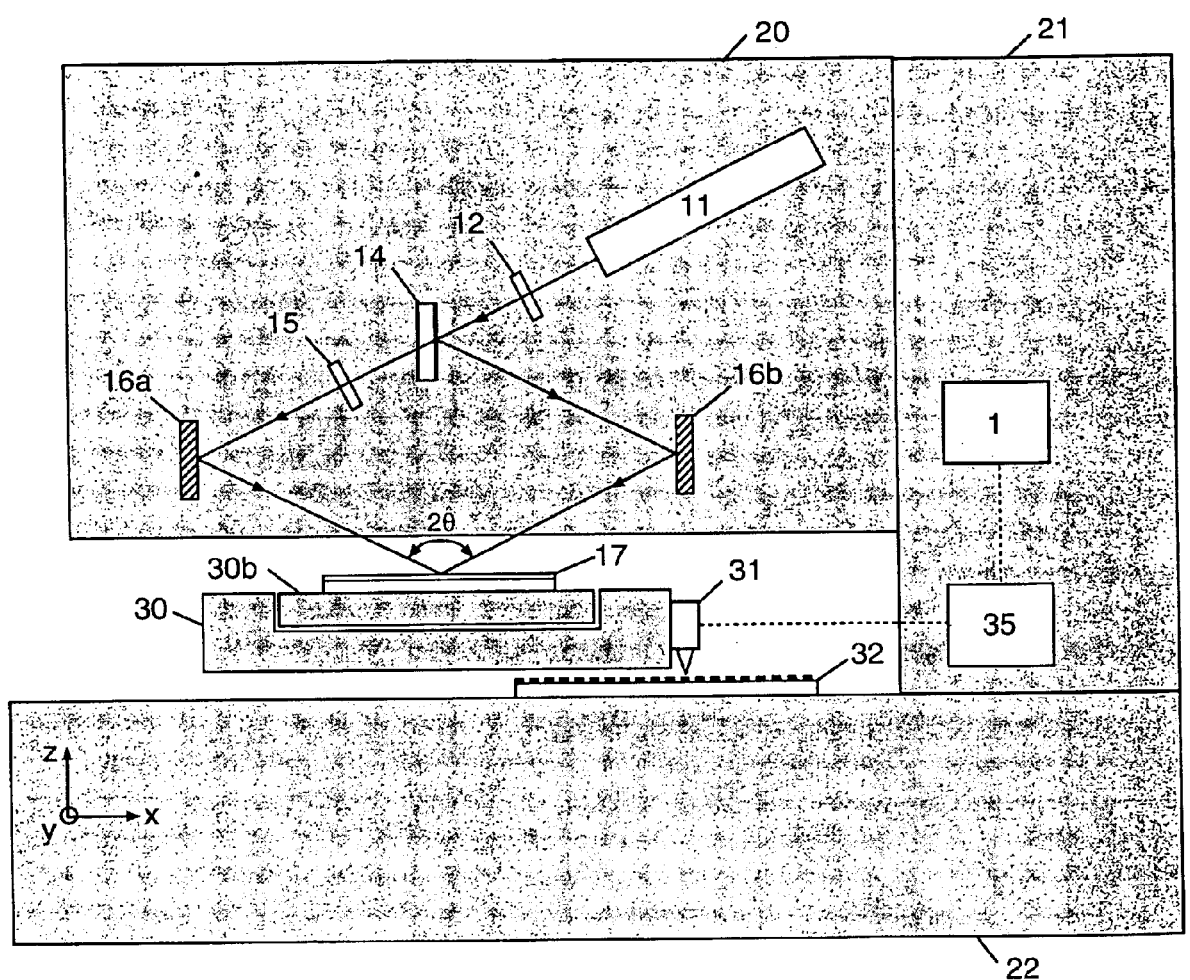
FIG. 1 is a schematic block diagram of an exemplary embodiment of a SBIL system in accordance with the invention including a high-precision three-axis stage (two planar and one rotational degrees of freedom) whose position is sensed by a three-axis optical encoder, a writing interferometer that forms fringes on the substrate, and rigid support blocks that accurately registers stage and writing interferometer.

With reference now to the drawings and more particularly. FIG. 1 thereof, there is shown a pictorial representation of a scanning-beam interference lithography (SBIL) system in accordance with the invention.

A laser 11, of wavelength λ such as an argon-ion laser operating at the UW wavelength of λ=351 nm, emits a narrow beam that strikes shutter/attenuator 12. Shutter/attenuator 12 can be controlled electronically to commence the operation of SBIL by directing a portion of the beam to the remainder of the apparatus, comprising an interferometer. The interferometer, called the writing interferometer, comprises a dielectric beamsplitter 14 which creates two beams, a variable attenuator 15 for adjusting the irradiance of one of the beams until both match, and mirrors 16 for redirecting the beams onto substrate 17. Alternatively, a cube beamsplitter, or transmission or reflection grating beamsplitter, may be substituted for dielectric beamsplitter 14. The split beams are adjusted to overlap on the substrate, creating interference fringes in the plane of the substrate of period p=λ/(2 sin θ), where θ is half the angle between the arms of the interferometer, also called the half angle or azimuthal angle. The writing interferometer is mounted to rigid vertical optical bench 20, which in turn is mounted to rigid horizontal table 22 by rigid vertical riser block 21. Table 22 supports a precision horizontal (x-y) motion stage 30, which in turn supports precision rotary stage 30b, to which is chucked substrate 17. Stage 30 provides precision x-y motion, and rotary stage 30b provides optional γ rotation (yaw), of substrate 17, while fixing substrate height z. Stages 30 may provide motion by the use of precision actuators, such as servomotors, and smooth ways such as air, magnetic, or roller bearings. An optical encoder comprising sensor 31, attached to stage 30, and grating 32, attached to table 22 detects stage x-position. Encoder sensor 31 generates time-varying sinusoidal signals that are analyzed by stage position-sensor controller 35 to determine the x-position of the stage. Similar optical encoders provide y-axis, and optional substrate yaw, positional information. High-precision optical encoders of sophisticated design are commercially available. Stage position-sensor controller 35 provides substrate x-position $x_S(t)$, x-velocity $u_S(t)=dx_S/dt$, y-position $y_S(t)$, y-velocity $v_S(t)=dy_S/dt$, yaw rotation angle $\gamma_S(t)$, and spin $\omega_S(t)=d\gamma_S/dt$, to servo-control electronics 1, which controls the stage position to a prescribed location or path.

Figure 2A:
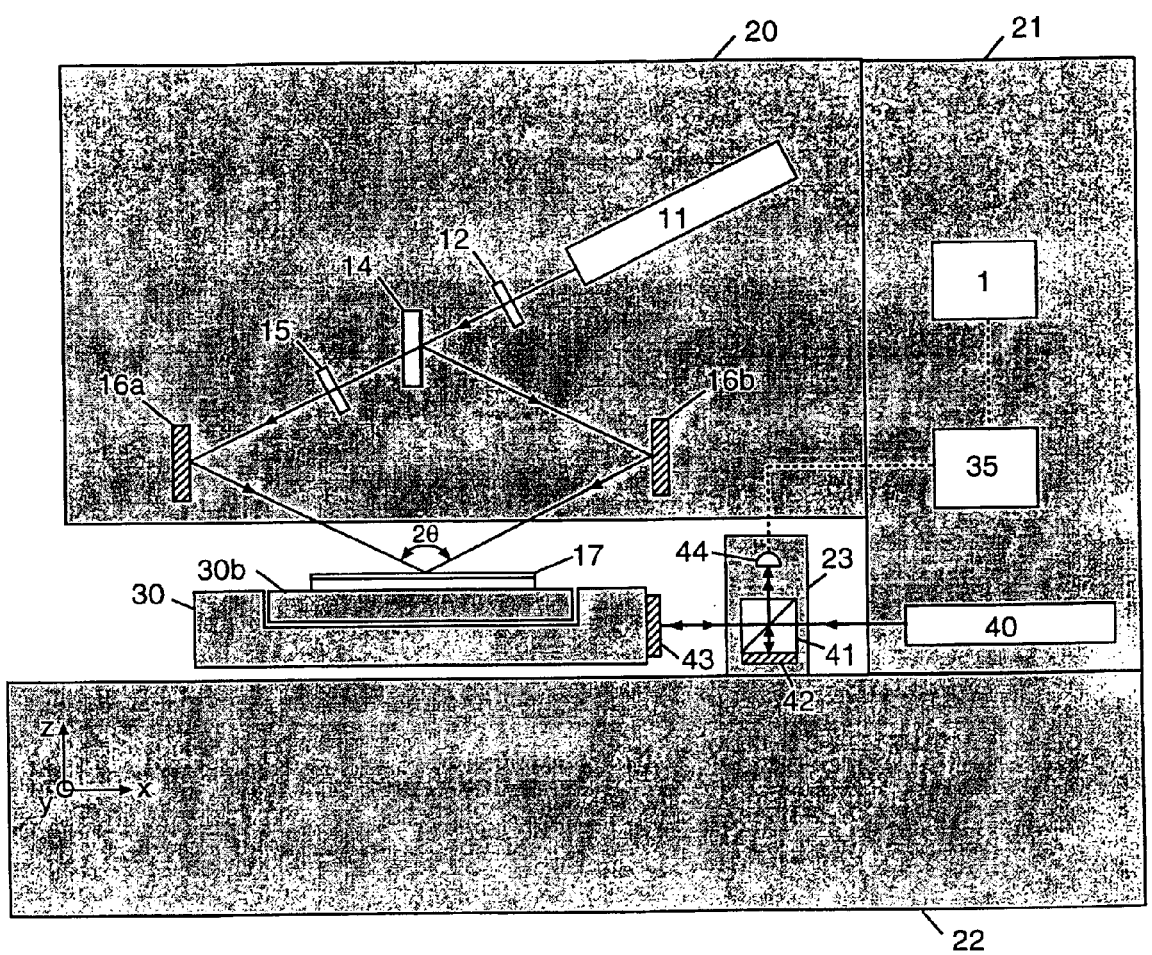
FIG. 2a is a schematic block diagram of an alternative embodiment of a SBIL system that measures stage position with a two-axis laser interferometer and a rotational optical encoder.

A higher-accuracy stage position sensing method is depicted in FIG. 2a. Laser 40, such as a helium-neon laser operating at the 632.8 nm wavelength, is split by beamsplitter 41 to create two beams. The vertical split beam is reflected by reference mirror 42 and directed back through beamsplitter 41 to detector 44, while the horizontal split beam is reflected by test mirror 43, which returns beam to beamsplitter 41, which in turn directs the beam to detector 44. Test mirror 43 is attached to moving stage 30, while beamsplitter 41 and reference mirror 42 are attached to rigid reference block 23, which is in turn rigidly attached to table 22. Interference of overlapped horizontal and vertical beams on detector 44 generates time-varying sinusoidal signals that are analyzed by stage position-sensor controller 35 to determine the x-position and velocity of the sample. A similar interferometer provides stage y-position and velocity information, while a rotary encoder provides substrate yaw and spin information. Displacement-measuring interferometers of sophisticated design, with high precision and accuracy, are commercially available. Servo-control electronics 1 uses information from the positional interferometers to sense and control the stage position to a prescribed location or path.

Figure 2B:
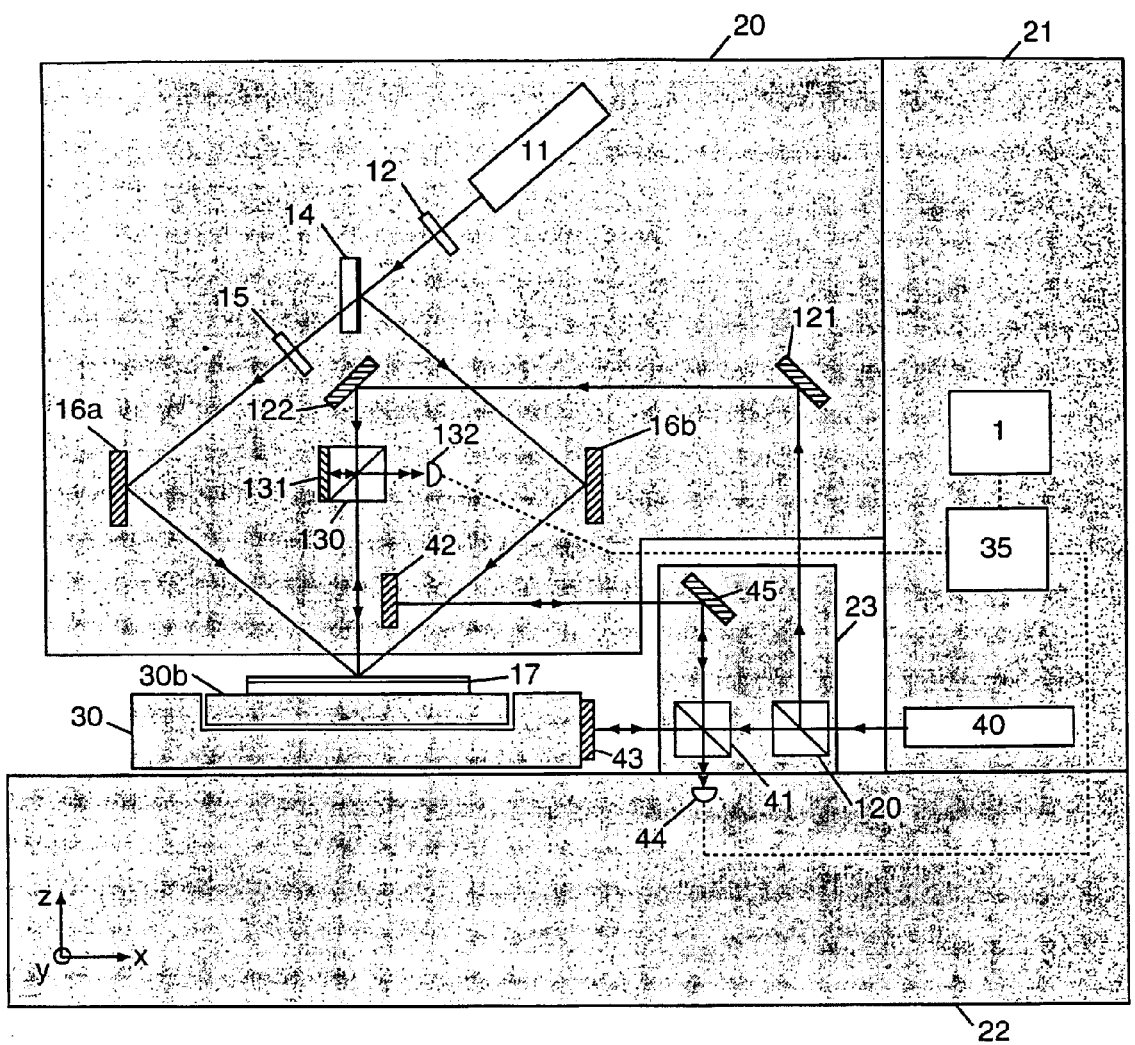
FIG. 2b is a schematic block diagram of another alternative embodiment of a SBIL system that utilizes a two-axis laser interferometer and a rotational optical encoder to measure stage position with respect to the writing interferometer, and a third interferometer axis to measure substrate height.

An improved stage interferometer design is depicted in FIG. 2b. This design ameliorates problems associated with mechanical and thermal disturbances in optical bench 20 and riser block 21, which could generate undetected shifts of the fringes generated by the writing interferometer. This design is similar to that depicted in FIG. 2a, except that the vertical split beam from beamsplitter 41 is reflected by turning mirror 45 to reference mirror 42, which reflects beam back to turning mirror 45 and then through beamsplitter 41 to detector 44, where it interferes with the horizontal split beam. Reference mirror 42 is rigidly mounted to optical bench 20 near the center of the writing interferometer, providing a much more accurate measurement of the substrate position relative to the writing interferometer, thus significantly reducing the effects of mechanical disturbances in optical bench 20 and riser block 21, such as vibration or thermal expansion.

Another feature of the interferometer design depicted in FIG. 2b is a z-axis interferometer, which is useful to measure the z-position $z=z_S(t)$ and z-velocity $w_S(t)=dz_S/dt$ of the surface of substrate 17 under the image. This will be of importance in interferometer designs introduced hereinafter, where multiple interfering beam pairs are used and image depth-of-focus is an issue. This is due to the well-known fact that while the image generated by the interference of a pair beams is independent of z-height (i.e., gratings have "infinite depth of focus"), the image generated by multiple coherently-interfering beam pairs (i) with different azimuthal angles, $\theta_{(i)}$, changes with substrate z-height, and has the desired character only within a narrow z-range depth of focus. In this design an additional beamsplitter 120 splits a portion of the beam from laser 40 upward to the z-interferometer, which is rigidly attached to optical bench 20. Turning mirrors 121 and 122 direct beam to beamsplitter 130, which splits beam into horizontal and vertical parts. Horizontal beam reflects from reference mirror 131 back through beamsplitter 130 to detector 132. Vertical beam reflects from substrate 17 back to beamsplitter 130, which also directs it to detector 132. Interference of overlapped horizontal and vertical beams on detector 132 generates time-varying sinusoidal signals, which are analyzed by stage position-sensor controller 35 to determine the z-position and velocity of the substrate. Many other schemes for substrate height sensing are in use and may be practical for application in a SBIL system. Methods for using the z-height information to eliminate the deleterious effects of being out of focus are described hereinafter.

Figure 3:
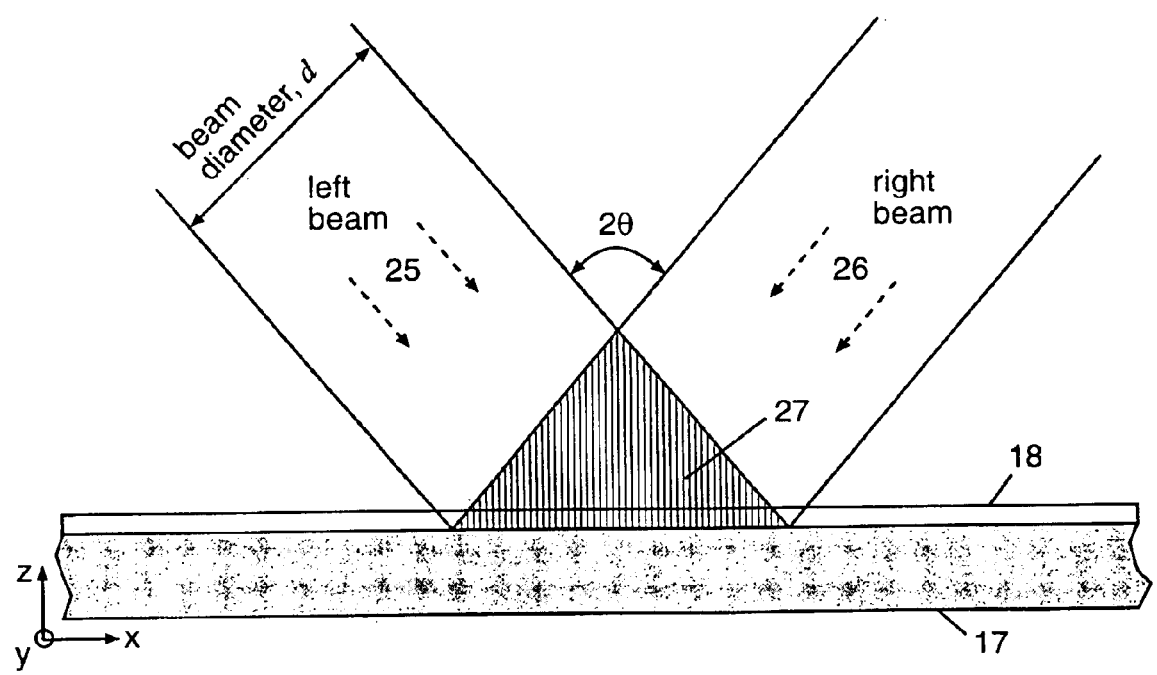
FIG. 3 is a diagram showing the detail of the overlap region of coherent beams, resulting in a periodic interference-fringe "image" which is exposed into a photosensitive resist layer on the substrate.

Substrate 17 is shown in more detail in FIG. 3. Substrate 17 incorporates a photosensitive layer 18, called a resist, which is capable of recording fine-period patterns generated by the interferometer. Writing interferometer left beam 25 and right beam 26, both incident in the x-z plane and with diameter d, overlap and interfere in region 27 over substrate 17. In region 27 a grating standing wave is formed, with period p given by p=λ/(2 sin θ), comprising fringe planes filling the volume of intersection 27, where the planes are parallel to the y-z axis with plane spacing given by p. Interference region 27 is typically much smaller in size than the substrate. For example, when using an argon-ion laser with wavelength λ=351.1 nm and a half-angle θ=61.37 deg., a period p=200 nm is obtained. Typical diameter of beams emitted from ion lasers are ~1 mm, which is some 5000 times larger than the example grating period. The 1 mm-diameter beam is typically, in turn, some 10–1000 times smaller than substrate sizes of interest.

Figure 4A:
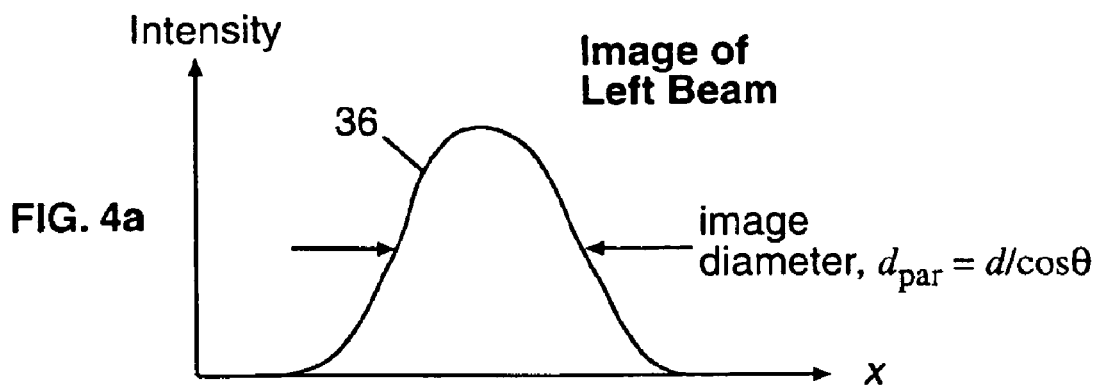
FIG. 4a is a graph showing the irradiance distribution resulting from left beam alone impinging on substrate.
Figure 4B:
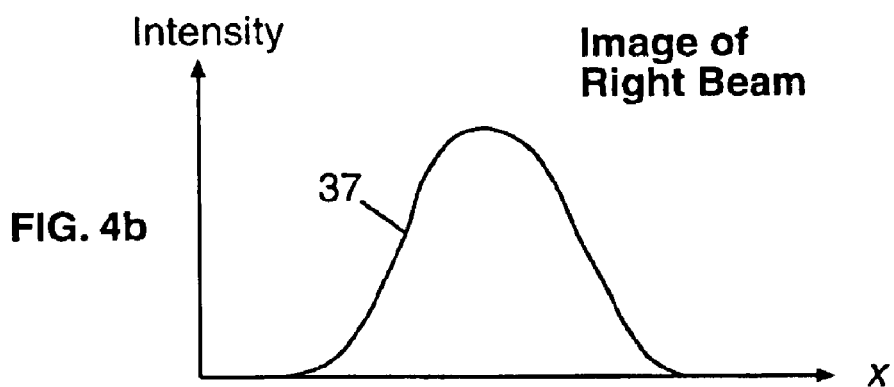
FIG. 4b is a graph showing the irradiance distribution resulting from right beam alone impinging on substrate.
Figure 4C:
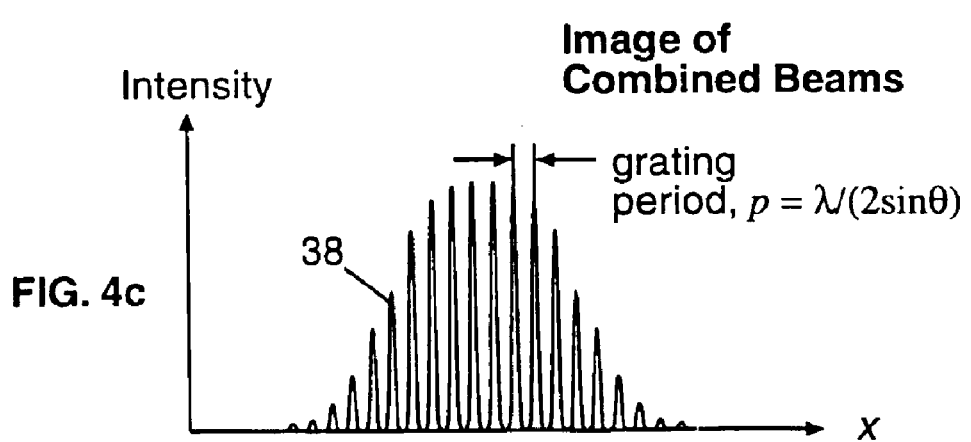
FIG. 4c is a graph showing the irradiance distribution resulting from overlap and interference of left and right beams on substrate, resulting in an interference-fringe image.

The effect of interference of the overlapping left and right beams on substrate 17 is shown in FIG. 4, wherein the irradiance distribution in resist 18 on substrate 17, called the image, is plotted vs. position x, for beams of diameter d incident in the x-z plane. FIG. 4a depicts the irradiance distribution 36 in resist 18, with diameter $d_{par}$=d/cos θ in the direction parallel to the plane of incidence, and $d_{pep}$=d in the direction perpendicular to the plane, obtained if only left beam 25 is allowed to impinge on the substrate while right beam 26 is blocked. A so-called Gaussian intensity distribution is depicted, which is typical of optical systems illuminated by laser radiation. FIG. 4b depicts the irradiance distribution 37 in resist 18 obtained if only right beam 26 is allowed to impinge on the substrate, while left beam 25 is blocked. FIG. 4c depicts the irradiance distribution 38 in resist 18 resulting if both right beam 25 and left beam 26 are allowed to simultaneously impinge and interfere, resulting in a periodic interference pattern of period p.

Figure 5A:
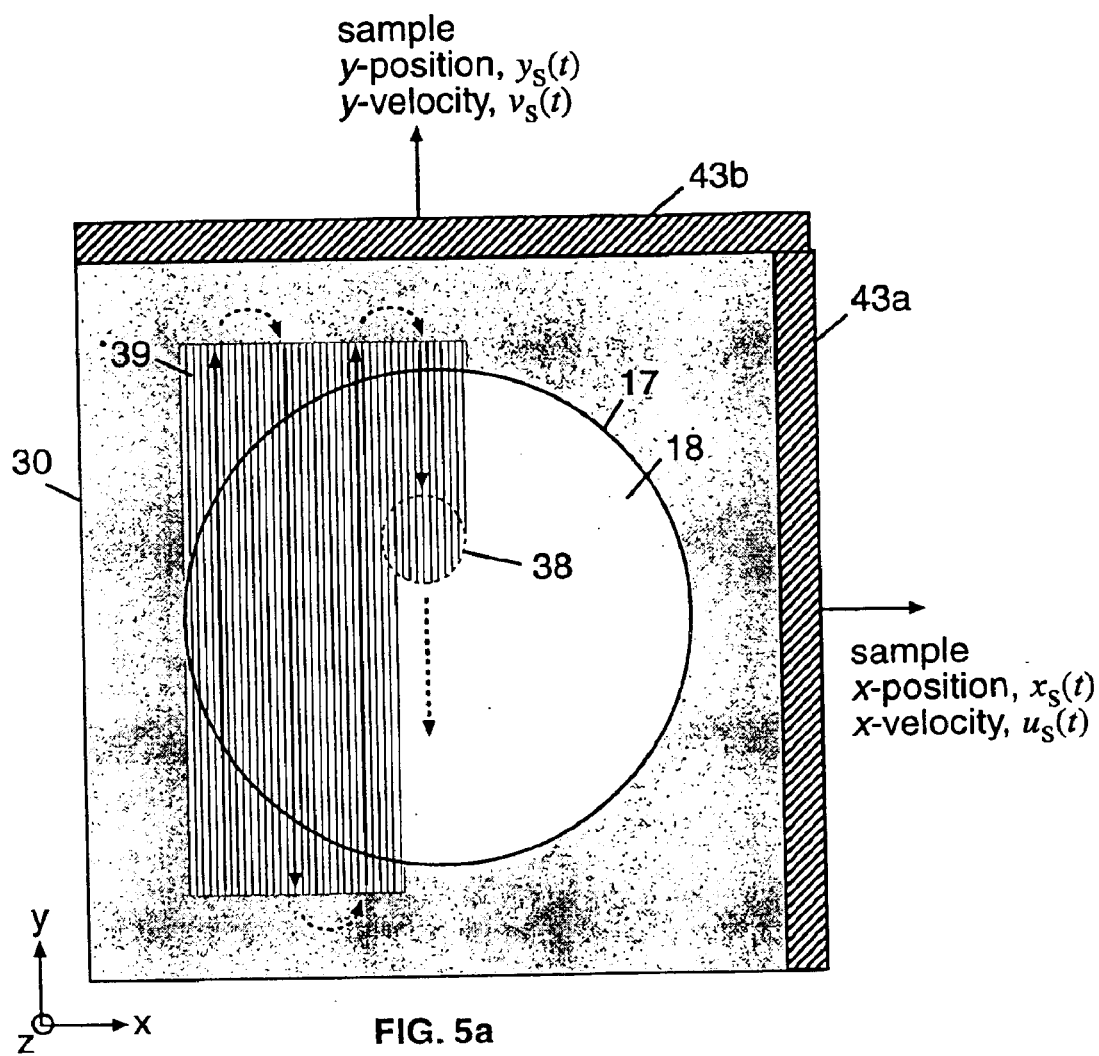
FIG. 5a shows a scanning method that moves the substrate under a small grating image in a boustrophedonic manner, where the direction of motion is parallel to the fringe direction, thus filling a much larger region of the substrate with grating pattern.
Figure 5B:
FIG. 5b shows the grating image, as it would appear on a stationary substrate.
Figure 6:
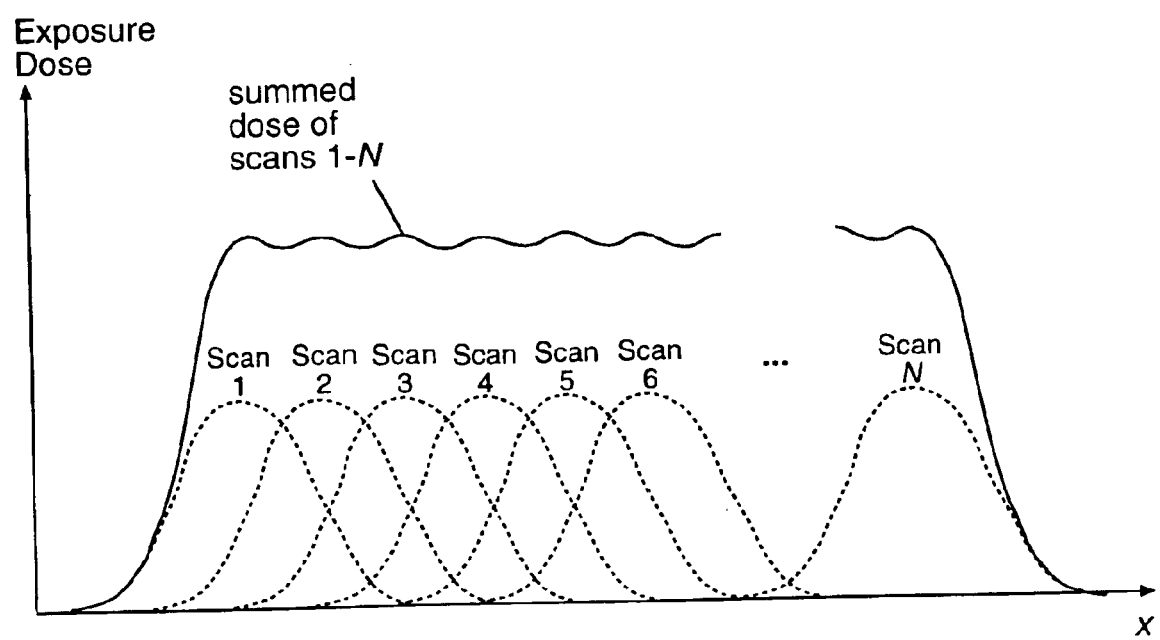
FIG. 6 is a graph that depicts a method for overlapping successive scans such that a uniform dose is achieved.

FIG. 5a depicts a preferred method for "parallel scanning" small grating image 38, with fringes parallel to the y-axis, over a large substrate 17, resulting in a large grating 39. For clarity, FIG. 5b depicts image 38, as it would appear on a stationary substrate. Substrate 17 is chucked to precision motion stage 30. For clarity rotary stage 30b is not depicted. The range of motion of stage 30 is typically larger than the size of substrate 17. Mirror 43a, attached to stage 30, is used by the x-axis stage interferometer, and mirror 43b, also attached to stage 30, is used by the y-axis stage interferometer. The writing interferometer is carefully adjusted so that the grating fringes in image 38 are parallel to the y-axis. Stage 30 is first positioned such that grating image 38 is placed in the stage lower left-hand corner, beyond substrate 17. Stage 30 is then moved smoothly in the −y direction, while being held at a fixed x position, such that a long, narrow grating strip is exposed into resist coating 18 on substrate 17. Stage 30 is allowed to continue moving in they direction such that grating image 38 moves off of substrate 17. Stage 30 is then stopped and held at a fixed y position, and subsequently moved in the −x direction by a distance Δx=Mp, such that Δx<<$d_{par}$ is a modest fraction of the parallel image diameter $d_{par}$, say 10–50%, while simultaneously being an exact integer multiple M of grating period p. Stage 30 is then moved smoothly in the +y direction, while being held at fixed x-Δx position, such that a second, long, narrow grating strip, adjacent and in phase with the first scan, is exposed into resist 18. Successive scans are then repeated, in a boustrophedonic fashion, until the exposure of the desired region is completed. In this way, if the interferometer is sufficiently stable, the interferometer optics are of sufficient quality, and the x-y stage motion is sufficiently smooth and accurate, then large-area low-distortion gratings on substrate 17 are achieved. FIG. 6 demonstrates how a uniform exposure dose over a large area is achieved by the described method of partially overlapping sequential boustrophedonic scans of a Gaussian beam. Many other writing schemes are possible other than the boustrophedonic scheme. A description will be provided of the conditions that must hold during arbitrary writing paths to avoid image smearing.

The parallel-scanning method requires a low-distortion grating image, which would result from the use of high-quality optics in the writing interferometer. A high-quality stage is also required in order to avoid smearing the grating image during scanning. For best results, the grating image should have distortion of less than approximately 20% of the period, otherwise a large loss of contrast in the final grating will occur. In addition, the straightness-of-travel and yaw of the x-y stage during scanning should also be very good, otherwise loss of contrast and large grating distortions will occur. Stage path errors are common in motion-control systems due to stage air bearing and reference mirror flatness errors, vibration, thermal expansion, air turbulence, and finite servo loop gain of the control electronics, especially at higher scanning speeds. For best results, the stage travel straightness and yaw should also contribute errors that are less than approximately 20% of the period.

Figure 7A:
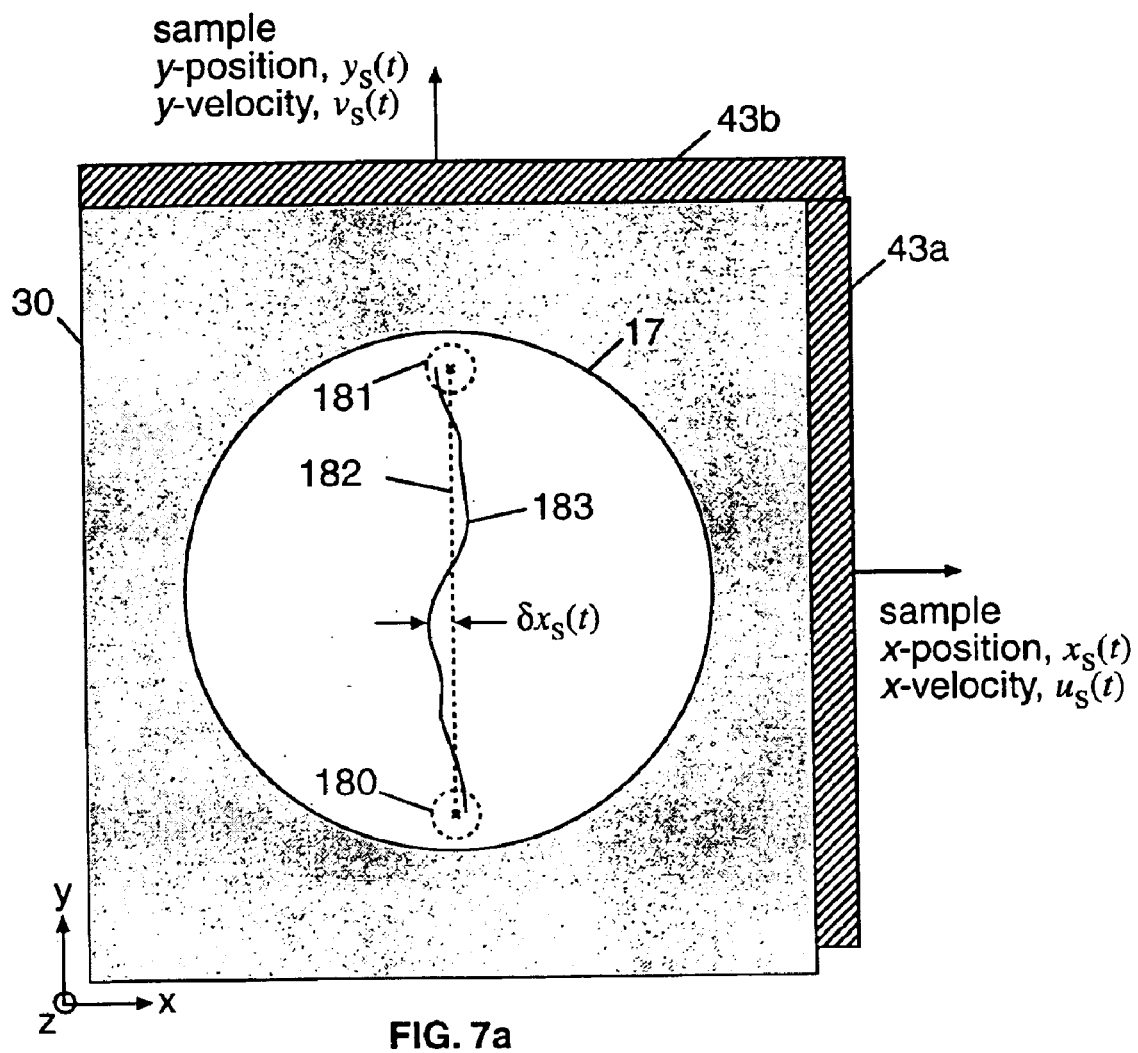
FIG. 7a shows the effect of stage-path lateral error on travel straightness during grating scanning.

FIG. 7a defines some of the parameters of interest in the discussion of stage path errors. In the figure, stage 30 has been commanded to move from desired starting point 180 to ending point 181 along path 182 such that stage x-position $x_S$=$x_0$ and yaw $γ_S$=$γ_0$ are constant with time t. However, due to stage errors, the actual stage motion 183 occurs with x-position $x_S(t)$ and yaw $γ_S(t)$. The error between desired path 182 and actual path 183 results in stage position error $δx_S(t)$=$x_S(t)$−$x_0$ obtaining grating phase error $δϕ(t)$=$2πδx_S/p$, while undesired stage rotation result in stage yaw error $δγ_S(t)$=$γ_S(t)$−$γ_0$ obtaining grating linewidth variation $δL(t)$= $dδγ_S(t)$, where p is the grating period, $d_{perp}$=d is the perpendicular image diameter, and L~p/2 is the width of imaged grating lines. For best results, stage lateral error $δx_S$ needs to be controlled such that $δx_S$<<p, or equivalently, $δϕ$<<2π, and stage yaw error $δγ_S$ needs to be controlled such that $δγ_S$<<p/d, or equivalently, δL<<L.

Figure 7B:
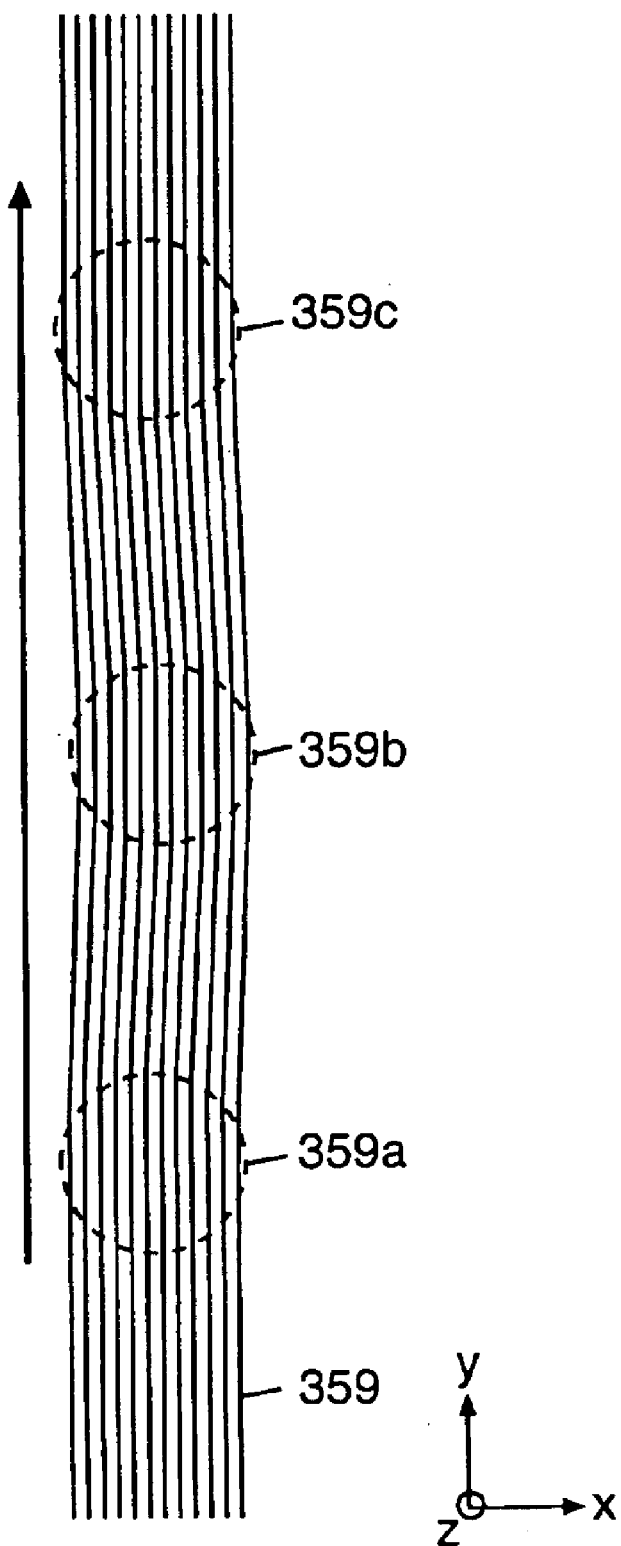
FIG. 7b shows the effect of stage path lateral error on the phase of written grating.
Figure 7C:
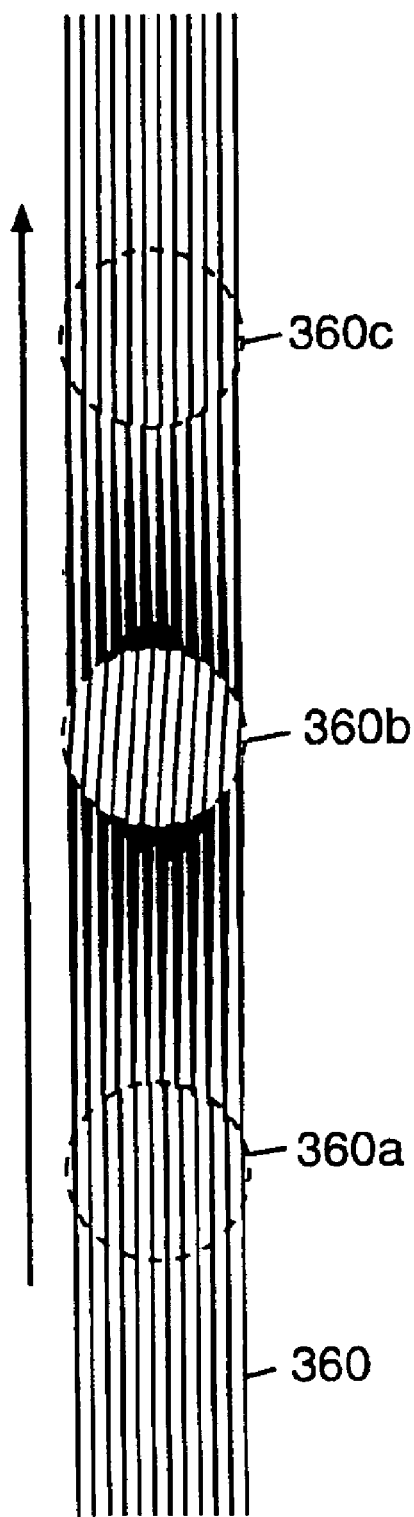
FIG. 7c shows the effect of stage path yaw error on the contrast of written grating.

FIG. 7b depicts a distorted grating that would obtain due to time-dependent lateral-path stage error during scanning. Stage 30 moves from top to bottom, causing grating image to appear to move from bottom to top of substrate 17, writing grating stripe 359. At an early time point image 359a moves along the desired path. At a mid-time point, however, stage lateral error causes image 359b to move a half-period to the right. At a late time point image 359c moves back to the desired path. The result is a grating stripe with an undesired position-dependent phase error. FIG. 7c depicts a distorted grating that would obtain due to time-dependent stage yaw error during scanning. Stage 30 moves from bottom to top, causing grating image to appear to move from bottom to top of substrate 17, writing grating stripe 360. At an early time point image 360a moves along the desired path with zero yaw error. At a mid-time point, however, stage yaw error causes image 360b to rotate clockwise. At a late-time point image 359c has rotated back to the desired angle. The result is a grating stripe with undesired position-dependant linewidth variations.

Figure 8A:
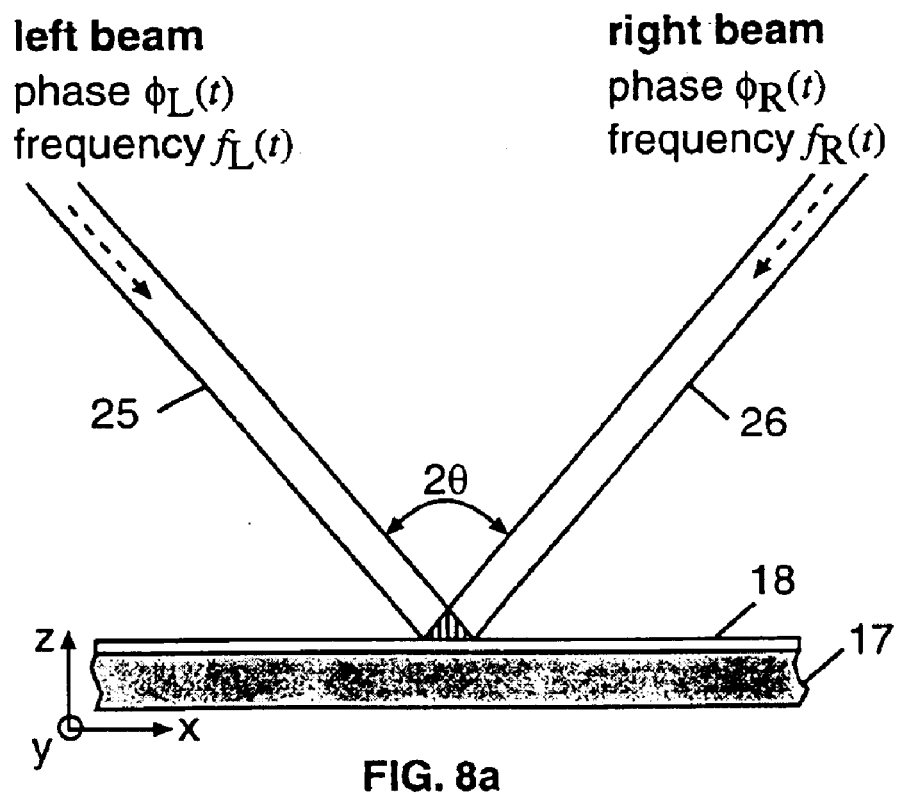
FIG. 8a is a diagram presenting nomenclature of phase and frequency during overlap of interfering beams.
Figure 8B:
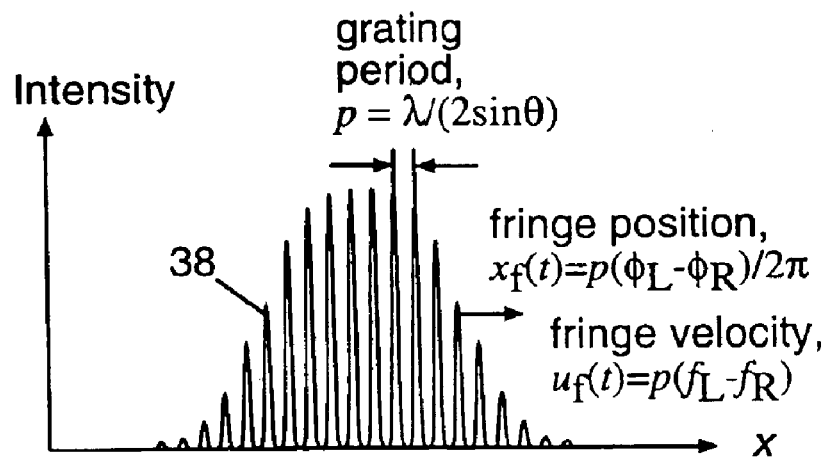
FIG. 8b is a graph presenting nomenclature of fringe period, position, and velocity.

With reference now to FIG. 8a, a general condition is described which resolves the stage lateral path error problem by phase-locking the grating image, generated by a single pair of beams, to the stage during scanning. $ϕ_L$ is defined as the phase of the left beam 25 and $ϕ_R$ as the phase of the right beam 26. The phase difference between the beams is $Δϕ$=$ϕ_L$−$ϕ_R$. With reference to FIG. 8b, the interference of two beams on substrate 17 results in image 38 with fringes of period p=λ/(2 sin θ). The fringes will appear to "walk" across the image with position $x_F(t)$=$pΔϕ/2π$ and velocity $u_F(t)$=$dx_F$/dt=pΔf, where Δf is the frequency difference between the arms given by Δf=dΔϕdt/2π=$f_L$−$f_R$, and where $f_L$=$dϕ_L/dt/2π$ is the frequency of the left beam and $f_R$=$dϕ_R/dt/2π$ is the frequency of the right beam. For this reason Δϕ is referred to as the image phase and Δf as the image frequency. The condition which ensures that the fringes are stationary in the reference frame of the substrate is that the fringe position and velocity are identical to the stage position and velocity, or $x_F(t)=x_S(t)$ and $u_F(t)=u_S(t)$, respectively. Only for a particular image phase $\Delta\phi=\Delta\phi_K(t)$, or equivalently, image frequency $\Delta f=\Delta f_K(t)$, called the locked phase and locked frequency, respectively, will these conditions hold. The relationship which ensures that the image is phase locked to the stage is thus $\Delta\phi=\Delta\phi_K(t)=2\pi x_S(t)/p+C$, where C is an arbitrary constant. The image and stage may be thus synchronized using a variety of phase measurement and control methods described hereinafter.

Figure 8C:
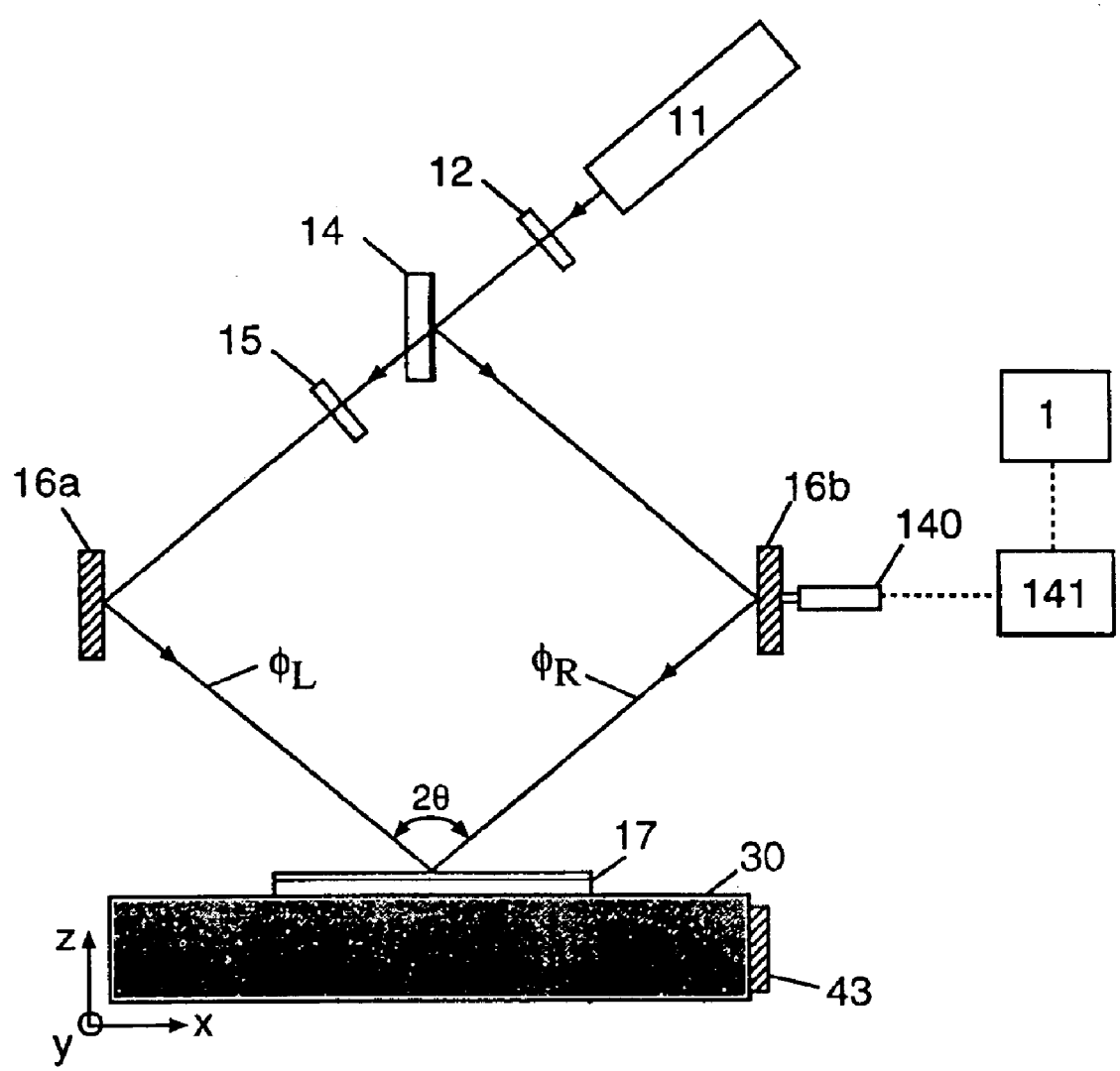
FIG. 8c is a schematic block diagram of an exemplary embodiment of the invention using a method for control of image phase utilizing an actuator-controlled mirror.

The substrate position $(x_S,y_S,\gamma_S)$ and velocity $(u_S,v_S,\omega_S)$ are known to stage position-sensor controller 35 with high accuracy in near real-time, and so are available, in principle, to master controller 1 to calculate and manipulate the phases of individual beams to ensure phase locking. A number of ways may be used to measure and control the phase and frequency of interferometer beams, including the use of piezo-actuated mirrors, electro-optic and acousto-optic modulators, and moving gratings. (For example, see E. H. Anderson, H. I. Smith, and M. L. Schattenburg, "Holographic Lithography," U.S. Pat. No. 5,142,385.) However, previous usage has been to control the phase or frequency of beams impingent on stationary substrates, rather than on moving substrates described here. Detailed descriptions of various ways to measure and control the phases of individual interferometer arms are provided hereinafter. A specific means to control the phase of the interferometer arms, and thus the image phase, is depicted in FIG. 8c. Beam from laser 11 travels through shutter/attenuator 12 and is split into right and left beams by beamsplitter 14. Left and right beams are directed by mirrors 16 to interfere at substrate 17. The phase of the right beam is controlled by use of piezoelectric actuator 140, which is controlled by controller 141, in turn controlled by master controller 1. Actuator 140 pushes on mirror 16b, shortening the length of the right arm and thus controlling the phase of the right beam.

The phase-lock relationship described above is completely general in that it holds for arbitrary scan paths. In particular, with reference to FIG. 9, an alternative writing scheme is depicted in which the stage scans perpendicular to the grating lines. In this case, rather than requiring small phase shifts between the arms to control the image phase in the parallel-scanning scheme depicted in FIG. 5, this cross (or Doppler) scanning method requires rapid and continuous phase shifts with time (i.e., frequency shifts) to synchronize the fringes with the moving stage. In this case, rather than discussing the phase difference between the arms, $\Delta\phi=\phi_L-\phi_R$, it is more useful to use the frequency difference $\Delta f=f_L-f_R=d\Delta\phi/dt/2\pi$. The phase lock condition is given by $\Delta f=\Delta_K(t)=d\Delta\phi_K/dt/2\pi=dx_S/dt/p=u_S(t)/p$. This condition ensures phase locking for arbitrary scan paths and velocities.

The method of phase locking is now extended to multiple beam pairs. Useful control over the intensity distribution of radiation within the image can be achieved by employing multiple interfering beam pairs in conjunction with beam scanning. According to the well-known principles of Fourier optics (e.g., see J. W. Goodman, *Fourier Optics*, McGraw Hill, 1968), any desired image can be synthesized by a sum of mutually-coherent spatial frequency components, each component achieved by interfering a pair of beams with prescribed amplitude, phase, rotation angle, and azimuthal angle. According to this principle, a desired image spatial-frequency component corresponding to spatial frequency q, or equivalently, period p=1/q, with rotation angle of fringes in the x-y plane given by $\psi$, defined as the CCW angle between the y axis and the image fringes, can be achieved by the use of a pair of beams of equal amplitude and controlled phase, overlapping on the substrate, where the beam's plane of incidence may be tilted with respect to the z axis by an angle $\zeta$, and where the desired azimuthal (intersection) half-angle of incidence $\theta$ between the beams is obtained from the relationship $p=\lambda/(2 \sin \theta)$, and where the rotation angle of the plane of incidence about the z axis is given by $\psi$, defined as the CCW angle between the x axis and the intersection of the plane of incidence with the x-y plane. Preferred methods for creating and controlling multiple beams pairs incident in multiple interferometer planes are described hereinafter.

According to Fourier optics principles, general image synthesis requires the set of image spatial frequency components $\{q\}$ to be mutually coherent (coherent imaging), such that each has a prescribed phase with respect to other components, implying that all beams have the same frequency $f=c/\lambda$ and thus the same wavelength $\lambda$, where c is the speed of light The intensity of the irradiance distribution on the surface of substrate 17 is then determined by the square of the sum of the electric fields due to all beams impingent on the image. It follows that spatial frequency components created by beam pairs with frequencies, and thus with wavelengths different from other beam pairs, cannot be mutually coherent. In this case (incoherent imaging), the intensity of the irradiance distribution on the surface of substrate 17 is determined by the sum of the square of the electric fields due to all beam pairs impingent on the image. The latter case is equivalent to writing each spatial frequency component to the substrate in separate writing passes.

It also follows from Fourier optics principles that a particular writing interferometer configuration, corresponding to a particular and restricted set of incident beam pairs with rotation angles $\{\psi\}$ and azimuthal angles $\{\theta\}$, can only be used to write a correspondingly restricted set of spatial frequency components on substrate 17. An expanded set of spatial frequency components can be generated by performing multiple-pass writing to substrate 17, wherein the substrate is rotated and/or the writing interferometer is reconfigured between writing passes. While a much larger set of useful patterns can be generated this way, the incoherent imaging patterns are limited in two ways: (1) radiation from subsequent passes cannot interfere coherently with previous-pass exposures, limiting generality, and (2) the background level of exposure in the resist tends to increase with multiple exposures, reducing contrast. A. Fernandes and D. W. Phillion (Applied Optics, Vol. 37, pp. 473–478, 1998) and S. H. Zaidi and S. R. J. Brueck (J. Vac. Sci. Technol. B, Vol. 11, pp. 658–666, 1993) discuss many aspects of multiple exposure interference lithography.

To enable general Fourier image synthesis, consider a writing interferometer with K planes of incidence (POI), identified by index $j=1, 2, \ldots, K$, each plane j containing $N_j$ beam pairs, identified by index $i=1, 2, \ldots, N_j$. The amplitudes, phases, frequencies, azimuthal angles, and rotation angles out of the POI of the left arm beams writing frequency components (i,j) are given by $\alpha_{L(i,j)}$, $\phi_{L(i,j)}$, $f_{L(i,j)}=d\phi_{L(i,j)}/dt/2\pi$, $\theta_{L(i,j)}$, and $\psi_{(i,j)}$, respectively, and the amplitudes, phases, frequencies, azimuthal angles, and rotation angles out to the POI of the right arm beams are given by $\alpha_{R(i,j)}$, $\phi_{R(i,j)}$, $f_{R(i,j)}=d\phi_{R(i,j)}/dt/2\pi$, $\theta_{R(i,j)}$, and $\psi_{R(i,j)}$, respectively. The POI subscripts is generally suppressed for the case that all beams are incident in a single plane of incidence (K=1), so that frequency components are simply labeled with (i) and $N_j$ is simply written N. The beam pair subscript i is further suppressed in the case of a single pair of beams in a single plane of incidence.

To achieve maximum image contrast the amplitudes of the left and right arms are generally set equal, or $\alpha_{L(i,j)} = \alpha_{R(i,j)}$. The image amplitude is defined as $\alpha_{(i,j)} = \alpha_{L(i,j)} + \alpha_{R(i,j)} = 2\alpha_{L(i,j)} = 2\alpha_{R(i,j)}$.

The image azimuthal angle is defined as $\theta_{(i,j)} = (\theta_{L(i,j)} + \theta_{R(i,j)})/2$, which measures the angle between the arms, and tilt angle $\theta_{T(i,j)} = (\theta_{L(i,j)} - \theta_{R(i,j)})/2$, which measures the tilt angle of the fringe planes with respect to the z axis. To achieve optimal image period and phase control it is required that the image fringes lie parallel to the substrate normal (z axis), implying that $\theta_{T(i,j)} = 0$ or $\theta_{L(i,j)} = \theta_{R(i,j)}$.

The image rotation angle is defined as $\psi_j = (\psi_{L(i,j)} + \psi_{R(i,j)})/2$ and POI tilt angle $\zeta_j = (\psi_{L(i,j)} - \psi_{R(i,j)})/2$. It is generally optimal to set $\psi_{L(i,j)} = \psi_{R(i,j)}$, implying that $\psi_j = \psi_{L(i,j)} = \psi_{R(i,j)}$ and $\zeta_j = 0$.

The image periods $p_{(i,j)}$ resulting from angles $\theta_{(i,j)}$ are given by $p_{(i,j)} = \lambda/(2 \sin \theta_{(i,j)})$. The phase difference between the beams in each pair (relative image phase) is defined as $\Delta\phi_{(i,j)} = \phi_{L(i,j)} - \phi_{R(i,j)}$, and the relative frequency difference (relative image frequency) with $\Delta f_{(i,j)} = f_{L(i,j)} - f_{R(i,j)} = d\Delta\phi_{(i,j)}/dt/2\pi$. The absolute image phase is defined as $\chi_{(i,j)} = \phi_{L(i,j)}$ and the absolute image frequency is defined as $\xi_{(i,j)} = \xi_{L(i,j)} = d\chi_{(i,j)}/dt/2\pi$.

Before general phase-locking conditions can be derived for phase-locking multiple beam pairs in multiple planes of incidence, necessary coordinate systems must be defined, interferometer geometry, and grating parameters. A stage reference frame (x,y,z) has been defined which is attached to rigid block 22. The intersection point of the overlapping beams pairs (the image center) typically occurs at coordinate x=y=z=0. In the stage frame the moving position of the center of substrate 17 is defined as $x = x_S(t)$, $y = y_S(t)$, and the substrate surface height at the image center (at x=y=0) is defined as $z = z_S(t)$. Typically $x_S = y_S = z_S = 0$ when substrate stage 30 is at the center of its range of travel. The x-velocity $u_S(t) = dx_S/dt$, y-velocity $v_S(t) = dy_S/dt$, and z-velocity $w_S(t) = dz_S/dt$ are also defined A substrate reference frame is defined (X,Y,Z) which is attached to substrate 17. This coordinate system is defined such that X=Y=Z=0 on the substrate surface at its geometric center. Substrate 17 is chucked to rotation stage 30b, which is rigidly attached to, and travels with, x-y stage 30. A yaw angle is defined, $\gamma = \gamma_S(t)$, of rotation stage 30b with respect to substrate stage 30, such that $\gamma_S$ is the angle between the x and X axis and increases as stage 30b rotates CW, implying that x=X and y=Y when $\gamma_S = 0$. The rotary stage 30b spin speed is defined with $\omega_S(t) = d\gamma_S/dt$.

The position $(X_B, Y_B)$ of the image center on the substrate surface, as measured in the substrate frame, which varies as the stage moves, is obtained from the relations $X = X_B(t) = -x_S \cos \gamma_S + y_S \sin \gamma_S$ and $Y = Y_B(t) = -x_S \sin \gamma_S - y_S \cos \gamma_S(t)$ is defined as the substrate surface height at the beam center. The velocity of the image center $(U_B, V_B)$ is obtained from the relations $U_B(t) = dX_B/dt = (x_S\omega_S + v_S) \sin \gamma_S + (y_S\omega_S - u_S) \cos \gamma_S$ and $V_B(t) = dY_B/dt = (y_S\omega_S - u_S) \sin \gamma_S - (x_S\omega_S + v_S) \cos \gamma_S$, and the substrate surface Z-velocity is obtained from $$W_B(t) = \frac{dZ_B}{dt} = \frac{dZ_B}{dX_B}\frac{dX_B}{dt} + \frac{dZ_B}{dY_B}\frac{dY_B}{dt} = \frac{dZ_B}{dX_B}U_B + \frac{dZ_B}{dY_B}V_B.$$

The map of substrate surface height is defined as $Z_W(X,Y)$. It follows that $z_S(t) = Z_B(t) = Z_W(X_B, Y_B)$.

In general, before writing to substrate 17 can commence, a complete description of the desired spatial frequency components at every area of the substrate must be established. This can be defined by a set of spatial frequency maps $Q_{(i,j)}(X,Y)$, or equivalently, grating period maps $P_{(i,j)}(X,Y) = 1/Q_{(i,j)}(X,Y)$, each corresponding to spatial frequency component (i,j) at substrate frame location (X,Y). The corresponding half-angles of beams writing frequency components (i,j) are determined from $\Theta_{(i,j)}(X,Y) = \sin^{-1}[\lambda/(2P_{(i,j)})]$.

It is also necessary to define the desired maps of amplitudes $A_{(i,j)}(X,Y)$, relative phases $\Phi_{(i,j)}(X,Y)$, absolute phases $\Xi_{(i,j)}(X,Y)$, and rotation angles $\Gamma_j(X,Y)$ of the fringes, for frequency components (i,j) observed in the substrate frame, where $\Gamma_j$ corresponds to the CCW angle between the Y axis and the fringes for POI$_j$. Since angles $\psi_j$ are fixed, this requires the condition $\Gamma_j = \psi_j - (\psi_1 - \Gamma_1)$. For the coherent imaging case, where all beam pairs have identical frequencies in the substrate plane, the absolute phases $\Xi_{(i,j)}(X,Y)$ are necessary for complete image synthesis. For the incoherent imaging case, where each beam pair has a unique frequency in the substrate plane, the absolute phases are meaningless and unnecessary.

An important task prior to writing to the substrate is to define a specific scanning scheme designed to write the desired pattern with uniform or otherwise controlled dose over a prescribed region of sample 17. The functions $X_B(t)$ and $Y_B(t)$ define the desired scan path, and $U_B(t) = dX_B/dt$ and $V_B(t) = dY_B/dt$ the desired scan velocity, of the image on the substrate, as measured in the substrate frame. For example, for incoherent imaging, the energy dose absorbed in resist 18, for frequency component (i,j), is given by $$D_{(i,j)}(X, Y) = \int_0^T a_{(i,j)}^2(X_B, Y_B) G_{(i,j)}(X - X_B, Y - Y_B) dt,$$

where T is the time duration of exposure and $G_{(i,j)}(X,Y)$ is the intensity profile of the Gaussian beams projected onto the substrate. A well-controlled dose is ensured by the selection of a scan path with controlled velocity and tightly overlapped scans, such as the boustrophedonic pattern depicted in FIGS. 5 and 9. Loss of dose control caused by image velocity variations during scanning can be compensated by, changes in beam amplitudes $\alpha_{(i,j)}$.

At every point $(X_B, Y_B)$ on substrate 17 during scanning, where it is desired to write the image following the scan path, the substrate stage must be rotated and translated to bring the desired substrate region under the fixed image at the proper angle. First, the image fringes are aligned to the desired fringe direction on substrate 17 by continuously rotating the stage frame to the locked angle $\gamma_S = \gamma_K(t) = \psi_j + \Gamma_j (X_B, Y_B)$, and with locked spin $$\omega_S = \omega_K(t) = \frac{d\gamma_K}{dt} = \frac{\partial \Gamma_j}{\partial X_B}U_B + \frac{\partial \Gamma_j}{\partial Y_B}V_B.$$

The substrate stage is also simultaneously and continuously translated to locked position $x_S = x_K(t) = -X_B \cos \gamma_K - Y_B \sin \gamma_K$ and $y_S = y_K(t) = X_b \sin \gamma_K - Y_B \cos \gamma_K$, and with locked velocity $$u_S = u_K(t) = \frac{dx_K}{dt} = -U_B\cos\gamma_K + X_B\omega_K\sin\gamma_K - V_B\sin\gamma_K - Y_B\omega_K\cos\gamma_K$$

and $$v_S = v_K(t) = \frac{dy_K}{dt} = U_B\sin\gamma_K + X_B\omega_K\cos\gamma_K - V_B\cos\gamma_K + Y_B\omega_K\sin\gamma_K.$$

Also at every point $(X_B, Y_B)$ on the substrate 17 during scanning, the amplitudes and angles of the incident beams need to be determined and controlled. Generally, fringe contrast is maximized when the amplitudes of left and right arms are equal ($\alpha_{L(i,j)} = \alpha_{R(i,j)}$), so during writing the locked amplitude is set $\alpha_{L(i,j)} = \alpha_{K(i,j)}(t) = A_{(i,j)}(X_B, Y_B)$. At every point $(X_B, Y_B)$ the desired periods $P_{(i,j)}(X, Y)$ have been defined. In practice, the image period $p_{(i,j)}$ is set equal to the locked period $p_{(i,j)} = p_{K(i,j)} = P_{(i,j)}(X_B, Y_B)$ by setting the image angle $\theta_{(i,j)}$ to the locked angle $\theta_{(i,j)} = \theta_{K(i,j)} = \Theta_{(i,j)}(X_B, Y_B)$.

The expressions for locking the image phases and frequencies to moving substrate 17 are, now derived. While following the scan path with substrate positions $[X_B(t), Y_B(t)]$, and surface height $Z_B(t)$, the relative image phase, $\Delta \phi_{(i,j)}$, is set equal to the locked relative image phase $\Delta \phi_{K(i,j)}$ with the relation $\Delta \phi_{(i,j)} = \Delta \phi_{K(i,j)}(t) = \Phi_{(i,j)}(X_B, Y_B)$. The equivalent condition for locking the relative image frequency is $\Delta f_{(i,j)} = \Delta f_{K(i,j)}(t) = d\Phi_{(i,j)}/dt/2\pi = Q_{(i,j)}(X_B, Y_B)[U_K(t) \cos \Gamma_j + V_K(t) \sin \Gamma_j]$. Also while following the scan path, the absolute image phase, $\chi_{(i,j)}$, is to set equal to the locked absolute image phase, $\chi_{K(i,j)}$, with the relation $$\chi_{(i,j)} = \chi_{K(i,j)}(t) = \Xi_{(i,j)}(X_B, Y_B) + \frac{2\pi}{\lambda} \int_0^t \cos\Theta_{(i,j)}(X_B, Y_B) W_B d\tau.$$

The equivalent condition for locking the absolute image frequency is $$\xi_{(i,j)} = \xi_{K(i,j)}(t) = \frac{d\Xi_{(i,j)}}{dt} + \frac{2\pi}{\lambda} W_B \cos\Theta_{(i,j)}(X_B, Y_B).$$

For many applications it is desirable to limit the rapidity that grating parameters change during scanning so that minimal image smearing occurs. Overly rapid changes of image period, phase, or rotation will cause loss of grating phase fidelity and/or contrast, necessitating either a smaller image size or modification of the grating design to reduce the rapidity of grating parameter changes across the substrate. The optimal conditions for grating parameter changes per image diameter are as follows: phase change $\Delta\phi << 2\pi$; period change $\Delta p << p^2/d_{par}$; image rotation $\Delta\psi << p/d$.

Figure 10A:
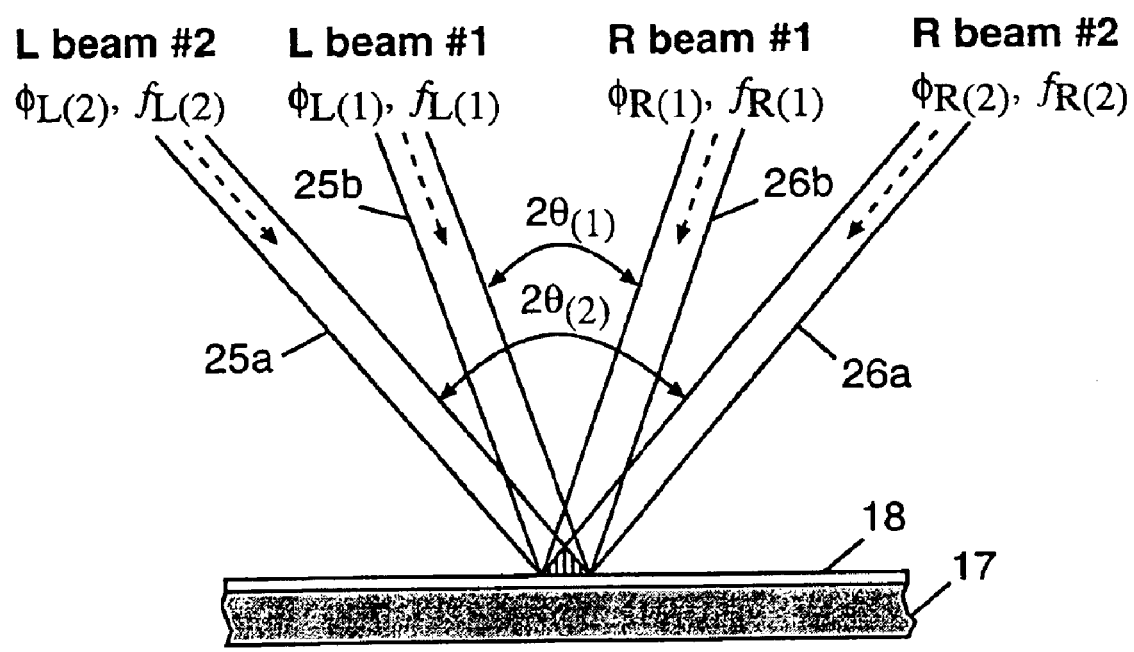
FIG. 10a is a diagram presenting nomenclature of phase, frequency, and angle for multiple beams.
Figure 10B:
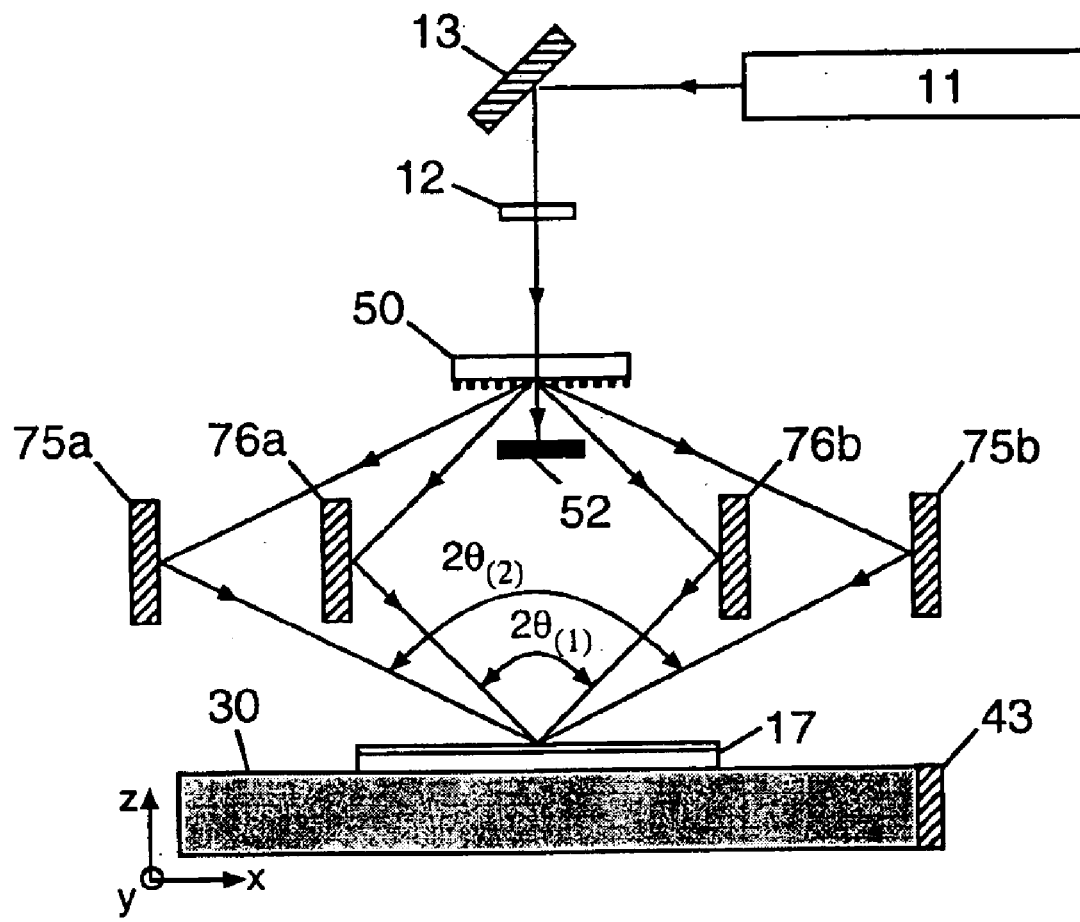
FIG. 10b is a schematic block diagram of an exemplary embodiment of the invention using a method of forming four-beam scanning interferometer.

For illustrative purposes, FIG. 10a depicts a couple of beam pairs incident in the same plane ($\psi_1 = \psi_2$). Left beam #1 25b has phase $\phi_{L(1)}$, frequency $f_{L(1)}$, and azimuthal angle $\theta_{(1)}$; right beam #1 26b has phase $\phi_{R(1)}$, frequency $f_{R(1)}$, and azimuthal angle $\theta_{(1)}$; left beam #2 25a has phase $\phi_{L(2)}$, frequency $f_{L(2)}$, and azimuthal angle $\theta_{(2)}$; right beam #2 26a has phase $\phi_{R(2)}$, frequency $f_{R(2)}$, and azimuthal angle $\theta_{(2)}$. An interferometer illustrating a simple embodiment of the phase locking principle is depicted in FIG. 10b. Transmission grating 50 has been designed to split beam from laser 11 into a zero order beam which is blocked by stop 52, a pair of first-order diffracted beams which are directed to substrate 17 by mirrors 76, where they interfere with azimuthal angle $\theta_{(1)}$, and a pair of second-order diffracted beams which are also directed to substrate 17 by mirrors 75, where they interfere with azimuthal angle $\theta_{(2)}$. Thus the image comprises two distinct spatial frequency components with periods $p_{(1)} = \lambda/(2 \sin \theta_{(1)})$ and $p_{(2)} = \lambda/(2 \sin \theta_{(2)})$. In this example, the phase and amplitude of the two spatial frequency components are controlled by laborious design and fabrication of beamsplitter 50 and tedious adjustment of mirrors 75 and 76. Alternative interferometer designs are described hereinafter which allow more general and rapid control of the spatial frequency components in the image.

Figure 10C:
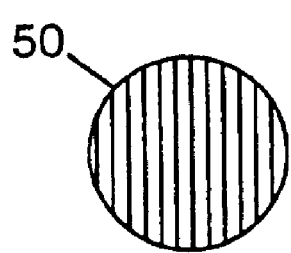
FIG. 10c shows an image resulting from two beams.
Figure 10D:
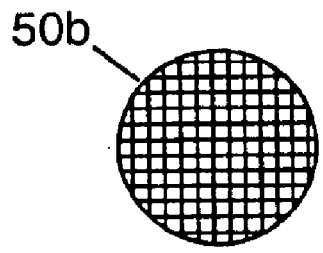
FIG. 10d shows an image resulting from four beams in two, perpendicular, planes of incidence.
Figure 11A:
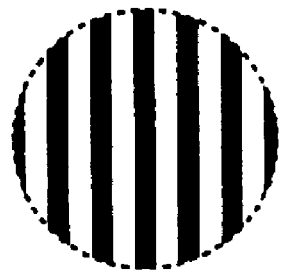
FIG. 11a shows an image resulting from interfering one beam pair.
Figure 11B:
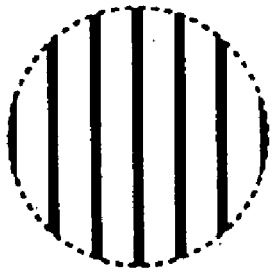
FIG. 11b shows an image resulting from interfering two in-plane beam pairs.
Figure 11C:
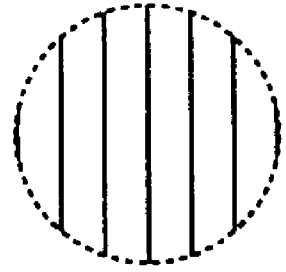
FIG. 11c shows an image resulting from interfering three in-plane beam pairs.
Figure 11D:
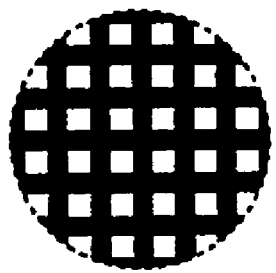
FIG. 11d shows an image resulting from interfering two perpendicular-plane beam pairs.

Most writing interferometer designs described herein are readily generalized to multiple planes of incidence. In the case of the interferometer depicted in FIG. 10b, beamsplitter grating 50, which is depicted in FIG. 10c as viewed along the −z direction, consists of a grating deposited or etched into a transparent substrate. In this particular example grating 50 is designed to diffract the incident beam into a zero order and ±1 and ±2 order beams in the x-z plane. Alternatively, grating beamsplitter 50 can be replaced with grid beamsplitter 50b, depicted in FIG. 10d. Grid 50b is designed to diffract the incident beam into 9 beams: zero order, ±1 and ±2 orders in the x-z plane, and ±1 and ±2 orders in the x-y plane. Additional mirrors, similar to mirrors 75 and 76 in FIG. 10b, are required to direct the beams diffracted in the y-z plane to intersect on substrate 17.

A few examples of useful images that can be achieved by summing multiple beam pairs are depicted in FIG. 11. FIG. 11a depicts a grating image with equal lines and spaces achieved by interfering a single beam-pair. FIG. 11b depicts a grating image of the same period but with thin lines achieved by interfering two beam-pairs incident in the same plane. FIG. 11c depicts a grating image of the same period but with even thinner lines achieved by interfering three beam pairs incident in the same plane. FIG. 11d depicts a grid image achieved by interfering two beam pairs, each pair incident with the same angle $\theta$ but in a different plane of incidence separated by 90 degrees (i.e., $\psi_2 - \psi_1 = 90$ degrees; see A. Fernandez and D. Phillon, "Effects of phase shifts on four-beam interference patterns," *Appl. Optics* 37, 473–478 [1998]).

Figure 12:
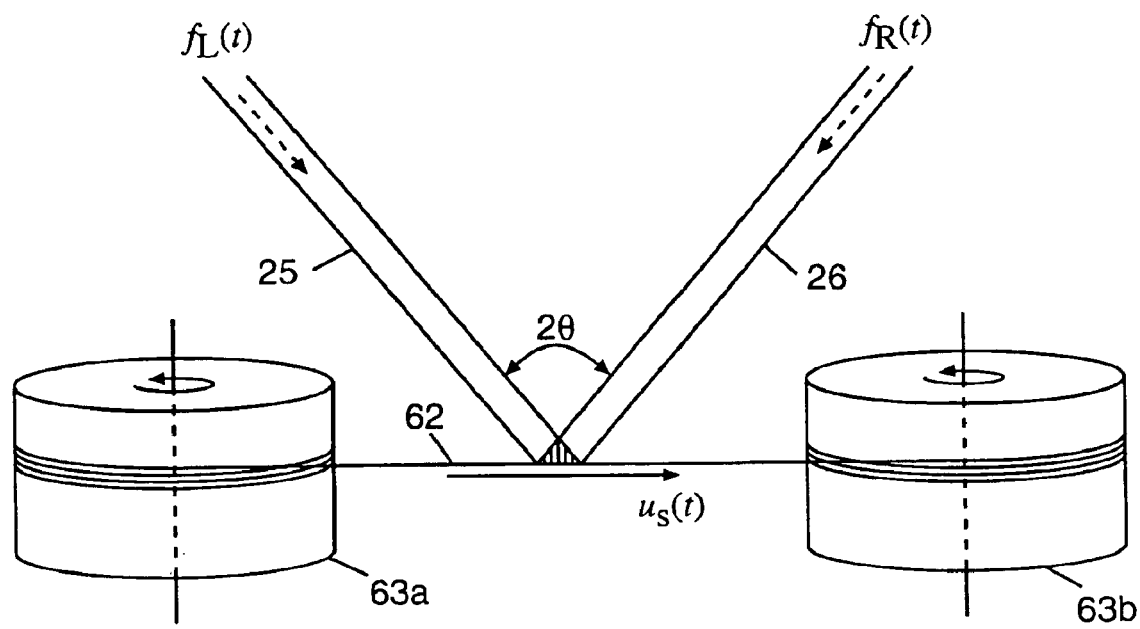
FIG. 12 is a diagram showing a method for writing gratings onto optical fibers using Doppler scanning.

These principles may be used to pattern precision periodic structures on many types of substrates or other objects, including optical fibers and information storage disks. With reference to FIG. 12, a scheme is depicted for patterning gratings onto the cores of optical fibers. Such gratings are used for filtering and other manipulations of light beams in fibers commonly used in high-speed fiber-optic communications. In this scheme, a writing interferometer (not shown) directs and interferes left beam 25 of frequency $f_L$ and right beam 26 of frequency $f_R$, with controlled frequency difference between the beams, $\Delta f = f_L - f_R$, forming an image on the fiber with period $p = \lambda/(2 \sin \theta)$. Feed spool 63a feeds optical fiber 62 to pickup spool 63b such that the speed of the fiber past the image is $u_S(t)$. The grating is then inscribed onto the fiber while satisfying the phase lock condition $\Delta f_S = \Delta f_K = u_S(t)/p$. Alternatively, spools 63a and 63b can be attached to an x-y table, such that short sections of fiber are paid out and the spools locked, and the grating is written by subsequently moving the stage in the x-direction with speed $u_S(t)$, while satisfying the phase lock condition.

Figure 13A:
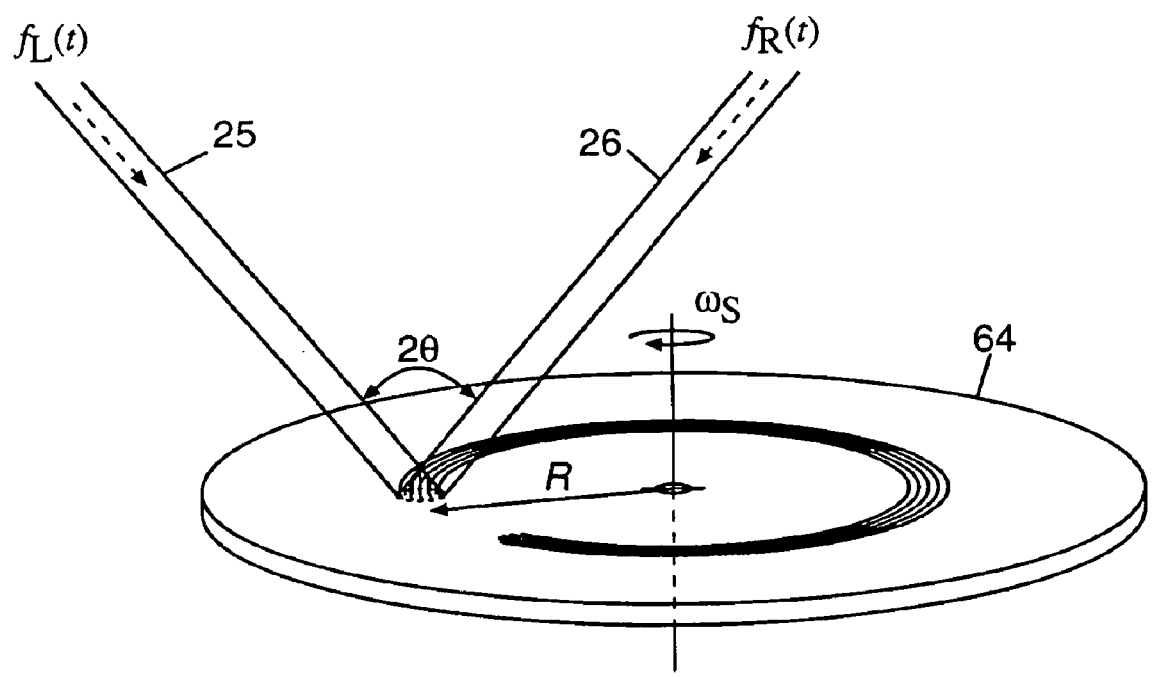
FIG. 13a is a diagram showing a method for writing rotational grating patterns onto a disk substrate.
Figure 13B:
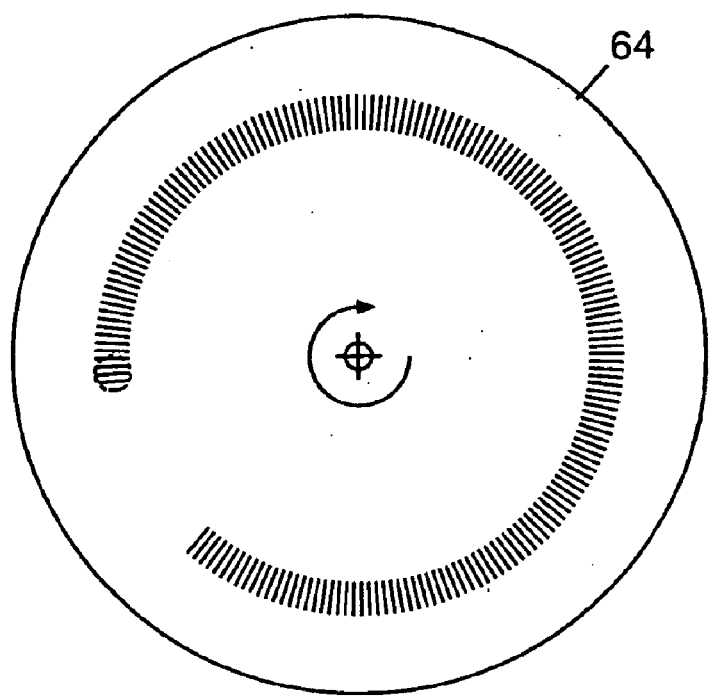
FIG. 13b is a diagram showing a method for writing radial grating patterns onto a disk substrate using Doppler scanning.
Figure 13C:
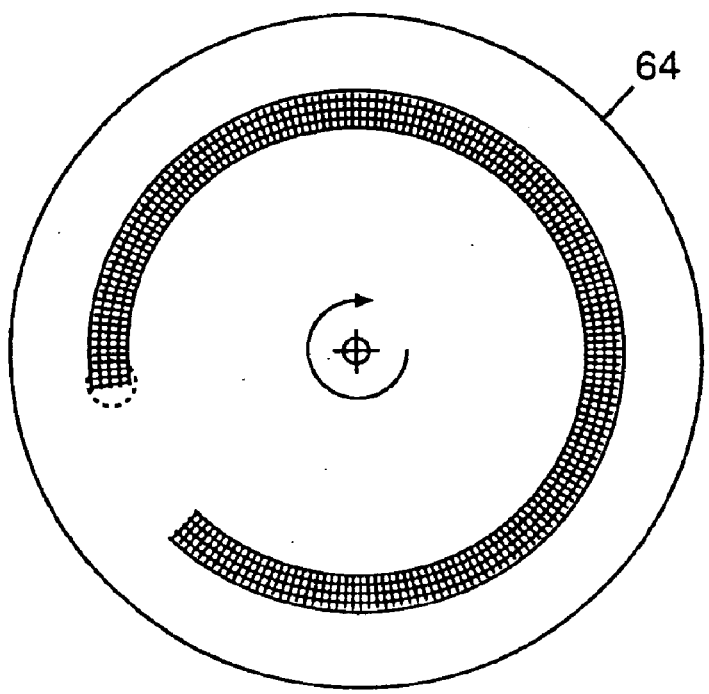
FIG. 13c is a diagram showing a method for writing grid patterns onto disk substrate using four simultaneous unshifted and Doppler-shifted beams.

With reference now to FIG. 13, a scheme is depicted for patterning periodic structures onto information storage media such as magnetic or optical disks. In particular, with reference to FIG. 13a, a writing interferometer (not shown) directs and interferes left beam 25 of frequency $f_L$ and right beam 26 of frequency $f_R$, with controlled frequency difference $\Delta f = f_L - f_R$, forming an image on the disk at radius R with period $p = \lambda/(2 \sin \theta)$. Disk 64 is spun with angular frequency $\omega_S$, such that the speed of the media under the image is $R\omega_S$. The grating is then inscribed onto the disk while satisfying the phase lock condition. FIG. 13a depicts a grating that would obtain if the plane of incidence of the pair of writing beams were perpendicular to the direction of motion of the media under the image, yielding the phase lock condition $\Delta f = 0$. FIG. 13b depicts a grating that would obtain if the plane of incidence of the pair of writing beams were parallel to the direction of motion of the media under the image, yielding the phase lock condition $\Delta f = R\omega_S/p$. FIG. 13c depicts a grid that would be obtained if two pairs of writing beams were used: one that is parallel to the direction of motion of the media under the image, and one that is perpendicular.

The description of ways interference lithography (IL) can be performed on moving substrates by using the method of phase locking has now been provided. Further benefits of narrow beams in IL, and a number of ways the beams could be split and recombined on a substrate, generating image periods both statically and under electronic control will now be provided. With reference to FIG. 14, the method for splitting and recombining beams, depicted earlier in FIGS. 1–3, is examined in further detail. In particular, with reference to FIG. 14a, beam from laser 11 passes through shutter/attenuator 12 and is then spatially filtered by means of focusing lens 85, pinhole 86, and collimating lens 87. The spatial filter ensures good wavefront quality of the beam (flat phase), which will nominally ensure that the interferometer image has straight grating lines. The beam is then split into left and right beams by dielectric beamsplitter 14. Left beam is adjusted by attenuator 15 in order to balance the intensity of both interferometer arms, and is then directed to substrate 17 by left mirror 16a. Right beam is directed to the substrate by right mirror 16b. Substrate 17 is attached to x-y stage 30, to which is attached interferometer reference mirror 43. Stage 30 is interferoinetrically controlled and scanned, as described previously. FIG. 14b depicts a grating image that would obtain if spatial filter 85–87 had been designed to transmit a beam of large diameter to beamsplitter 14. A large distortion is evident in the image, which represents the combined optical manufacturing figure errors in the regions sampled by the beam due to beamsplitter 14, attenuator 15 and mirrors 16. However, if spatial filter 85–87 is designed to transmit a beam of smaller diameter, then a smaller region of the optical components will be sampled and an image with reduced distortion, such as depicted in FIG. 14c, will result.

Figure 15A:
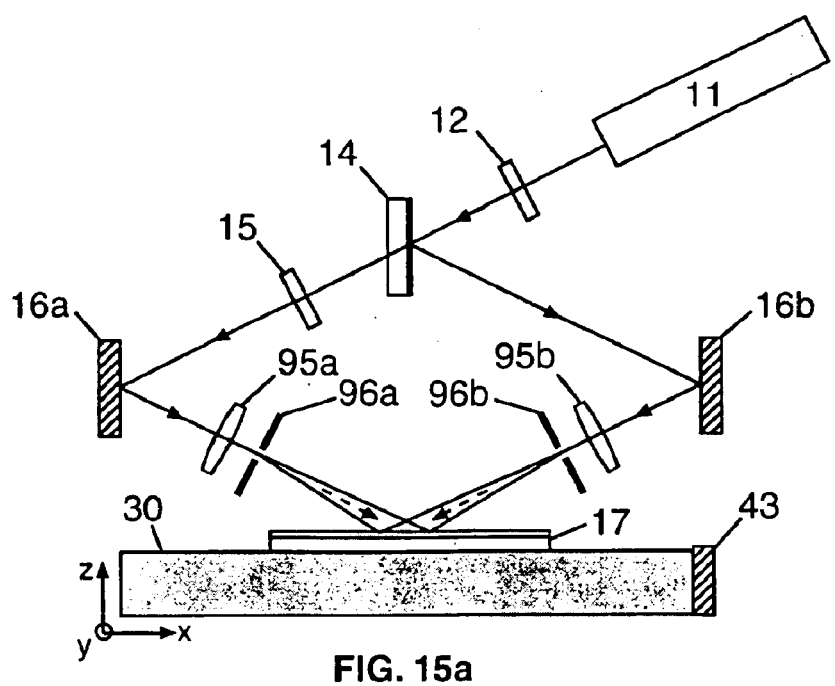
FIG. 15a is a schematic diagram of an exemplary embodiment of a writing interferometer utilizing pinhole spatial filters.
Figure 15B:
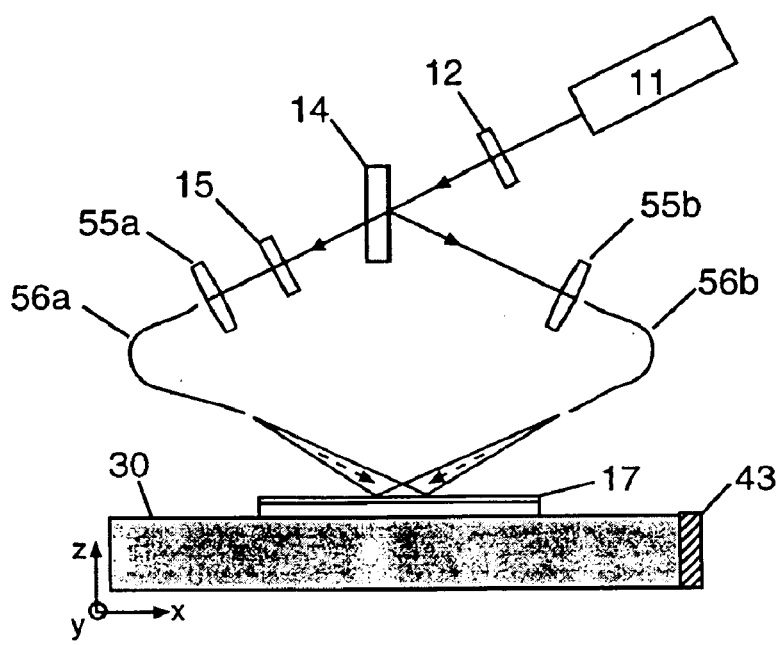
FIG. 15b is a schematic diagram of an exemplary embodiment of a writing interferometer utilizing fiber optic spatial filters.
Figure 15C:
FIG. 15c shows hyperbolic distortion in a grating image due to spherical beams from spatial filters.
Figure 15D:
FIG. 15d shows reduced grating image distortion resulting from reduced beam diameter.

FIG. 15a depicts an alternative method for forming the image. In this case the beam is spatially filtered after the beamsplitter and mirrors, rather than before. Beams from mirrors 16 are focused by lenses 95 onto pinholes 96 and are then allowed to expand to substrate 17 without the use of collimating lenses. Alternatively, FIG. 15b depicts a method which avoids the use of recombiner mirrors 16, but rather uses focusing lenses 55 to direct the light into optical fibers 56, which are then bent to direct the light to substrate 17. In both these cases, light propagating from the pinhole or fiber will expand as spherical wavefronts to the substrate, forming an image with hyperbolic distortion, as depicted in FIG. 15c. However, by the use of spatial filters or fibers designed to propagate narrow beams, a smaller image with reduced distortion can be achieved, as depicted in FIG. 15d.

Figure 16A:
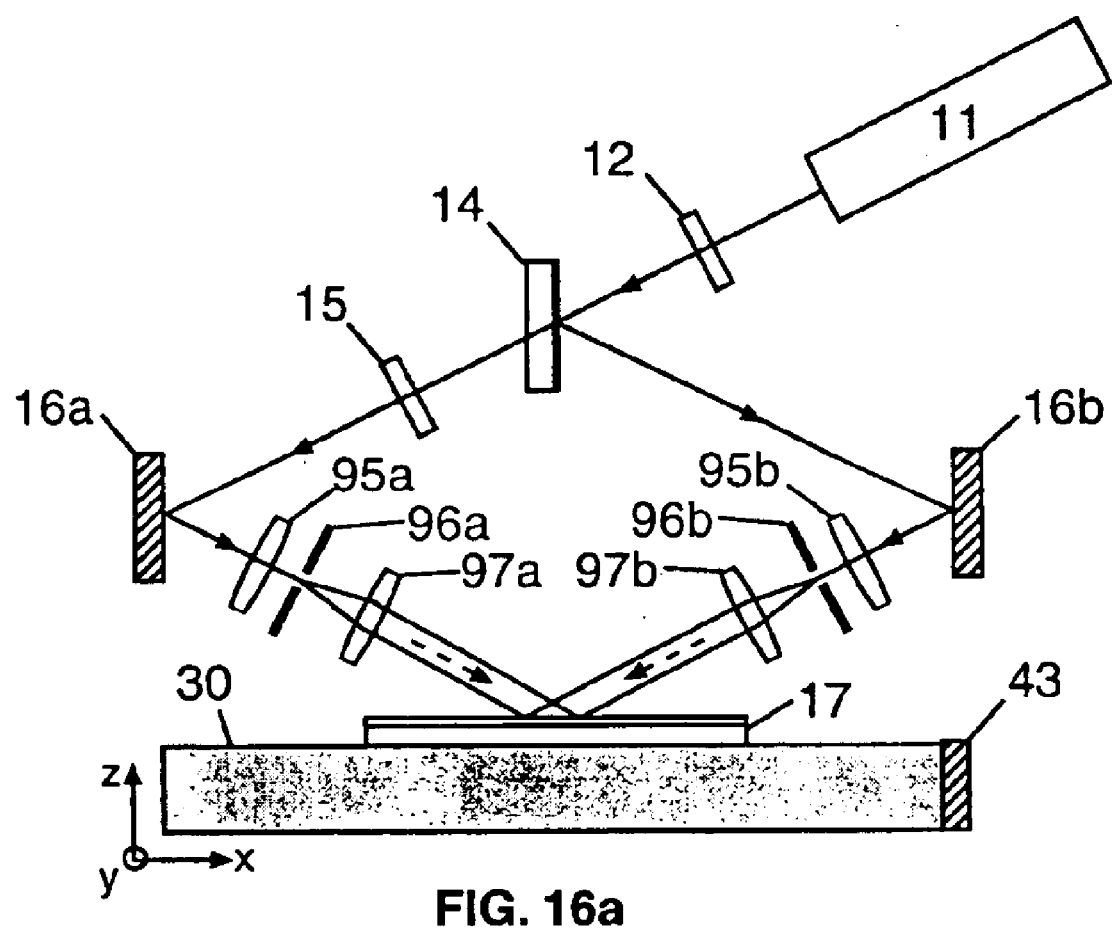
FIG. 16a is a schematic block diagram of an exemplary embodiment of a writing interferometer utilizing pinhole spatial filters and collimating lenses.
Figure 16B:
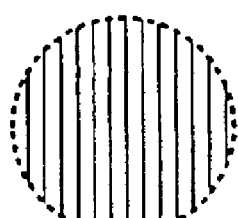
FIG. 16b shows a resulting grating image with eliminated hyperbolic distortion.

FIG. 16a depicts an interferometer similar to that depicted in FIG. 15a, except that collimating lenses 97 have been used to produce flat wavefronts rather than spherical ones. If high quality lenses 97 are used, a low-distortion image depicted in FIG. 16b will be obtained. The advantage of this design is that other optical components of the system do not have to be of such high quality, since spatial filters 95–97 remove wavefront aberrations caused by these components.

Figure 17A:
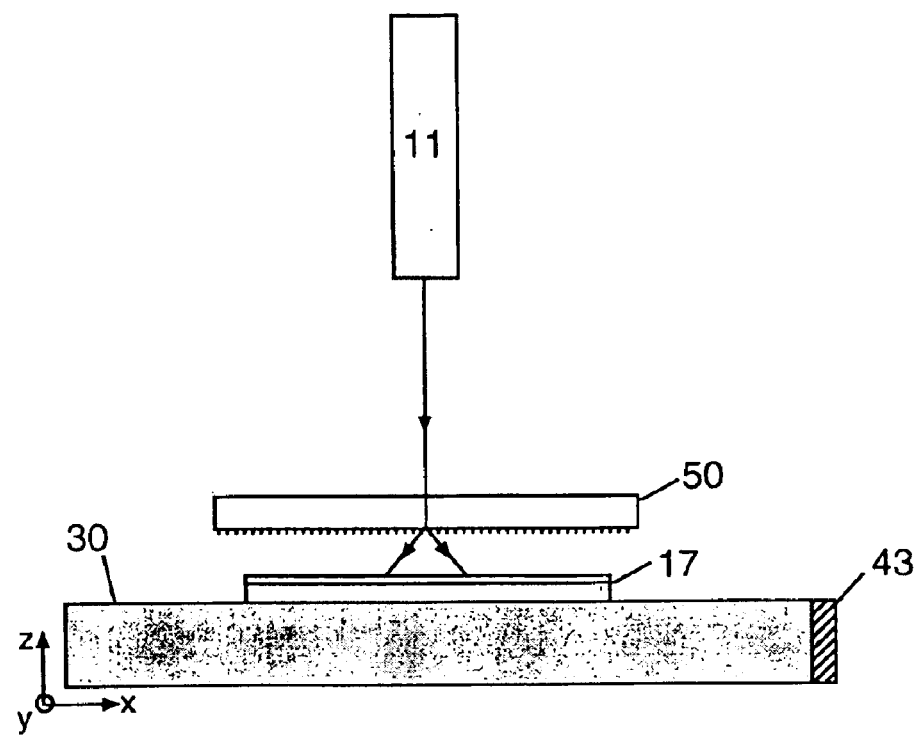
FIG. 17a is a schematic block diagram of an exemplary embodiment of a writing interferometer utilizing a transmission grating beamsplitter and plus/minus first-order beam interference.
Figure 17B:
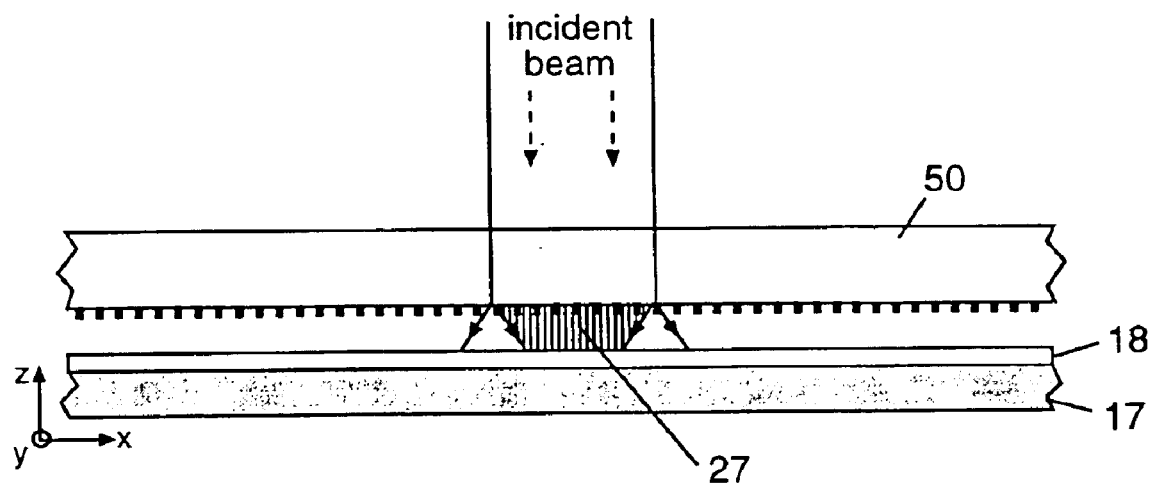
FIG. 17b is a diagram showing details of the writing interferometer, showing first-order diffracted beams and grating image in region of overlap.

FIGS. 17–18 depict interferometer designs that avoid the use of recombiner optics, but instead place the substrate in the near field of a diffractive beamsplitter. With reference to FIG. 17a, beam from laser 11 is directed normally to transmission-grating beamsplitter 50, also called a phase mask, which produces diffracted left (−1 order) and right (+1 order) beams. Beamsplitter 50 is designed to suppress zero-order diffraction, transmitting only ±1 orders. Diffracted beams are incident on substrate 17, which is chucked to stage 30 and controlled as described previously. Details of the near-field diffraction region are depicted in FIG. 17b. Left and right diffracted beams overlap and interfere in small region 27 near the phase mask, casting a grating image in resist 18 on substrate 17. Substrate 17 needs to be placed close to mask 50 such that resist 18 samples a substantial portion of interference region 27.

Figure 18A:
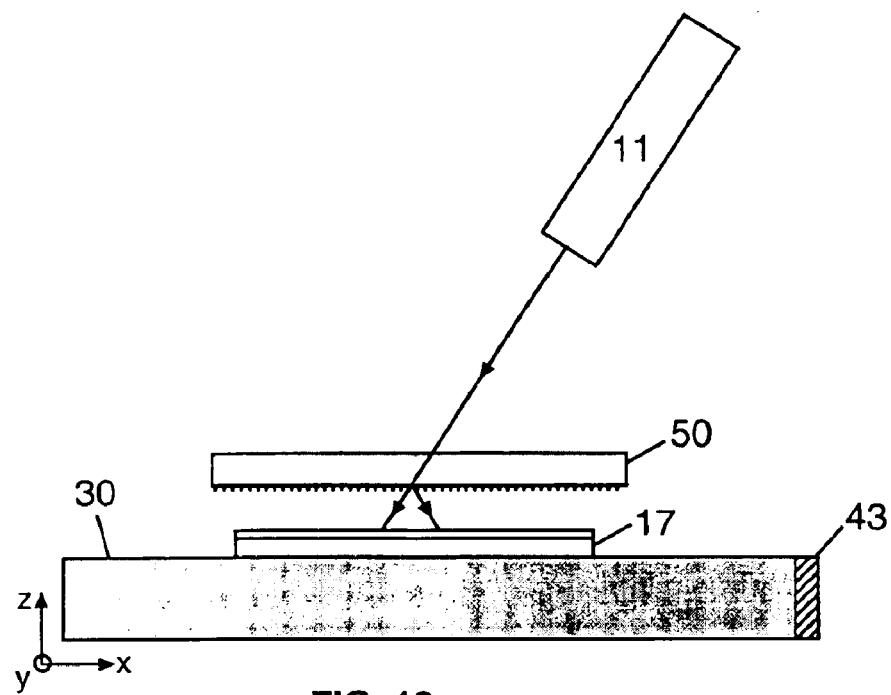
FIG. 18a is a schematic block diagram of an exemplary embodiment of a writing interferometer utilizing a transmission grating beamsplitter and zero/first-order beam interference.
Figure 18B:
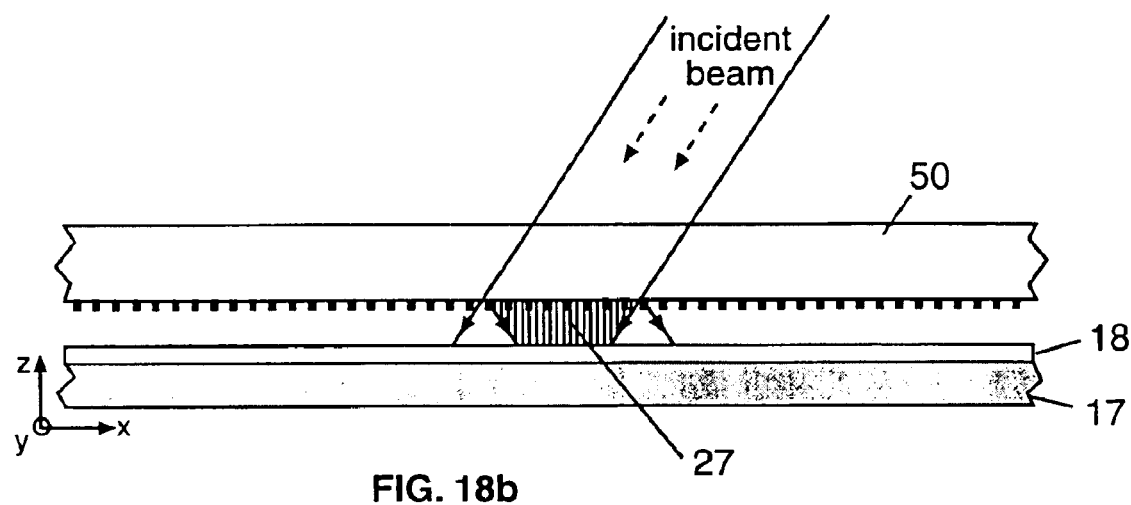
FIG. 18b is a diagram showing details of the writing interferometer, showing zero- and first-order diffracted beams and grating image in region of overlap.

An alternative near-field interferometer design is depicted in FIG. 18. With reference to FIG. 18a, beam from laser 11 is directed to beamsplitter 50 as before, but in this case at an angle such that the zero- and −1-order beams diffract from mask 50 at the same angle with respect to the normal. Mask 50 is designed to transmit zero- and −1-order beams of equal intensity, while suppressing the +1 order beam. Details of the near-field diffraction region are depicted in FIG. 18b. Image formation occurs in an identical fashion as depicted in FIG. 17.

Figure 19A:
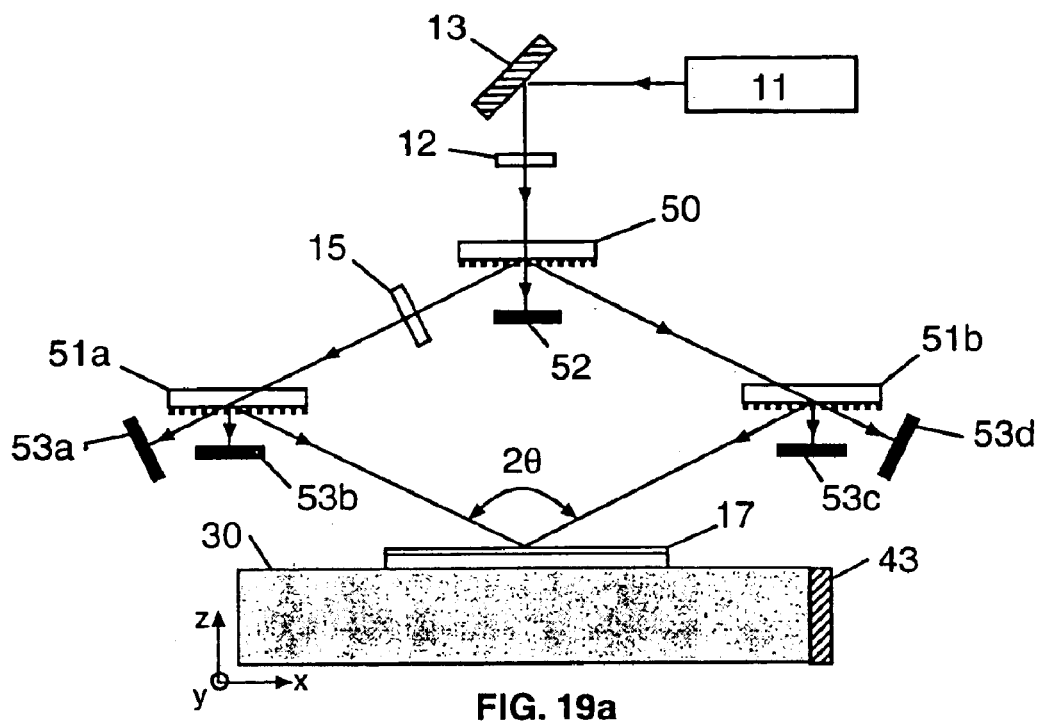
FIG. 19a is a schematic block diagram of an exemplary embodiment of a writing interferometer utilizing transmission gratings for beam splitting and recombining.

With reference now to FIG. 19a, an achromatic interference lithography design is depicted (see T. A. Savas, M. L. Schattenburg, J. M. Carter, and H. I. Smith, "Large-area achromatic interferometric lithography for 100 nm period gratings and grids," J. Vac. Sci. Technol. B 14, 41674170 (1996)). This design is very tolerant of beam spatial and temporal incoherence. Beam from laser 11 is reflected from optional mirror 13 and travels through shutter/attenuator 12. Beam then transmits through splitter grating 50, diffracting into zero and ±1 orders. Zero-order beam is blocked by stop 52. The intensity of left beam is balanced with right beam by use of attenuator 15. Beams are then directed to recombiner gratings 51, which direct −2-order diffracted beams to substrate 17, where they interfere to form grating image. Zero and +1-order beams from gratings 51 are blocked by stops 53.

Figure 19B:
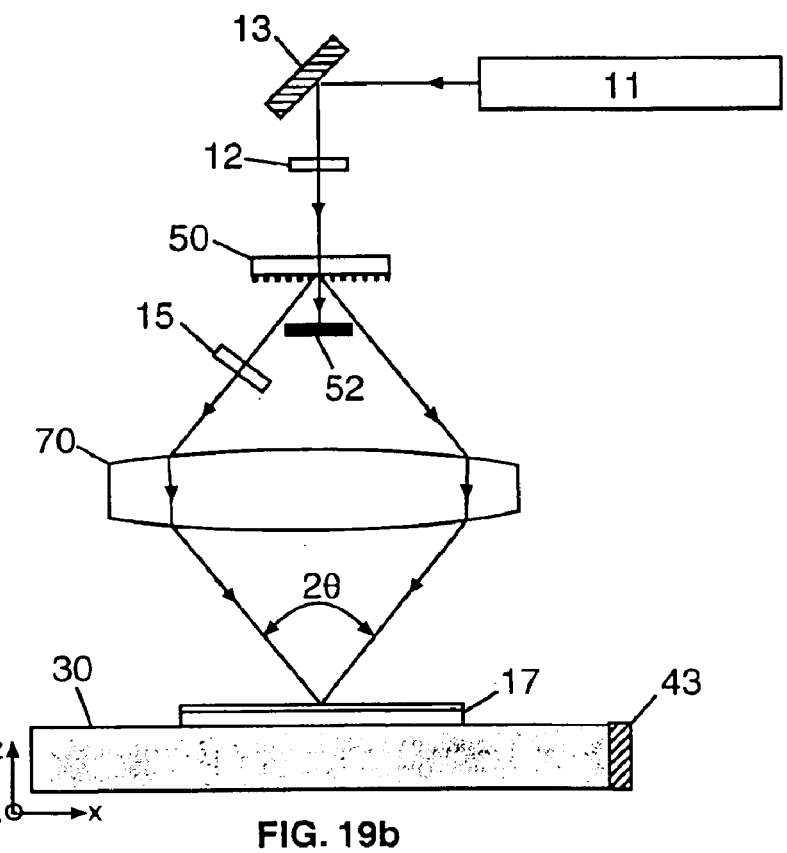
FIG. 19b is a schematic block diagram of another exemplary embodiment of a writing interferometer utilizing transmission grating beamsplitter and lens beam recombiner.
Figure 19C:
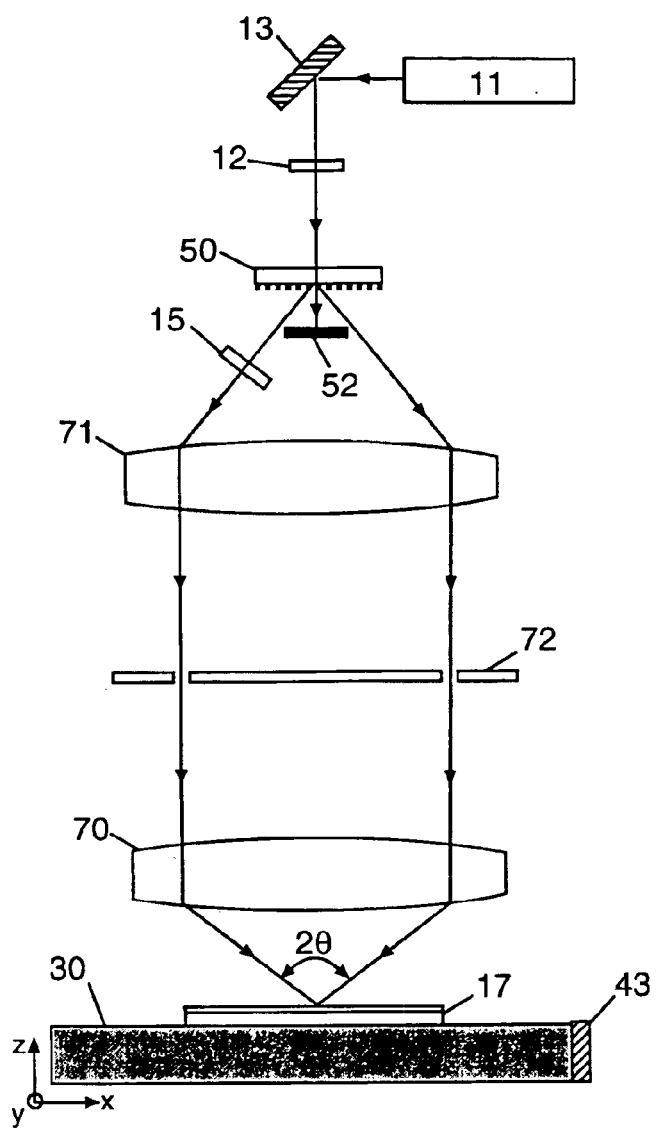
FIG. 19c is a schematic block diagram of another exemplary embodiment of a writing interferometer utilizing transmission grating beamsplitter and objective lens recombiner, the objective lens featuring a spatial filter plate at the Fourier plane of the lens.

An alternative means to recombine beams is depicted in FIG. 19b. Diffracted beams from splitter grating 50 are refracted and focused by lens 70, which directs them to substrate 17, where they overlap and interfere to form grating image. This design has the advantage that rapid changes of writing grating period, which is determined by the 2θ angle between the interfering beams, may be effected simply by changing the period of beamsplitter 50. However, beams combined by lens 70 will have significant phase curvature due to focussing, resulting in an image with undesirable hyperbolic distortion. An improved design, which avoids this problem, is depicted in FIG. 19c. Beam from laser 11 is split by grating 50, as described previously, but in this case beams are directed by lens 71 to aperture plate 72, which lies at the focus of lens 71. The beams then expand to second lens 70 that directs them to substrate 17, where they overlap and interfere. Lens 70 performs two functions: (1) collimating the expanding beams from aperture plate 72, and (2) recombining the beams at the substrate. Lens 70, aperture plate 72, and lens 71 are collectively referred to as an objective lens.

Figure 19D:
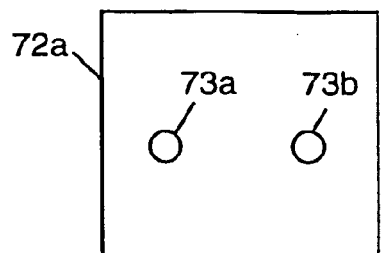
FIG. 19d is a top view of a spatial filter plate designed to allow patterning of only one grating period.
Figure 19E:
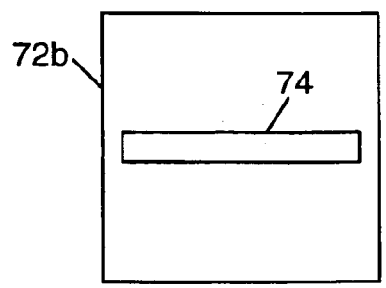
FIG. 19e is a top view of a spatial filter plate designed to allow patterning parallel gratings with a range of periods.
Figure 19F:
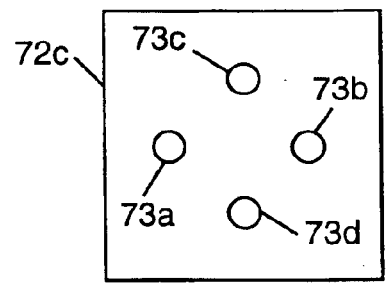
FIG. 19f is a top view of a spatial filter plate designed to allow patterning of only two perpendicular grating periods.
Figure 19G:
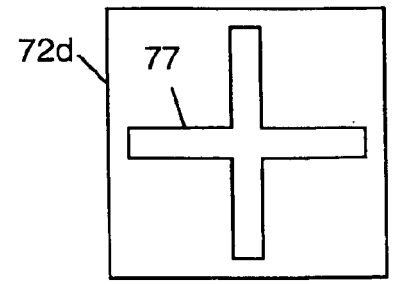
FIG. 19g is a top view of a spatial filter plate designed to allow patterning perpendicular gratings with a range of periods.

Aperture plate 72 may be designed to spatially filter the beams, and can take many forms depending on the application. For example, FIG. 19d depicts a first aperture plate 72a with discrete holes for the −1 order 73a and +1 order 73b. The size of the holes and their spacing in aperture plate 72 would be determined by the beam diameter at focus and the desired period of the writing grating. Holes thus designed would only allow beams of the desired spatial frequency to propagate through the objective lens and impinge on the substrate, blocking other beams generated, for example, by imperfections in the optics. FIG. 19e depicts a second aperture plate 72b with a slit opening 74 rather than discrete holes. In this case, spatial filtering is only performed on spatial frequencies in the y direction. The advantage in this case is that aperture plate 72b does not need to be changed if the period of splitter grating 50 is changed. FIG. 19f depicts a third aperture plate 72c which would be used in the case that grating splitter 50 is replaced with a grid beamsplitter similar to 50b depicted in FIG. 10d. In this case ±1 order beams are diffracted in both the x-z and y-z planes. Holes 73a and 73b in aperture plate 72c provide spatial filtering of the ±1 beams diffracted in the x-z plane, and holes 73c and 73d provide filtering of the ±1 beams diffracted in the y-z plane. FIG. 19g depicts a fourth aperture plate 72d that would also be used in the case of a grid beamsplitter similar to that used in the case depicted in FIG. 19f. Cross-shaped slit 77 provides spatial filtering of all beams diffracted along the x-z and y-z planes, with similar benefits as in the case depicted in FIG. 19e.

The enumeration of ways that narrow beams may be split and recombined to form grating images of static period has been provided. Several methods where the period of the grating may be varied continuously (or "chirped"), while writing, under electronic control will now be provided. These methods may be used to write substrates with constant grating period, but where rapid changes of grating period between substrates is desired, or they may be used to write gratings where the period is intended to vary continuously across the substrate in a controlled fashion. The geometric requirements for continuous phase, period, and rotation of the image during writing to the substrate were described heretofore. Here a couple of examples of practical application of these concepts are illustrated.

Figure 20A:
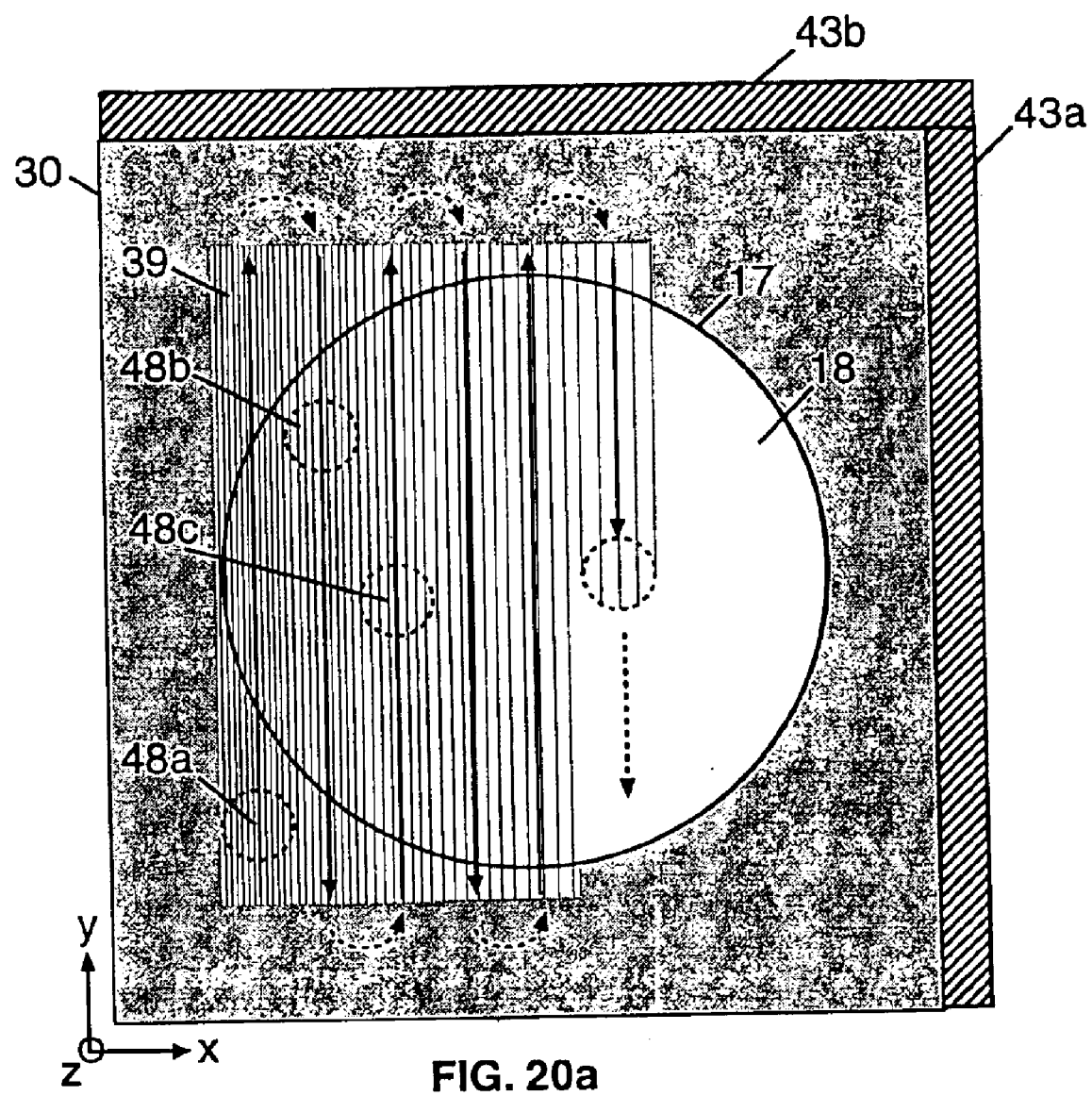
FIG. 20a shows a boustrophedonic scheme for patterning linear variable-period gratings.

With reference to FIG. 20a, a scanning scheme for writing gratings with period varying in one dimension is described. Substrate 17 is chucked to x-y stage 30 described previously, and scanned in a boustrophedonic fashion, similar as described previously and depicted in FIG. 5, writing variable-period grating 39. Scanning starts with image 48a of period $p_1$ in lower left-hand corner of substrate. Stage 30 scans in the -y direction traversing the substrate, while fixing x. Stage 30 is then stopped and the writing interferometer is reconfigured such that image 48b has grating period $p_2 = p_1 + \Delta p$, where $\Delta p$ is small compared to $p_1$. Stage 30 is then moved in the $-\Delta x$ direction, where $\Delta x$ is a fraction of the beam diameter, say 10–50%, while simultaneously being an exact multiple of distance $(p_1+p_2)/2$. Stage 30 then scans in the +y direction traversing the substrate, while fixing x. The procedure is then repeated with image 48c of grating period $p_3$, etc., until the desired area of substrate 17 has been written. Alternatively, the substrate may be written with a Doppler-scanning scheme similar to that described previously and depicted in FIG. 9, where the stage moves in a direction perpendicular to the grating lines and the grating period is varied continuously while scanning while satisfying the same conditions.

Figure 20B:
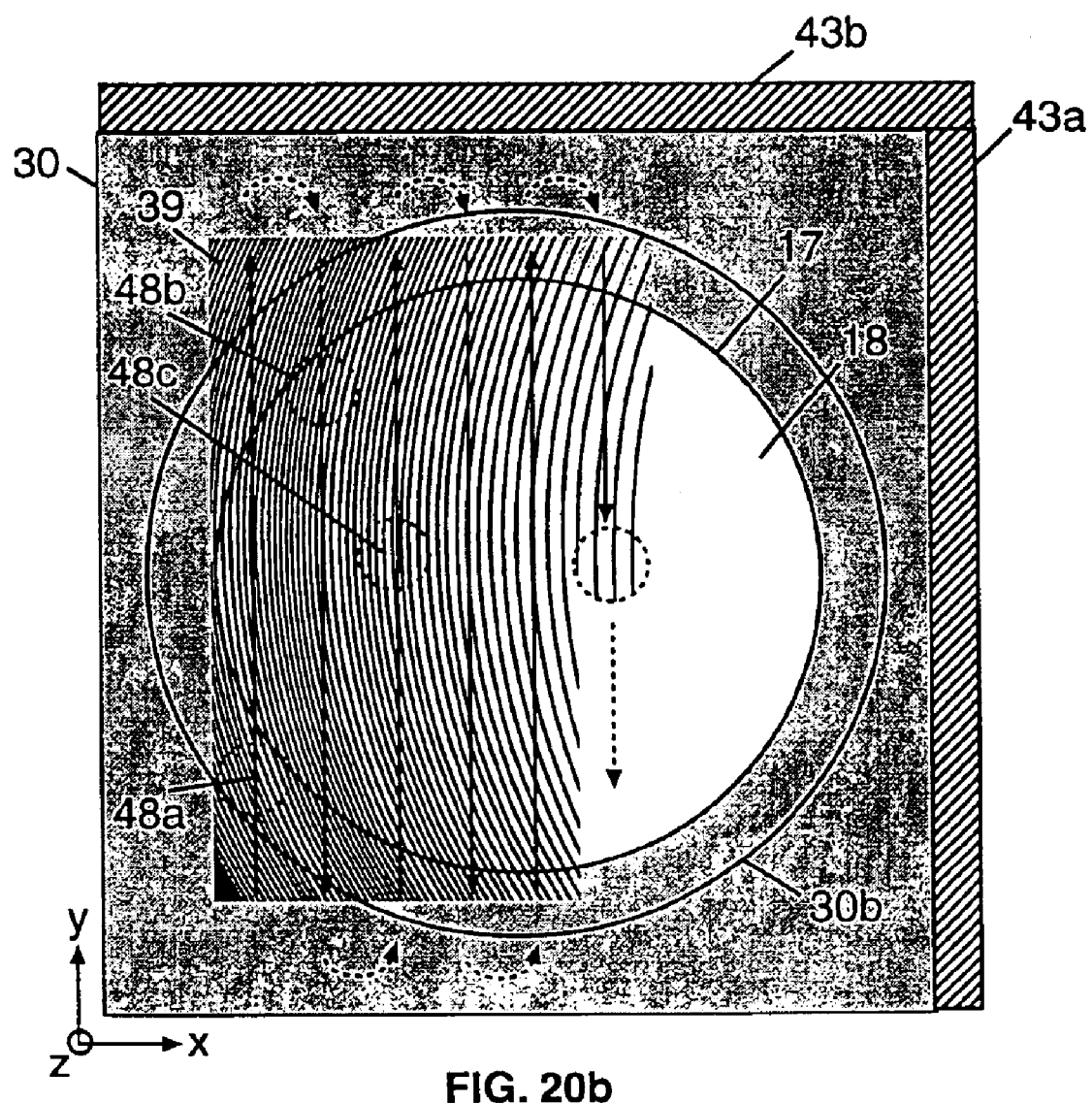
FIG. 20b shows a boustrophedonic scheme for patterning curved variable-period gratings.

With reference to FIG. 20b, a scanning scheme for writing gratings with period both varying and rotating is described. Substrate 17 is chucked to rotation stage 30b which is supported by x-y stage 30 described previously, and scanned in a boustrophedonic fashion in the frame of the substrate, similar as described previously and depicted in FIG. 20b, writing variable-period grating 39. During scanning, at every point on substrate 17, stage 30b $\gamma_S$ rotary position, stage 30 $x_S$ and $y_S$ positions, and the period, intensity, and phase in image 38 are varied and controlled as described previously to write the desired grating pattern 39.

Figure 21:
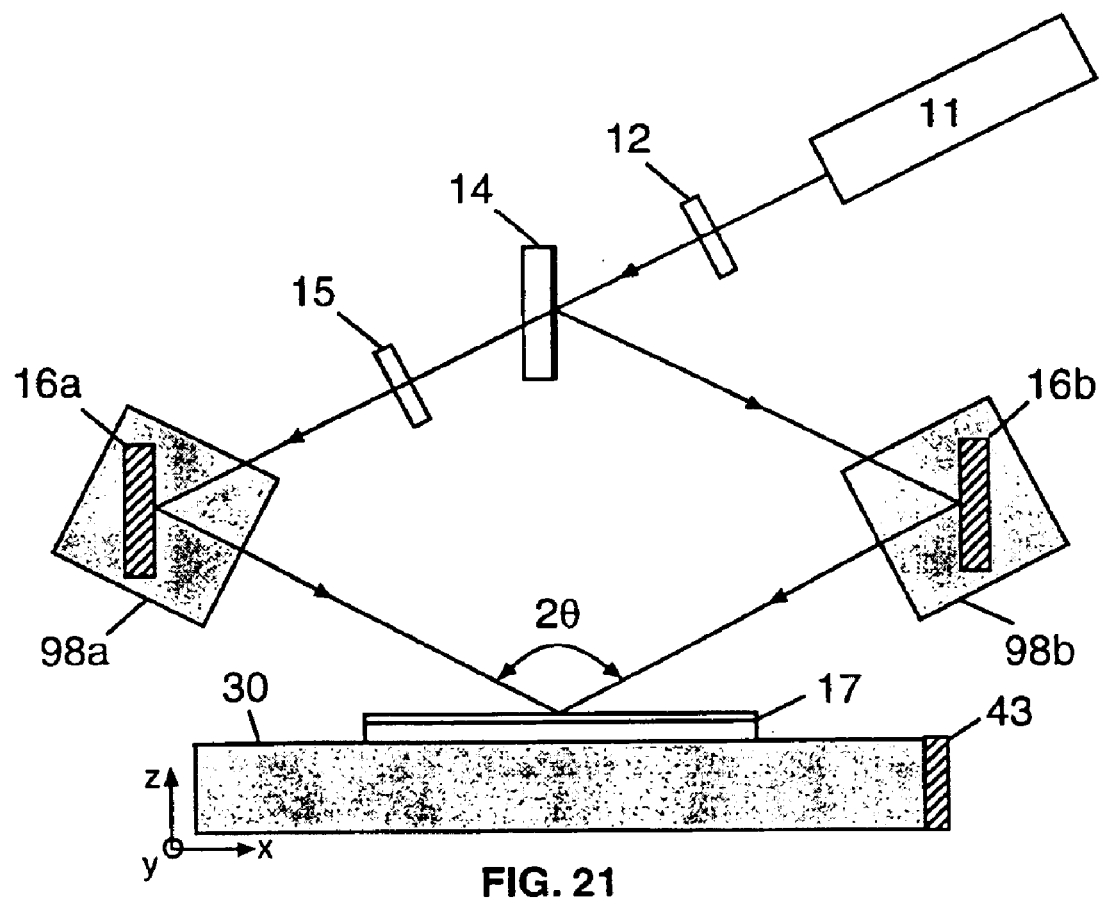
FIG. 21 is a schematic block diagram of an exemplary embodiment of a writing interferometer for patterning variable-period gratings.

With reference to FIG. 21, a writing interferometer design is depicted which allows continuous control of grating period. Beam from laser 11 transmits through shutter/attenuator 12 and is split by beamsplitter 14. Left and right beams are directed by mirrors 16 to substrate 17, where they overlap and interfere. Mirrors 16 are attached to motorized stages 98, which allow translation and rotation in the x-z plane. Stages 98 can be continuously adjusted to overlap beams on substrate 17 within a range of intersection angles $2\theta$, corresponding to a range of grating periods.

Figure 22A:
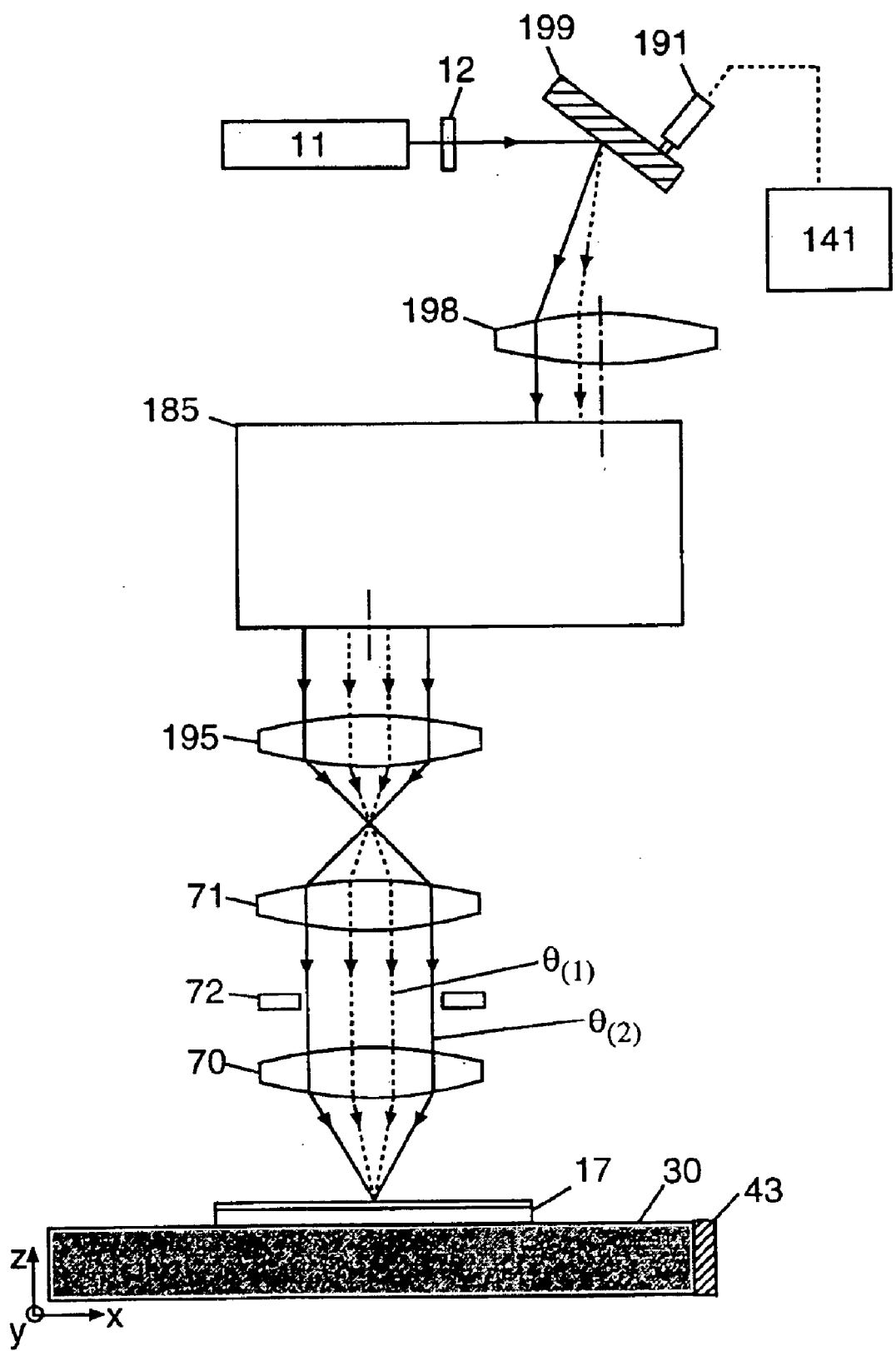
FIG. 22a is a schematic block diagram of an exemplary embodiment of a writing interferometer for patterning variable-period gratings that utilizes an actuator-controlled mirror for selecting the interferometer-arm 2θ angle, and thus the grating period, a mirror beamsplitter for forming the opposing arm of the interferometer, and an objective lens for projecting the grating image onto the substrate.

Although the interferometer depicted in FIG. 21 meets the minimum requirements for writing chirped gratings, it suffers from two major problems: (1) only a limited range of angles $2\theta$ are accessible, and (2) period changes are slow and tedious to effect due to the required six degrees of freedom of stages 98 and the synchronization required to simultaneously overlap and control beams at substrate 17 while achieving a desired period and phase. An improved interferometer design, which avoids these difficulties, is depicted in FIG. 22. With reference to FIG. 22a, beam from laser 11 travels through shutter/attenuator 12 and reflects from scanning mirror 199. Mirror 199 can be rotated about the y-axis under control of actuator 191 and actuator controller 141. Actuator 191 could be any type of electromechanical device that can be used to rotate a mirror, such as a DC or stepper motor, piezoelectric, electrostrictive, magnetostrictive, or galvanometer actuator. In this design, the rotation of mirror 199 controls the beam $2\theta$ angle at the image on substrate 17, thus enabling simple and rapid period changes. In particular, for the purpose of clarity, in the figure are shown two possible beam paths through the interferometer among the many paths available, corresponding to two different grating periods: one case depicted by a dashed line corresponding to azimuthal angle $\theta_{(1)}$, and the other by a solid line corresponding to azimuthal angle $\theta_{(2)}$. Following now from scanning mirror 199, the beam is focussed by lens 198 onto mirror beamsplitter 185, which is described in detail below and depicted in FIG. 22d. The mirror beamsplitter has the useful property that beams impingent on the optic and offset from the input optic axis, as shown in the figure (dot-dashed line), appear at the output along with a corresponding mirror beam of the same amplitude on the opposite side of the exit optic axis, as shown. The beams then travel to lens 195, forming an image. An objective lens, comprising lens 71, aperture 72, and lens 70, reforms the grating image onto substrate 17.

Figure 22B:
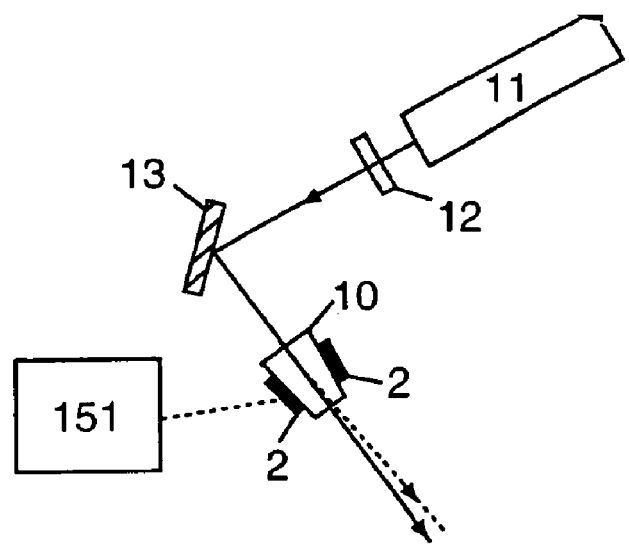
FIG. 22b is a schematic block diagram of an alternative 2θ-angle selector utilizing an electro-optic beam deflector.

Alternative means of deflecting beam from laser 11, rather than using actuated scanning mirror 199, are now described. With reference to FIG. 22b, beam from laser 11 transmits through shutter/attenuator 12 and reflects from optional turning mirror 13, impinging on electro-optic deflector (EOD) 10, controlled by EOD controller 151, which deflects the transmitted beam through a range of angles. The EOD is a well-known electro-optic device that incorporates a specially designed crystal 10 to which are attached metal plates 2. Voltage from controller 151 applied to plates 2 creates electric fields in the crystal, which cause a refractive index gradient and thus angular deflection of the incident beam (see A. Yarif and P. Yey, *Optical Waves in Crystals*, Wiley-Interscience, 1984). Beam angular deflection is proportional to applied voltage to a good approximation. In the figure an undeflected (zero voltage) beam is indicated by a solid line, and a typical deflected beam by a dashed line.

Figure 22C:
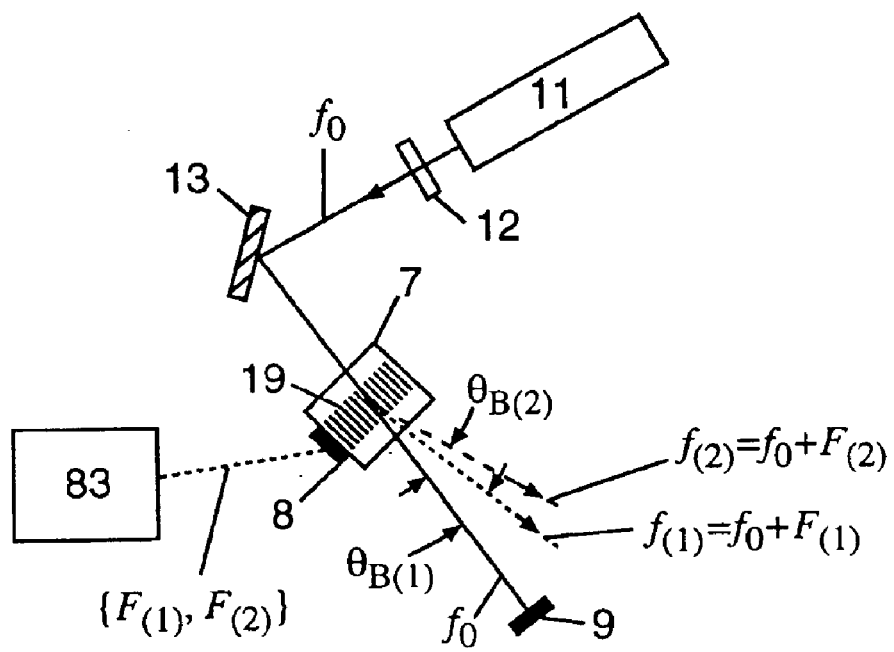
FIG. 22c is a schematic block diagram of an alternative 2θ-angle selector utilizing an acousto-optic beam deflector.

Alternatively, with reference to FIG. 22c, beam from laser 11 of frequency $f_0$ transmits through shutter/attenuator 12 and reflects from optional turning mirror 13, impinging onto acousto-optic deflector (AOD) 7, controlled by AOD controller 83, which deflects the beam through a range of angles. The AOD is a well-known electro-optic device which uses specially designed crystal 7 to which is attached piezoelectric transducer 8 (see A. Yarif and P. Yey, ibid.). Controller 83 sends a set of radio-frequency (RF) signals of frequency {$F_{(i)}$} to transducer 8, which causes sound waves 19 of velocity S and wavelengths $\Lambda_{(i)}=S/F_{(i)}$ to propagate through the crystal, where subscript index i=1,2, ..., N indicates that N distinct sound frequencies may be propagated. (This may be generalized for K planes of incidence, as described later.) FIG. 22c depicts the special case N=2, so that $\Lambda_{(2)}=S/F_{(1)}$ and $N_2)=S/F(_2)$. Light propagating through the crystal at approximate right angles to the sound beam will be diffracted into a zero order beam of frequency $f_0$ and first-order beams of frequency $f_{(1)}f=_0+F_{(1)}$, by the well-known principle of Bragg diffraction. The Bragg condition must hold for efficient diffraction, which stipulates that the angle of incidence of the incoming light beam to the acoustic wavefronts must approximately equal the exit angle of the outgoing first-order diffracted beam to the acoustic wavefronts. The angle of deflection of the first-order beams to the zero-order beam is given by $\theta_{B(i)}=\lambda F_{(i)}/S$. In the figure two deflected beams are depicted. The zero-order beam of frequency $f_0$ is indicated by a solid line, blocked by stop 9, a first-order beam of frequency $f_{(1)}$ generated by RF frequency $F_{(1)}$ by a short dash line, and a first-order beam of frequency $f_{(2)}$ generated by RF frequency $F_{(2)}$ by a long dash line.

In principle, AOD devices used in this manner control image period $p=\lambda/(2 \sin \theta)$ in two ways. First, by the change of the angle $\Delta\theta=\Delta F\lambda/S$ due to changes $\Delta F$ of RF frequency F. Secondly by the change of wavelength $\Delta\lambda$ due to changes in the frequency of the deflected light $\Delta f=\Delta F$ by virtue of the relationship $\lambda=c/f$, where c is the speed of light. From these considerations one obtains the relationships $\Delta p/p=\Delta\lambda/\lambda=\Delta f/f=\Delta F/f$ For example, typical AOD RF frequency shifts $\Delta F$ are 20 MHz, while V light of wavelength $\lambda=351.1$ nm has a frequency $f=c/\lambda\sim 800$ THz, yielding $\Delta p/p\sim 2\times 10^{-8}$. This is an extremely small period variation that can safely be ignored when calculating and controlling image periods during writing. For this reason, the change of wavelength due to frequency changes has not been carried into the equations posed earlier which describe methods of active period control while writing. However, the fact that with AOD optics the different spatial frequencies in the image are due to beams of different temporal frequencies implies that only incoherent imaging applies, as discussed earlier.

Figure 22D:
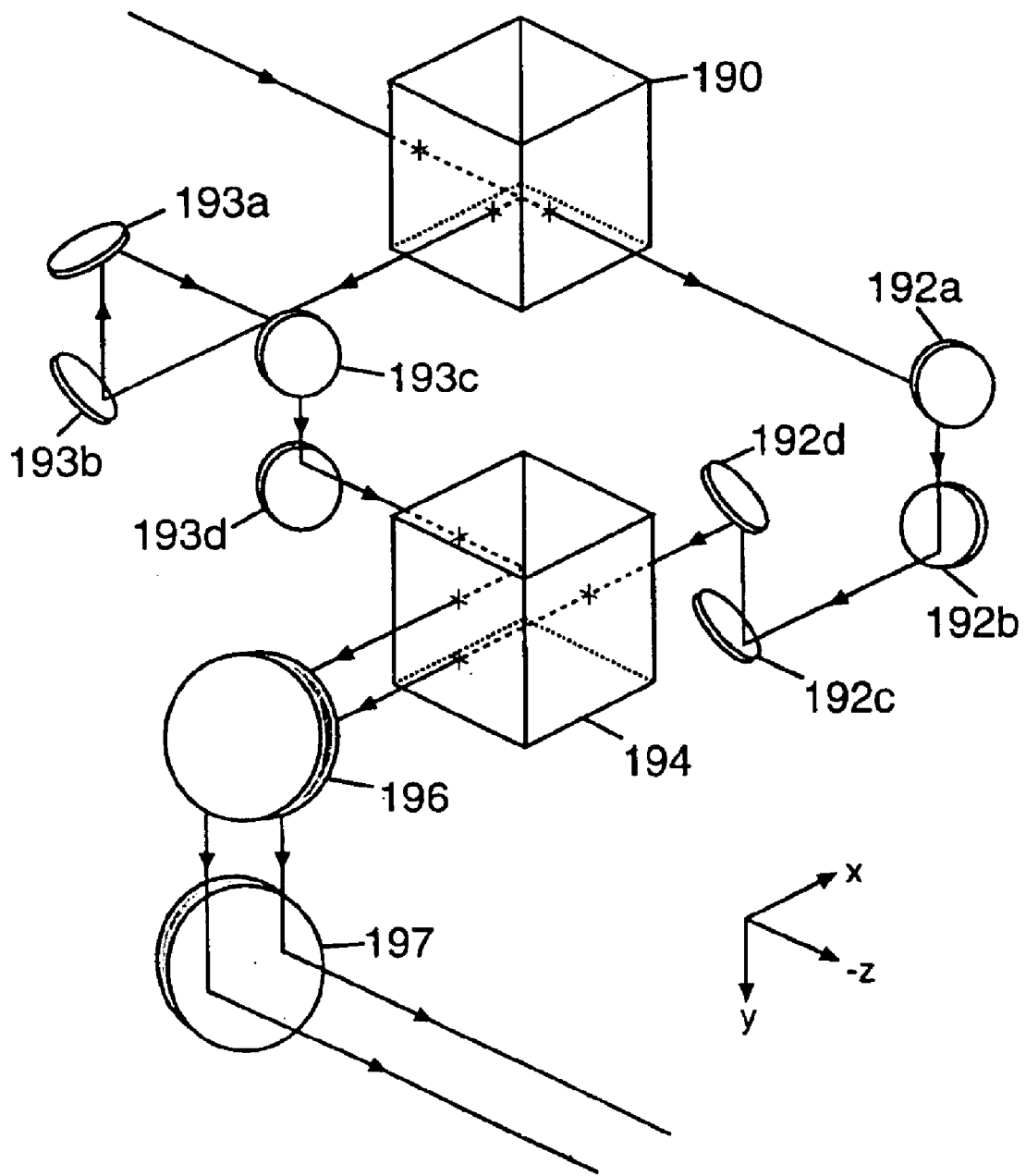
FIG. 22d is a schematic block diagram of an exemplary embodiment of a mirror beamsplitter, which splits incident beams into parallel and mirrored beams.

With reference to FIG. 22d, mirror beamsplitter 185, mentioned previously and referred to in FIG. 22a, is described. The mirror beamsplitter is used to split a beam (or set of beams) into a mirrored parallel pair(s) of beams. It has the property that halves of mirrored beam pairs traveling through the optic have the same pathlength.

For simplicity, a single beam is depicted in the figure travelling in the −z direction and incident on beamsplitter cube 190. "Cube centerlines" are defined which bisect cube 190 with a y-z plane and cube 194 with a x-z plane. Right beam transmitted through cube 190 is reflected through a downward excursion (y direction) in an x-y plane by mirrors 192a–d. Left beam is reflected from cube 190 through an upward excursion (−y direction) in a y-z plane by mirrors 193a–d. Phase difference between left and right beams may be controlled by pushing on any of mirrors 192 or 193 with an actuator. The utility of phase control between the interferometer arms will be demonstrated hereinafter. The left and right beams are combined into parallel non-overlapping beams travelling in the −x direction, and in an x-y plane, by beamsplitter cube 194. The function of the up and down excursions in the counterposing arms is to create a parallel pair of beams travelling in the −x direction, after cube 194, which move away from each other in the ±y-direction (mirror images about cube 194 centerline) as the beam incident on cube 190 moves away from the cube centerline in the ±x-direction in an x-z plane. Optional fold mirrors 196 and 197 transfer the output beams from an x-y plane to an x-z plane, simply for the convenience of referencing drawing 22a.

Figure 23A:
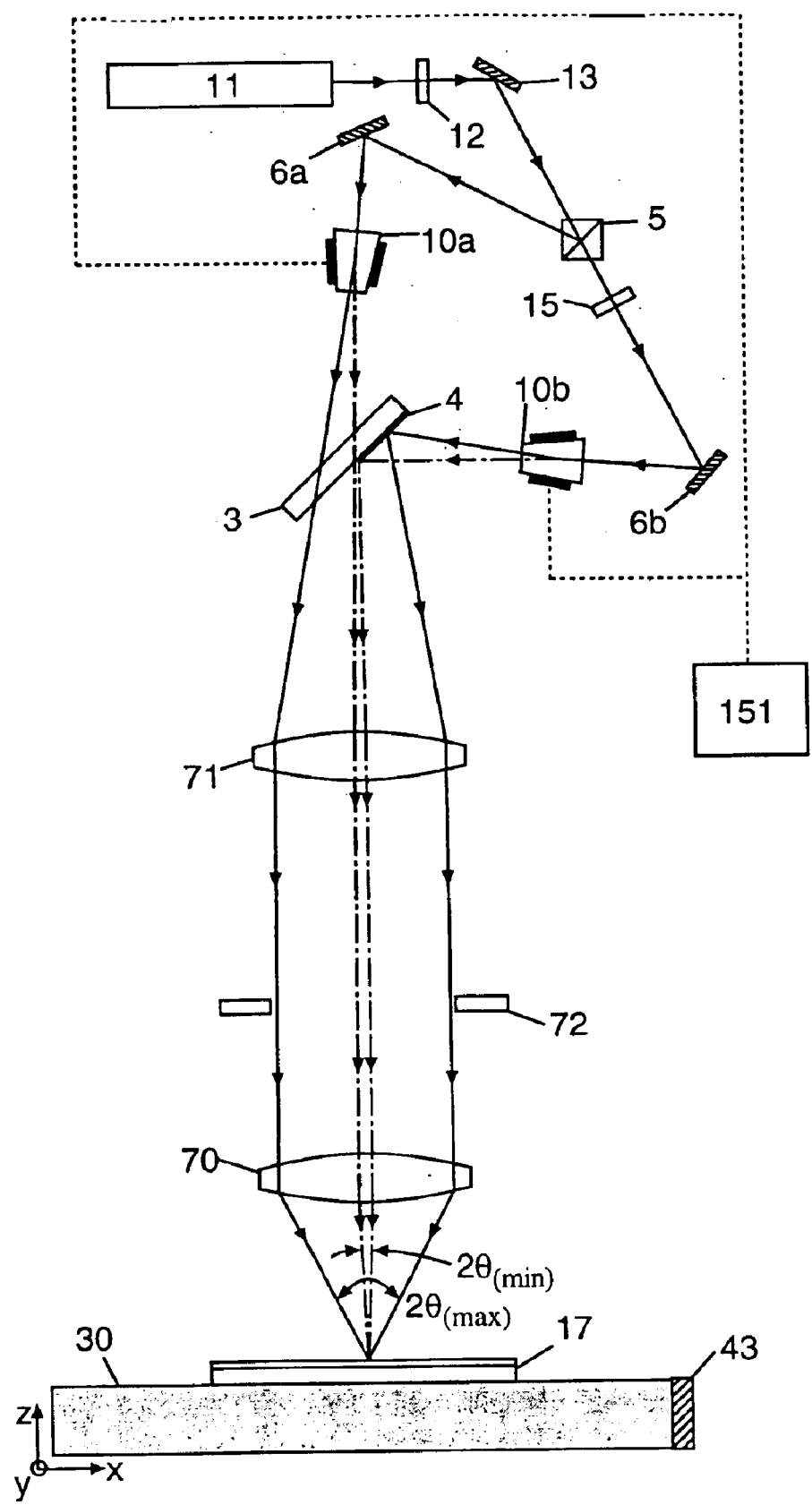
FIG. 23a is a schematic block diagram of an exemplary embodiment of a writing interferometer employing individual electro-optic (EO) beam deflectors for each arm to affect 2θ-angle selection, where both EO deflectors are driven simultaneously by the same controller, and the left and right deflected beams are superimposed by a beamsplitter and imaged onto the substrate by an objective lens.
Figure 23B:
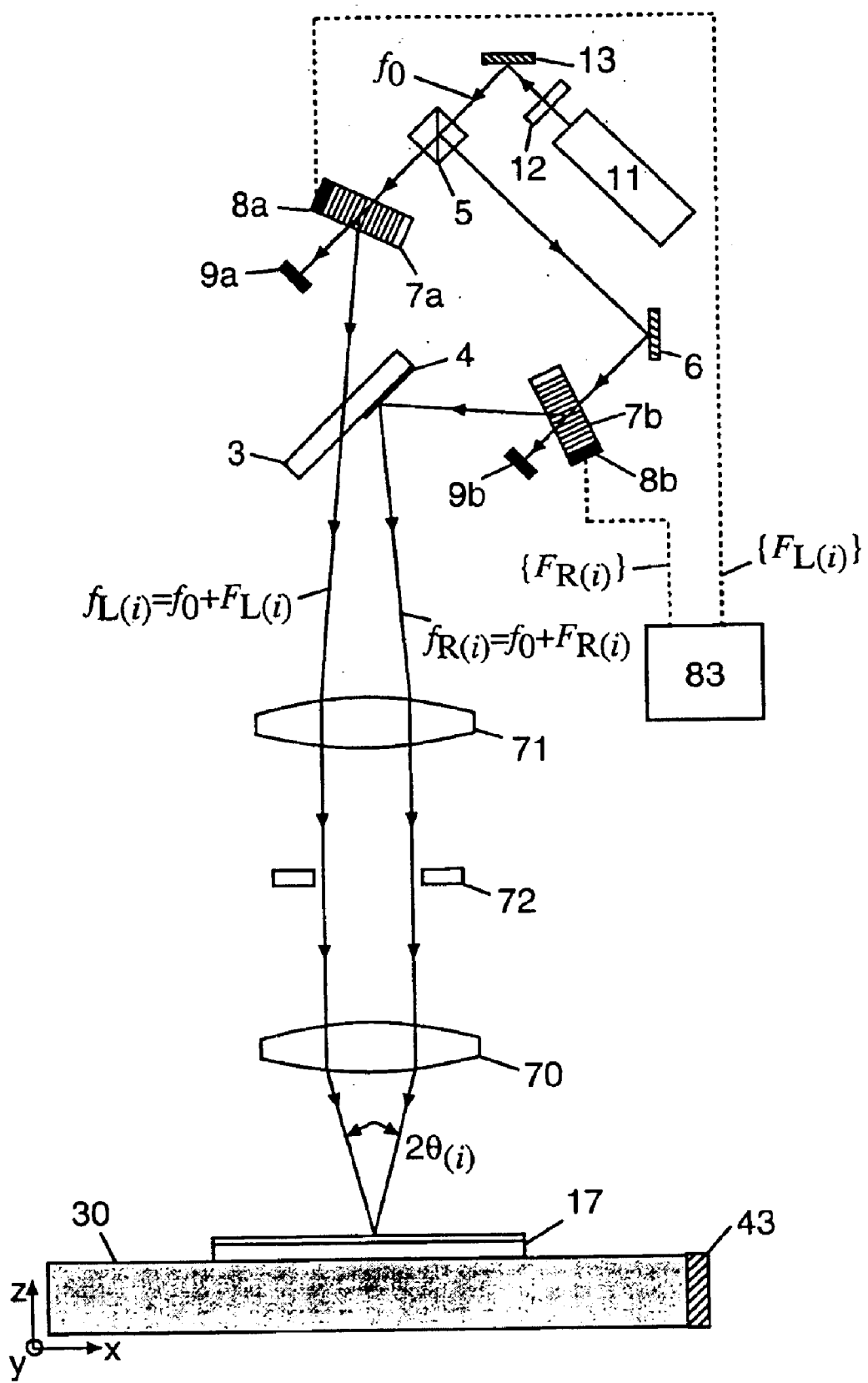
FIG. 23b is a schematic block diagram of an exemplary embodiment of a writing interferometer similar to that depicted in FIG. 23a, but employing acousto-optic (AO) beam deflectors to affect beam angle selection, the AO modulators are driven by the same control signal, which constitutes an ensemble of RF frequencies, each modulator RF driver frequency generates a distinct pair of beams on the substrate, and thus a distinct spatial frequency component in the image, enabling complex image patterning to be achieved.
Figure 23C:
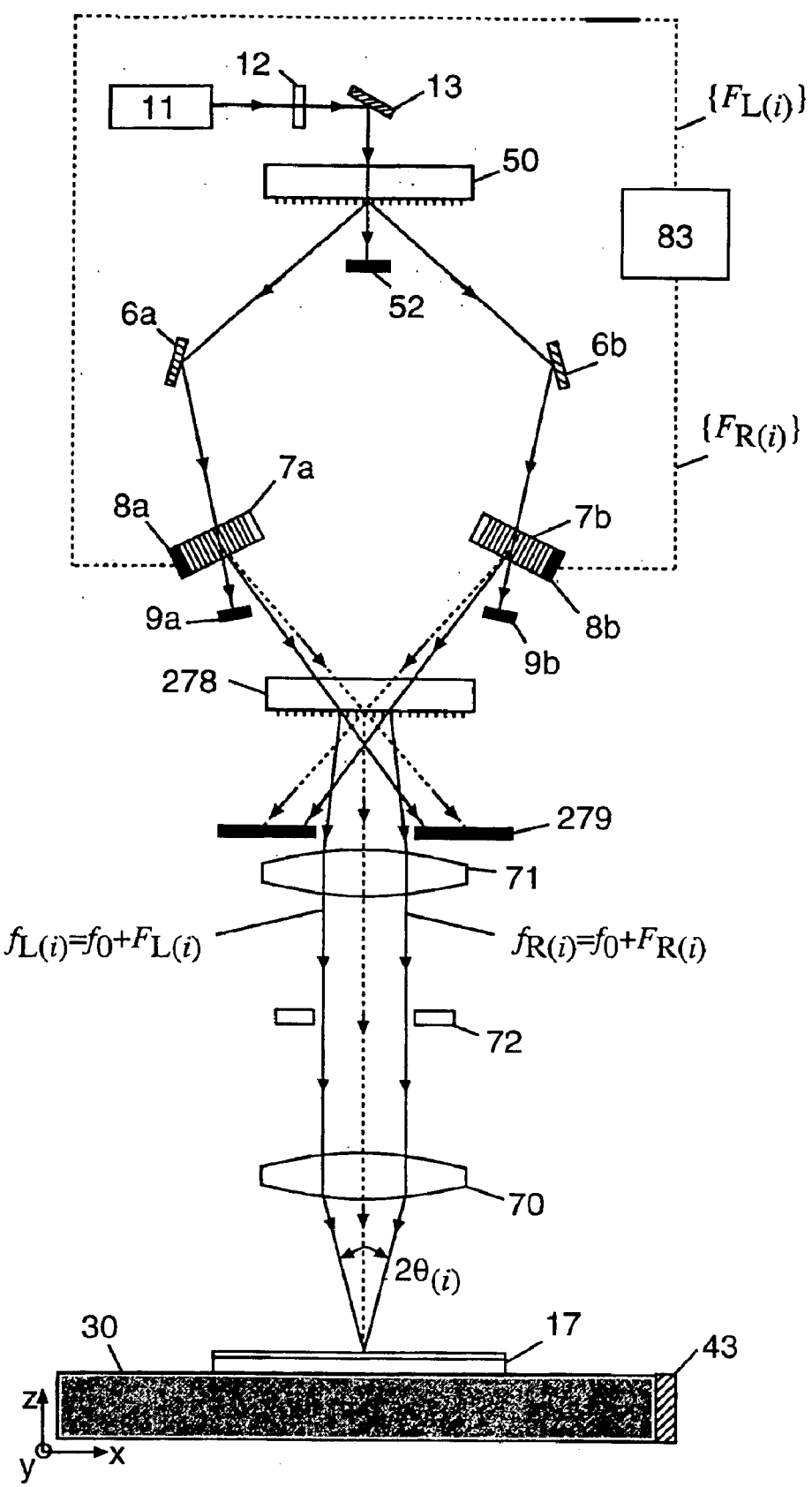
FIG. 23c is a schematic block diagram of an exemplary embodiment of a writing interferometer similar to that depicted in FIG. 23b, but employing a grating to superimpose the left and right diffracted beams.

An alternative writing interferometer design is depicted in FIG. 23. The advantage of this design over the mirror interferometer described previously, and depicted in FIG. 22, is the improved control of the angle, amplitude and phase of the individual interferometer arms, the benefits of which will become clear. With reference to FIG. 23a, beam from laser 11 passes through shutter/attenuator 12 and reflects from optional turning mirror 13 to beamsplitter 5, splitting into left and right beams. Alternatively, cube beamsplitter 5 may be substituted with a flat beamsplitter, or a transmission or reflection grating. Left and right beams reflect from turning mirrors 6 and impinge on electro-optic deflectors (EOD) 10, described previously. Alternatively, beam deflectors 10 may be mechanically actuated mirrors or acousto-optic deflectors, as described previously and depicted in FIG. 22. Phase may be controlled by pushing either mirrors 6 with an actuator. Left and right beams are superimposed into a common diverging path by flat beamsplitter 3, which has been designed with optional reflective surface 4 on the right half. Alternatively, beam superimposer 3 may be a cube beamsplitter. Alternatively it may be shortened such that beams from deflector 10a travel to lens 71 unimpeded, while beams from deflector 10b reflect from The shorted mirror. Alternatively, it may be a reflection or transmission grating as depicted in FIG. 23c and described below. The resulting virtual image is projected onto substrate 17 by the objective lens, comprising lens 71, aperture 72, and lens 70.

The purpose of beamsplitter 3 is to create a virtual grating image from the superposition of the left and right beams. Voltage applied to the EOD by controller 151 effects a range of angles, represented in the figure by a solid line for a beam path corresponding to angle $2\theta_{(max)}$ near the lens NA limit, and by a dotdash line for angle $2\theta_{(min)}$ near zero. Large $2\theta$ angles correspond to the finest periods that may be written, while small $2\theta$ angles correspond to periods that approach the size of the beam. The use of optional reflective coating 4 on beamsplitter 3 improves the efficiency of the system since nearly all light from the right arm may be projected onto substrate 17; however, its use precludes the writing of gratings with periods approaching the size of the beam, due to beam clipping near zero angle.

The writing interferometer depicted in FIG. 23a directs beams to interfere on substrate 17 in a single plane of incidence. Replacing beamsplitter 5 with a transmission or reflection grating or holographic beamsplitter that generates multiple pairs of beams may generate additional planes of incidence. Each beam generated this way is redirected and deflected by a mirror and EO deflector similar to as shown in FIG. 23a, where the members of beam pairs are arranged opposite to each other around the optical axis. The deflected beams are directed to converge and reflect from a multi-faceted prism replacing beamsplitter 3, where the prism has one facet pair for every beam pair. This prism is a generalization of prism 272 seen in FIG. 24c. Beam pairs reflecting from this prism appear to diverge from a common point, similar to as depicted in FIG. 23a.

Substituting AO deflectors for EO deflectors, in the design depicted in FIG. 23a, enables the generation of multiple spatial frequency components in the image. With reference to FIG. 23b, beam from laser 11 of frequency $f_0$ travels through shutter 12, reflects from turning mirror 13, and is split by beamsplitter 5 into left and right beams which are diffracted by AO deflectors 7. Right AOD 7b receives a set of RF signals $\{F_{R(i)}\}$ from controller 83, generating diffracted beam(s) of frequencies $f_{R(i)}=f_0+F_{R(i)}$, and left AOD 7a receives frequencies $\{F_{L(i)}\}$, generating diffracted beam(s) of frequencies $f_{L(i)}=f_0+F_{L(i)}$, where i=1,2, . . . N. Using the principles discussed previously, this allows complete control of the angles $\theta_{(i)}$, amplitudes $\alpha_{(i)}$, and phases $\phi_{(i)}$ of every spatial frequency component in the image.

Note that the design depicted in FIG. 23b constitutes an incoherent imaging system, as discussed previously, since each spatial frequency component, identified by angle $\theta_{(i)}$, is generated by a beam pair with a different temporal frequency. Also note that this design is easily generalized to provide more than one plane of incidence by the use of multiple pairs of acousto-optic modulators corresponding to multiple planes of incidence, where the multiple incident planes are joined by the use of additional beam superimposers similar to beamsplitter 3 but oriented at other rotational angles.

An alternative method for superimposing beams, performing the same functionality as plate beamsplitter 3 in FIGS. 23a, and 23b, is depicted in FIG. 23c. The advantage of this design is higher efficiency without the problem of not being able to approach the largest spatial frequencies due to occultation of reflective coating 4 on beamsplitter 3, as suffered by designs depicted in FIGS. 23a and 23b. Other than the improved beam combiner, this optical system is used in an identical fashion as the system depicted in FIG. 23b. With reference to FIG. 23c, beam from laser 11 passes through shutter/attenuator 12 and reflects from optional turning mirror 13 to transmission grating 50, splitting into left −1-order, right +1-order, and zero-order beams. Zero order is blocked by stop 52. Alternatively, grating 50 may be substituted with a cube or flat beamsplitter, or a reflection grating. Left and right beams reflect from turning mirrors 6 and impinge on acousto-optic deflectors (AOD) 10, described previously. Alternatively, beam deflectors 10 may be mechanically actuated mirrors or electro-optic deflectors, as described previously and depicted in FIG. 22. Diffracted and deflected beams from AOD 7 impinge on transmission grating 278. Alternatively, a reflection grating may be used. In FIG. 23c, the full range of deflection of the beams from AOD 10 is depicted by dashed line rays which are diffract to the optical axis by grating 278, and by solid line rays which diffract to the maximum angle of the system. Grating 278 is designed to have weak zero order diffraction and strong first order diffraction. Furthermore, beams from AOD 7 impinge on grating 278 at a steep angle such that the +1-order is cutoff, resulting in strong −1-order diffraction which travels through beam stop 279 to the objective lens, forming an image on substrate 17 in a manner identical to depictions in FIGS. 23a and 23b. Beam stop 279 is positioned to block all orders except −1-order diffraction from grating 278.

The writing interferometer depicted in FIG. 23c directs beams to interfere on substrate 17 in a single plane of incidence. Replacing grating 50 with a transmission or reflection grating or holographic beamsplitter that generates multiple pairs of beams may generate additional planes of incidence. Each beam generated this way is redirected and deflected by a mirror and AO deflector similar to as shown in FIG. 23c, where the members of beam pairs are arranged opposite to each other around the optical axis. The beams are directed to converge and reflect from a multi-angled grating beamsplitter that replaces grating beamsplitter 278. This multi-angled beamsplitter is composed of multiple superimposed gratings each with a roll angle corresponding to a particular beam pair, in a generalization of grating 278 shown in FIG. 23c. Beam pairs reflecting from this grating appear to diverge from a common point, similar to as depicted in FIG. 23c. Apertures 279 or 72 block undesired higher-order beams.

An alternative interferometer design depicted in FIG. 24a has the advantage of being more compact than the one depicted in FIG. 23. It uses a single AOD of unusual design. Beam from laser 11 of frequency $f_0$ reflects from optional turning mirror 13 and transmits through shutter/attenuator 12, impinging on AOD 79. AOD 79 consists of a single crystal with specially cut facets, to which are bonded piezoelectric transducers 80. RF signals from controller 83 with frequencies $\{F_{R(i)}\}$ applied to right transducer 80a, and frequencies $\{F_{L(i)}\}$ applied to left transducer 80b, launch counter-propagating sound waves 81. The zero-order beam is blocked by stop 52, and left and right diffracted first-order beams are imaged onto substrate 17 by objective lens 70–72.

Figure 24B:
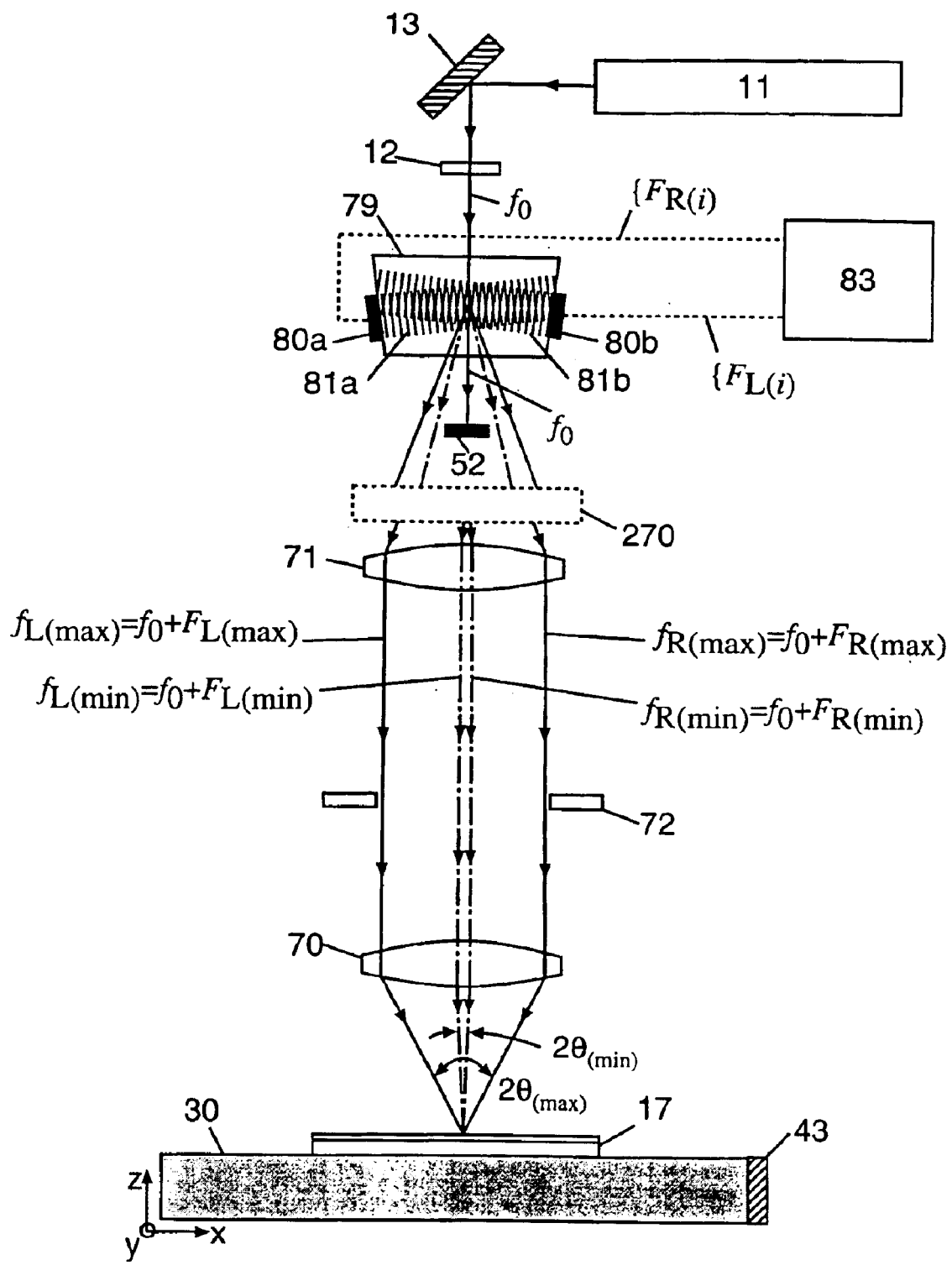
FIG. 24b is a schematic block diagram of an exemplary embodiment of a writing interferometer similar to that depicted in FIG. 24a, but which employs an angular subtraction optic to expand the available range of angles.
Figure 24C:
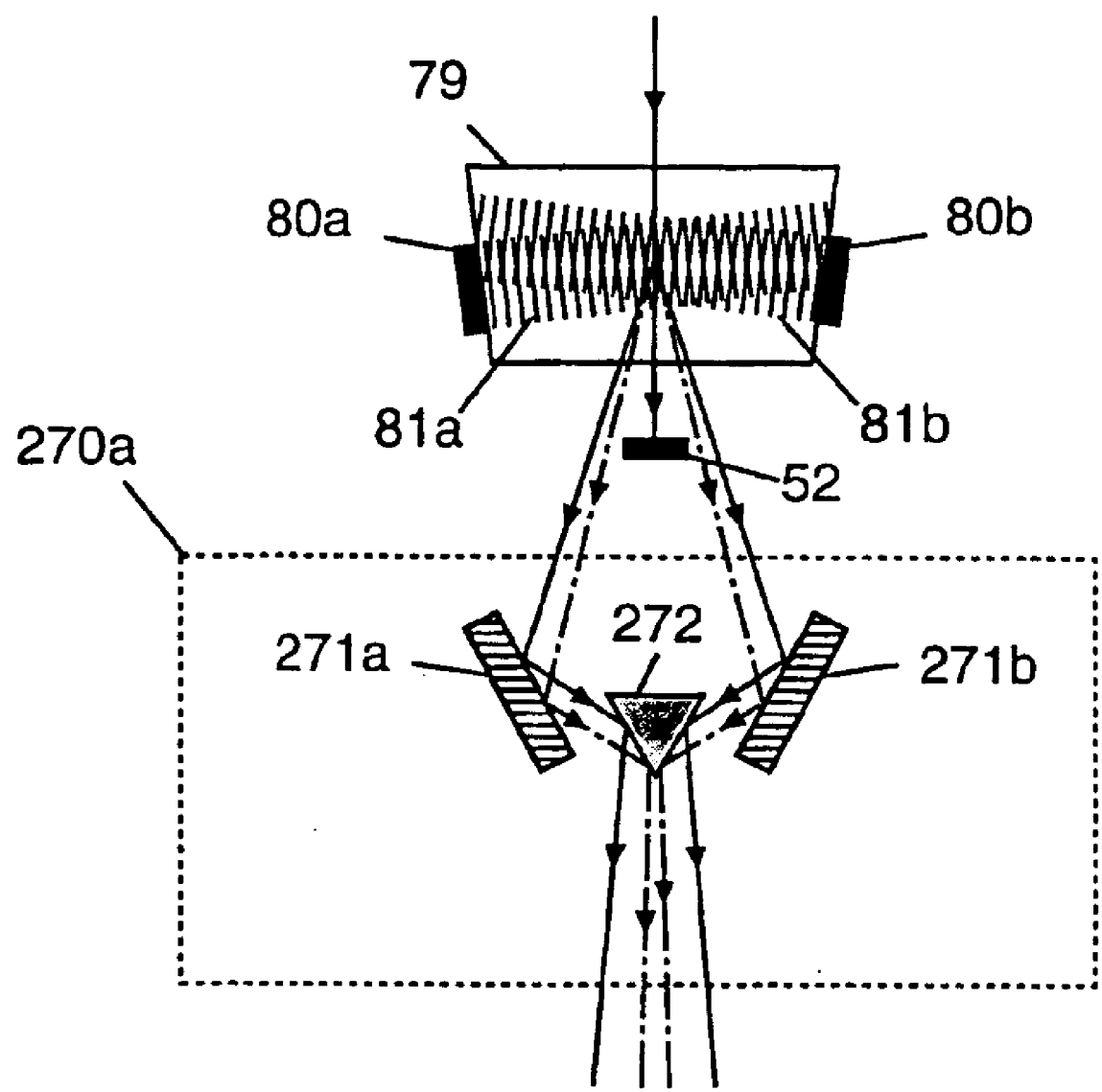
FIG. 24c shows an exemplary prism-based angular subtraction optic.
Figure 24D:
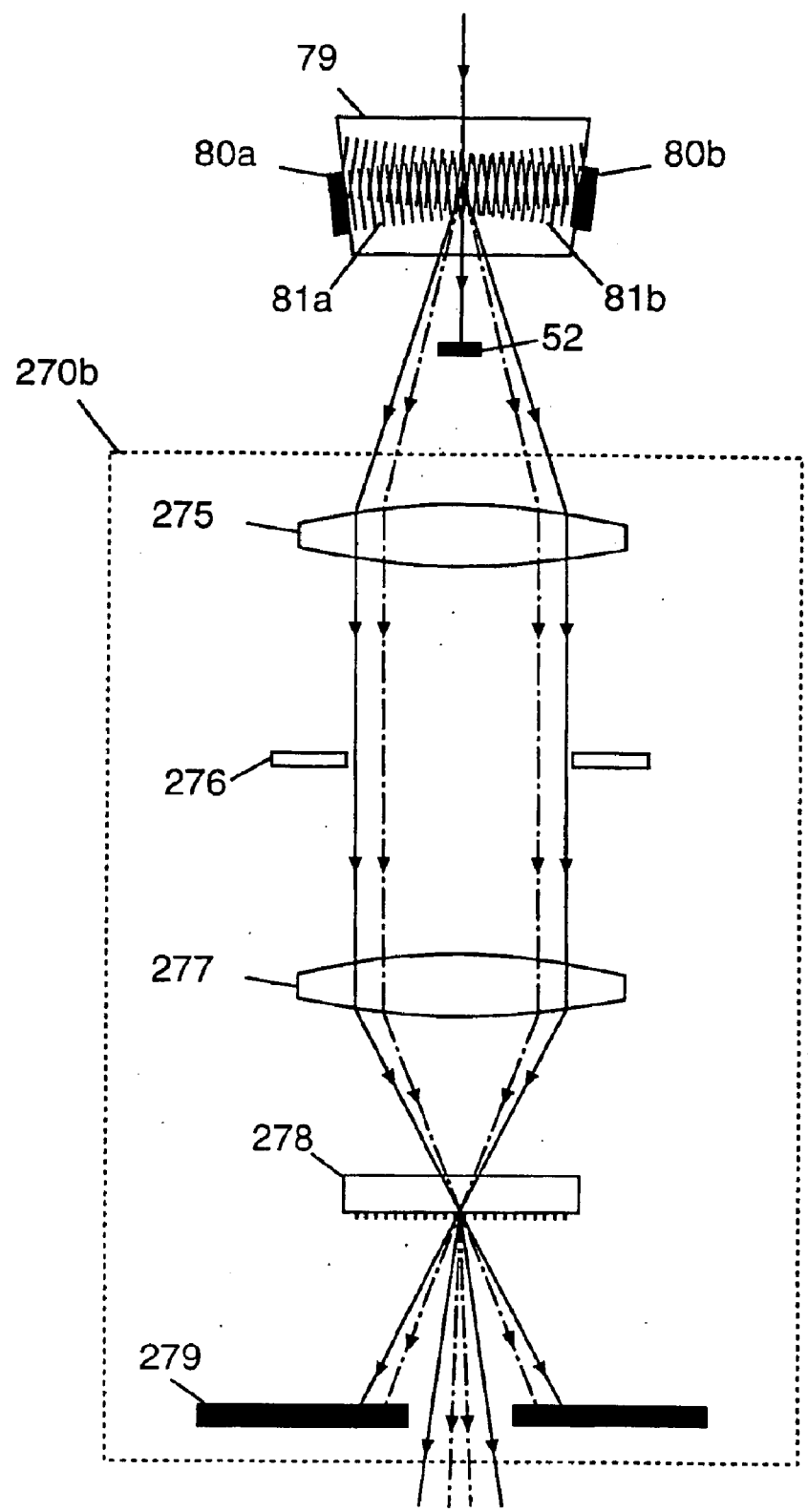
FIG. 24d shows an exemplary grating-based angular subtraction optic.

As described previously, the angle of deflection of a first-order beam from the zero order is given by $\theta_{B(i)}=\lambda F_{(i)}/S$, where $\lambda$ is the optical wavelength, $F_{(i)}$ is the sound frequency, and S is the sound velocity. AOD typically have an angular bandwidth around $\theta_B$ of approximately 10–20% within which efficient diffraction occurs. This corresponds to a range of RF frequencies, diffracted angles, and image periods, depicted in the figure as a solid line and frequency with subscript (min) for beams corresponding to the minimum image period specified by angle $\theta_{(min)}$, and a dash-dot line and frequency with subscript (max) for the maximum period specified by angle $\theta_{(max)}$. The relatively narrow range of periods can be overly restrictive for many applications. An alternative interferometer design is depicted in FIG. 24b that allows a much larger range of angles to be projected onto the substrate. The design is identical to that described previously and depicted in FIG. 24a, except that additional optic 270 has been introduced. Optic 270, called an angular subtractor, expands the range of angles in the interferometer. Two versions are described. The first design, depicted in FIG. 24c, utilizes reflective optics. Beams from AOM 79 are incident on angular subtractor 270a, comprising mirrors 271 and prism 272. Left and right beams from AOM 79 reflect from mirrors 271 and prism 272, as shown, thus reducing the angular spread between left and right beams. Beam-diameter clipping at the apex of prism 272, for beams corresponding to minimum angles of the AOM, limits the angular range of this method. An alternative design, depicted in FIG. 24d, uses diffractive optics to achieve a full range of angles. In this case, beams from AOM 79 are incident on angular subtractor 270b, comprising lens 275, aperture plate 276, lens 277, grating 278, and aperture stop 279. The projection lens, comprising lens 275, aperture 276, and lens 277, projects the image in AOM 79 onto transmission grating 278. Transmission grating 278 and stop 279 work in conjunction to block zero and −1-order diffracted beams from left and right arms, while allowing +1-orders to transmit. The function of grating 278 in FIG. 23d is identical to grating 278 in FIG. 23c. The diffractive angular subtractor has the benefit that the full range of angles may be overlapped, but with some loss of efficiency due to the lost power in the zero and (−1) orders.

In the design depicted in FIG. 24a, an alternative AOD may be readily defined which provides diffraction into multiple planes of incidence. With reference to FIG. 24e, AOM 79 in FIG. 24a is depicted as viewed along the −z direction. Sound wave 81a from left transducer 80a travels counterposed to sound wave 81b from transducer 80b. In FIG. 24f is depicted the same view of an alternative AOD design which used four transducers 80 to produce four counterposed sound waves 81. Light travelling in the −z-direction is diffracted into multiple beams in two planes of incidence crossed at 90 degrees. AO deflectors with even larger numbers of opposed transducers may be defined, to provide multiple planes of incidence. Extraneous diffracted beams may be blocked using a cross or higher-order spatial filter aperture plate similar to plate 72d in FIG. 19g, replacing spatial filter 72 in FIG. 24a. Angular subtraction can be performed by generalizing the optical device shown in FIG. 24c to have multiple sets of mirrors in conjunction with a prism with multiple pairs of reflective faces, where each opposed facet pair is dedicated to a particular plane of incidence. An alternative means for angular subtraction is to replace grating 278 in FIG. 24d with a multi-angled grating beamsplitter. This multi-angled beamsplitter is composed of multiple superimposed gratings each with a roll angle corresponding to a particular beam pair, in a generalization of grating 278 shown in FIG. 23c. Beam pairs reflecting from this grating appear to diverge from a common point, similar to as depicted in FIG. 23c. Apertures 279 or 72 block undesired higher-order beams.

The description of ways beams can be split and recombined to form grating images on the substrate, and methods for electronic control of grating period has been presented. Methods for real-time measurement of image phase will now be provided. As discussed previously and depicted in FIG. 7b, errors in the path of the x-y stage during scanning will cause phase errors to be written into the grating. In addition, disturbances in the optical components or beam paths in the arms of the writing interferometer cause phase shifts between the interferometer arms, corresponding to phase errors in the image and thus in the written grating. Disturbances common to optical systems include vibration, thermal expansion, optical mount drift, and air turbulence. Several interferometer designs, called phase reference interferometers, which measure the image phase continuously in real time will now be described. When used in conjunction with the writing interferometer and stage interferometer, this information may be used to phase-lock the writing interferometer to the substrate using means described hereinafter.

Figure 25:
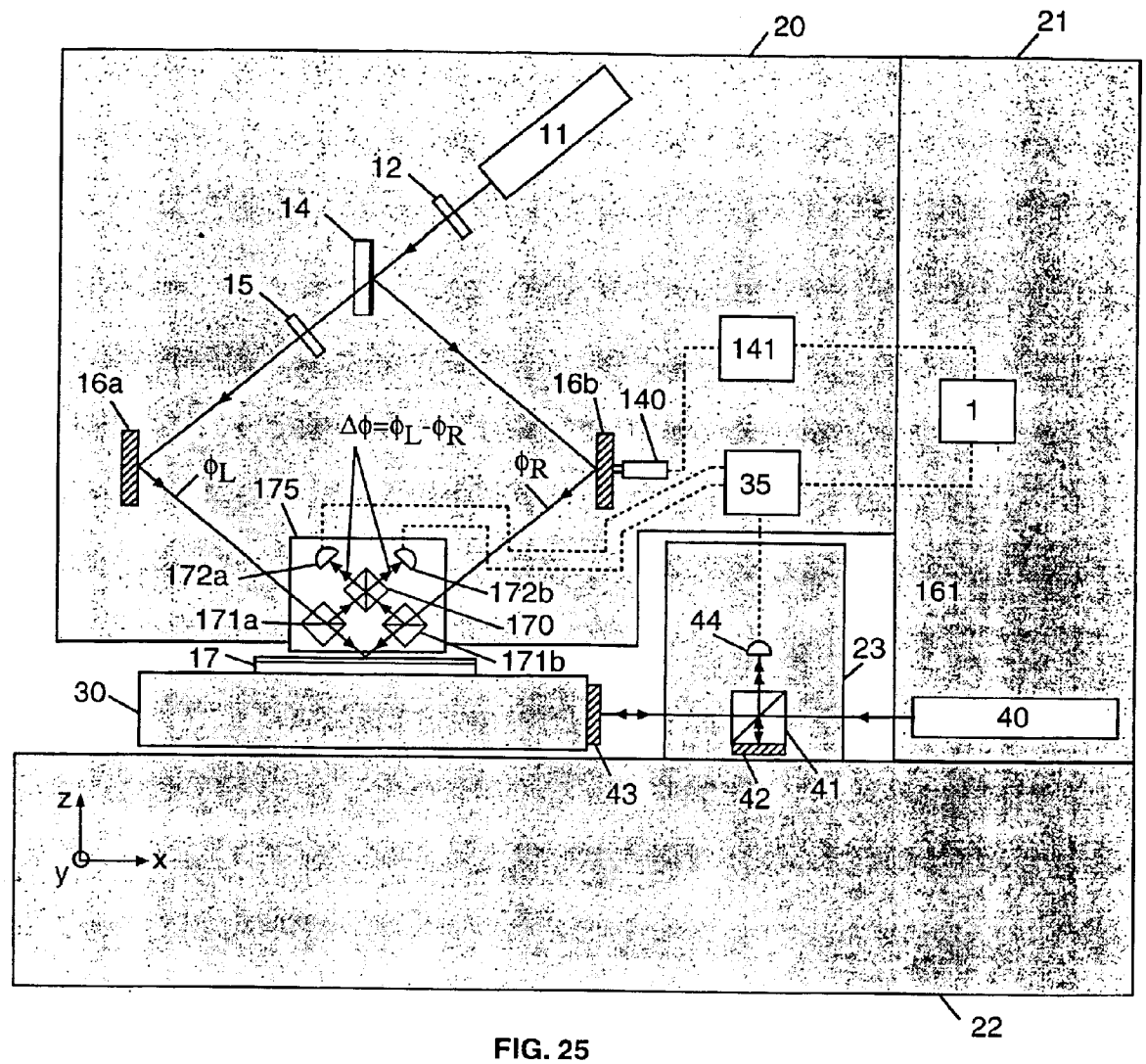
FIG. 25 is a schematic block diagram of an exemplary embodiment of a SBIL system utilizing a phase reference interferometer to measure the phase error between the arms of the writing interferometer and an actuated mirror for manipulating the phase of one of the interferometer arms, thus enabling phase-locking of the grating image to the moving substrate.

The basic principles of the concept, illustrated for the case of a single pair of beams in a single plane of incidence, are depicted in FIG. 25. The writing interferometer, x-y stage, and stage interferometer are similar to those described previously and depicted in FIG. 2a. Components comprising the phase reference interferometer (PRI) are mounted to rigid, stable optical block 175, which in turn is mounted to optical bench 20. The PRI is mounted near the terminus of the left and right arms of the writing interferometer at substrate 17 in order to minimize optical path length errors to the substrate due to air turbulence. Small test portions of left beam, with phase $\phi_L$, and right beam, with phase $\phi_R$, are split by beamsplitters 171, and interfered by beamsplitter 170 onto detectors 172. Signals from detectors 172 are analyzed by interferometer controller 35 to yield the phase difference between the arms of the writing interferometer, $\Delta\phi=\phi_L-\phi_R$.

The measured phase difference between the writing arms, $\Delta\phi$, can be used to phase lock the image to the stage, as follows. Recall from earlier discussion that the relationship which ensures phase locking of image to stage, for a constant-period, non-rotating grating, is $\Delta\phi=\Delta\phi_K=2\pi x_S(t)/p+C$, where $\Delta\phi_K$ is the phase difference between the arms during locking, $x_S(t)$ is the stage x-velocity, and C is an arbitrary constant. Interferometer controller 35 reports arm phase-difference $\Delta\phi$ and stage x-velocity $x_S(t)$ to controller 1. Controller 1 calculates phase-lock error $\delta\phi=\Delta\phi_K-\Delta\phi$ and attempts to control this signal to zero by applying a proportional signal to piezoelectric controller 141, which in turn causes piezoelectric actuator 140 to push on right-arm mirror 16b, thus manipulating the phase of the right arm $\phi_R$ and thus $\Delta\phi$. The control algorithm constitutes a feedback loop controlling phase error $\delta\phi$ zero. Since mirror 16b can be small and light, it can be moved quickly, thus rapidly nulling error $\delta\phi$ associated with stage-path motion and writing interferometer disturbances.

Referring again to FIG. 25, signals appearing on detectors 172 are commonly in the form of sinusoidal voltages. These time-dependant signals are analyzed to determine phase $\phi(t)$ and frequency $f(t)$. These quantities are related by the relations $f(t)=d\phi/dt/2\pi$ and $$\phi(t) = 2\pi \int_{t_0}^{t} f(\tau)d\tau + \phi_0.$$

Using these relations, in the discussion that follows an expression which relates frequencies is easily converted to an expression relating phases, and vice versa.

Figure 26A:
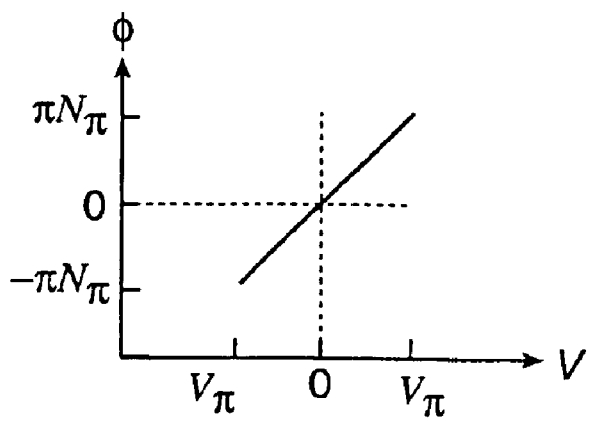
FIG. 26a is a graph demonstrating the limited phase range of actuated mirror and electro-optic phase shifters.

In the following sections alternative and improved schemes for detecting and manipulating image phase will be described, but first a discussion of the limitations of common phase-control actuators is necessary. With reference to FIG. 26a, a typical phase vs. voltage curve is shown for light reflected from a piezoelectrically-controlled (PZT) mirror, as depicted in FIG. 25, or transmitted through a electro-optic phase modulator (EOM), which will be described in more detail hereinafter. These types of devices typically display phase shifts that are closely linear with applied voltage, but with limits on the total phase excursion of $\pm\pi N_\pi$. For example, $N_\pi$ is approximately 100 for a PZT mirror, whereas $N_\pi$ is approximately 2 for an EOM. Note that while the PZT has a much larger phase range it has a much slower response time: less than approximately 1 kHz for the PZT vs. 1 MHz for the EOM. Both these devices are viable for scanning schemes which require corrections for only small excursions of phase error about $\phi=0$, but careful attention must be paid to centering the zero-phase point of the device around the expected range of disturbances, and to the bandwidth and phase range considerations.

Figure 9:
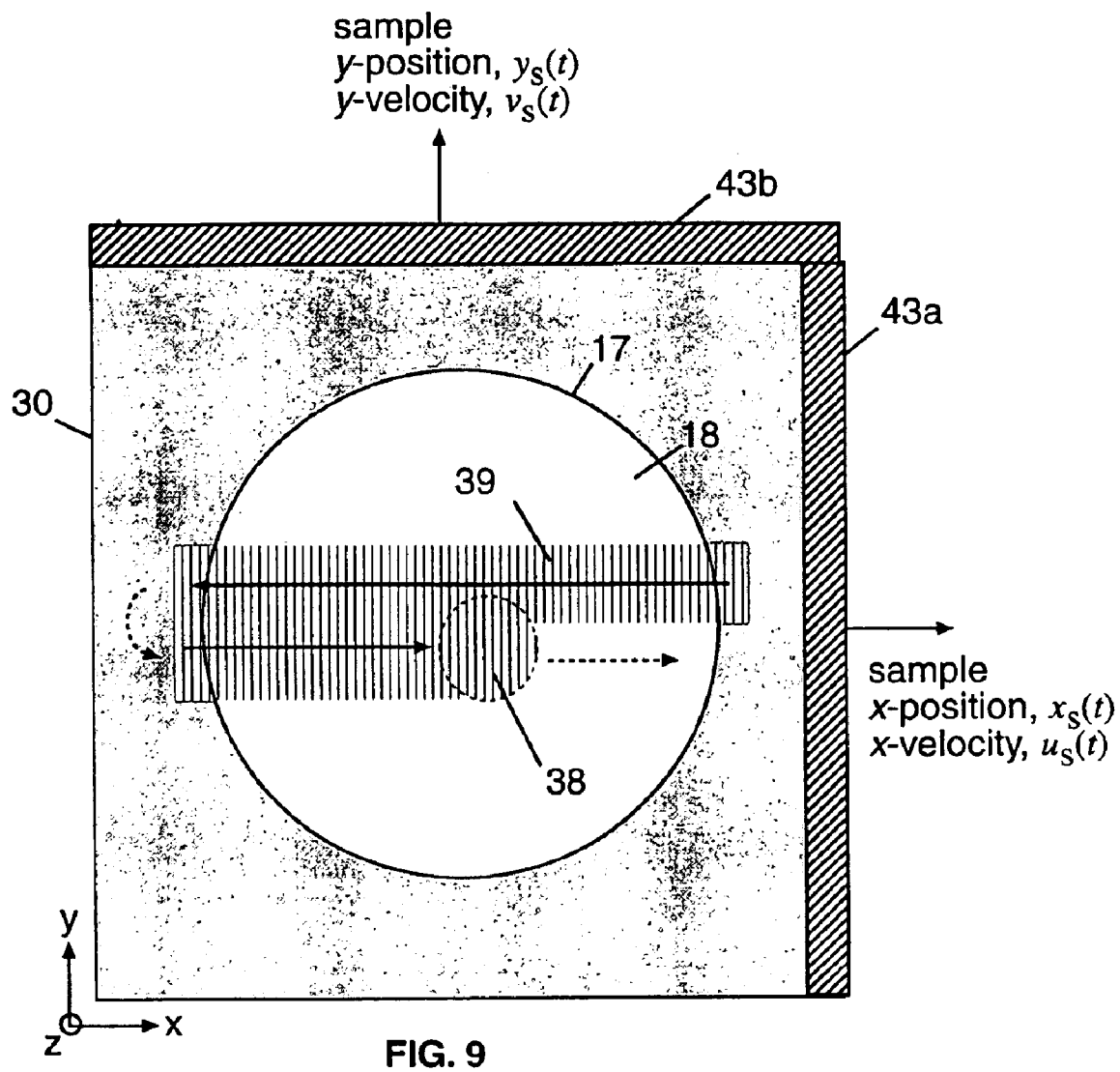
FIG. 9 shows an alternative scanning method to that depicted in FIG. 5a utilizing Doppler-shifted beams to scan the substrate in a boustrophedonic manner, where the direction of motion is perpendicular to the fringe direction.
Figure 26B:
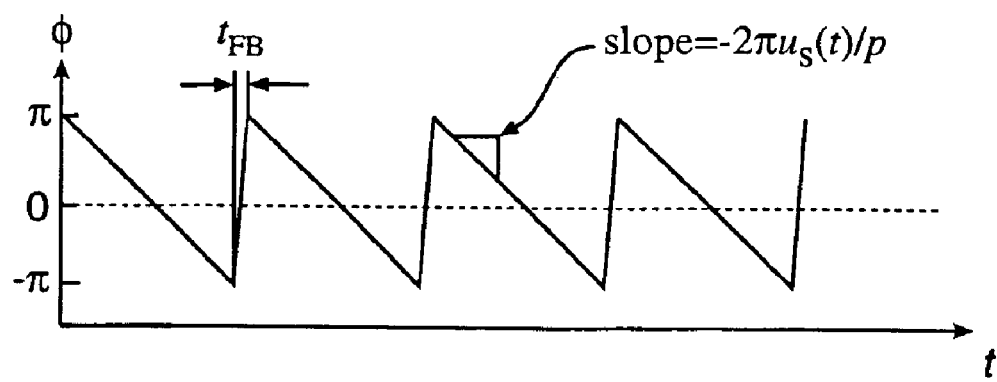
FIG. 26b is a graph demonstrating the use of flyback to achieve semi-continuous phase over phase ranges exceeding the capability of a limited phase-shifting optic.
Figure 26C:
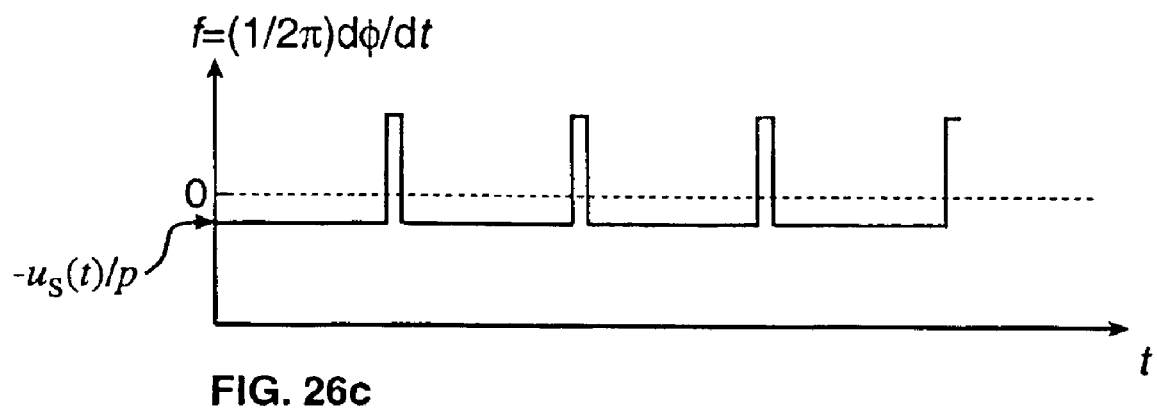
FIG. 26c is a graph demonstrating the use of flyback to achieve sustained frequency shifts with a limited phase-shift optic.

Cross-scanning (Doppler) schemes, as depicted in FIG. 9, require continuous, rapid, and unbounded changes of phase. The phase limit of EOM and PZT devices can be circumvented by using a flyback scheme, as follows. With reference to FIG. 26b, a phase function is depicted which decreases with time in response to a nearly constant stage x-velocity $u_S(t)$. At $\phi=\pi$ boundaries, the voltage is rapidly pulled from $+V_\pi$ to $-V_\pi$, which corresponds to a phase change of $2\pi$, and thus an invariant phase. The device requires a finite flyback time, $t_{FB}$, to reset, which is longer for the PZT than the EOM. At slow scanning speeds the flyback time is a small fraction of the time required to scan from $-\pi$ to $+\pi$, with the effect that the flyback delay introduces a negligible background dose to the grating image. At faster scanning speeds the flyback time consumes a larger fraction of the $-\pi$ to $+\pi$ scan time, and may lead to unacceptable background doses. With reference to FIG. 26c, the frequency of the phase device $f=(½\pi)d\phi/dt$ is depicted. Note the small time intervals with positive frequency, corresponding to the flyback time, where fringes are not locked.

An alternative method of effecting frequency shift is with an acousto-optic modulator, described previously and depicted in FIG. 22c, which can provide a sustained frequency shift without requiring flyback.

Figure 27A:
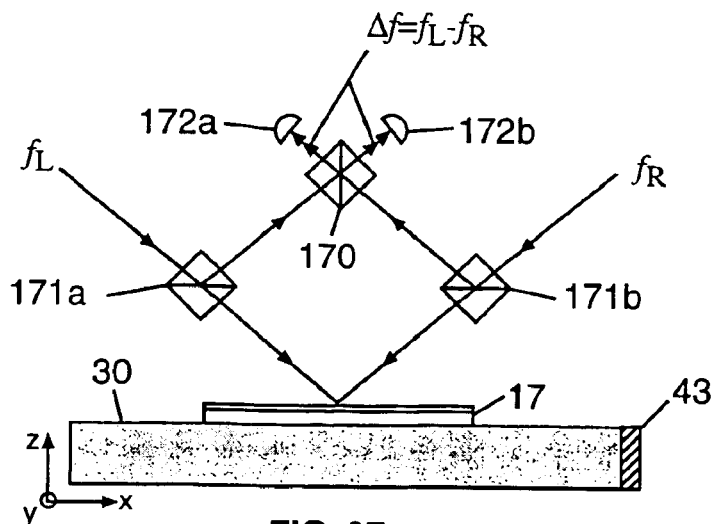
FIG. 27a is a schematic block diagram of an exemplary embodiment of a homodyne phase reference interferometer (PRI) of identical design as depicted in FIG. 25.

Now several alternative designs of phase reference interferometers and means to measure writing-interferometer arms frequency difference, and thus image fringe frequency, are described. In FIG. 27a are depicted the key components of a homodyne phase-reference interferometer already described and depicted in FIG. 25. (While this design is not strictly limited to measuring phase differences between beams of the same frequency, it is distinguished from the heterodyne technique, described below, where a separate Doppler-shifted beam in mixed with the test beams.) Interference of left and right test beams on detectors 172 yields the frequency difference between the arms $\Delta f = f_L - f_R$. Depending of the direction of scanning, frequency difference $\Delta f$ may be very small (e.g., during parallel scanning, as depicted in FIG. 5), or large (e.g., during Doppler scanning, as depicted in FIG. 9). For the case of $\Delta f$ small, the well-known difficulties of accurately measuring a slowly varying signal apply. For example, any variations in beam intensity or detector efficiency may appear to be fringe shifts and lead to errors.

These limitations may be avoided by using an improved heterodyne phase-reference interferometer depicted in FIG. 27. The idea is to mix light of frequency $f_H = f_0 + F_H$ with test portions of both left and right beams, where $f_0$ is the fundamental light frequency as emitted by laser 11, typically 500–1000 THz, and $F_H$ is a heterodyne frequency, typically 1–20 MHz. Since electronic detectors cannot respond to the fundamental frequency $f_0$, only the difference frequencies are measured, effectively modulating the information in the arms at the heterodyne frequency that can be accurately measured using well known methods. The heterodyne technique yields accurate frequency difference measurements regardless of the stage scanning speed or method.

Figure 27B:
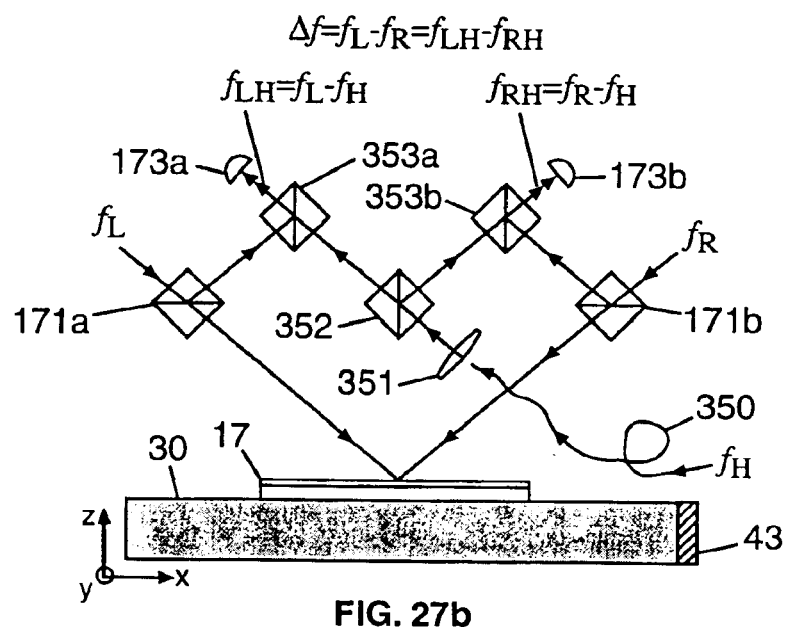
FIG. 27b is a schematic block diagram of an exemplary embodiment of a heterodyne PRI, in which Doppler-shifted light is delivered by the optical fiber to the PRI and mixed individually with the left and right interferometer arms, and signals representing heterodyne versions of the left and right arms are subtracted electronically to yield the writing interferometer phase difference.

With reference to FIG. 27b, left and right beams from the writing interferometer are intercepted by beamsplitters 171, which deflect small test portions to beamcombiners 353. Optical fiber 350 delivers heterodyne beam of frequency $f_H$, generated as described below, to collimating lens 351, which creates a free space beam. Beamsplitter 352 splits the heterodyne beam into left and right beams. Left recombiner 353a mixes portion of left writing-interferometer beam of frequency $f_L$ with left heterodyne beam of frequency $f_H$, yielding left heterodyne difference frequency signal $f_{LH} = f_L - f_H$ on left detector 173a. Similarly, right detector 173b measures right heterodyne difference frequency signal $f_{RH} = f_R - f_H$. Controller 35 subtracts electronic signals $f_{LH}$ and $f_{RH}$ to obtain the frequency difference between left and right arms $\Delta f = f_L - f_R = f_{LH} - f_{RH}$.

Figure 27C:
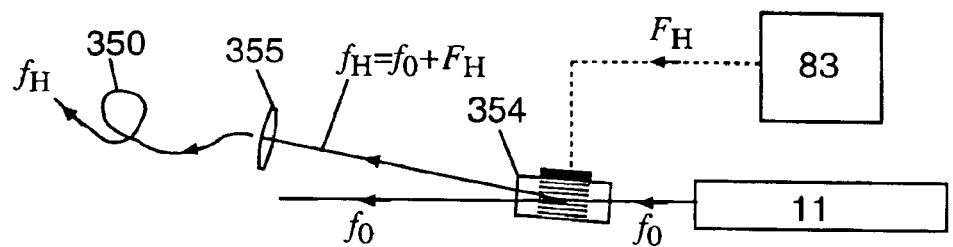
FIG. 27c is a diagram showing a method employing an AO modulator for splitting a weak Doppler-shifted heterodyne beam from the main writing interferometer beam, the heterodyne beam is inserted into an optical fiber for delivery to the heterodyne PRI, while the main beam proceeds to the writing interferometer.

With reference to FIG. 27c, a preferred method for generating the heterodyne beam in fiber 350 is depicted. Beam from laser 11 of frequency $f_0$ impinges on acousto-optic modulator (AOM) 354. The AOM is driven by controller 83 with RF frequency $F_H$, resulting in a zero-order beam of frequency $f_0$ and diffracted beam of frequency $f_H = f_0 + F_H$. Lens 355 focuses the diffracted beam onto fiber 350, which delivers signal to the PRI.

Figure 28:
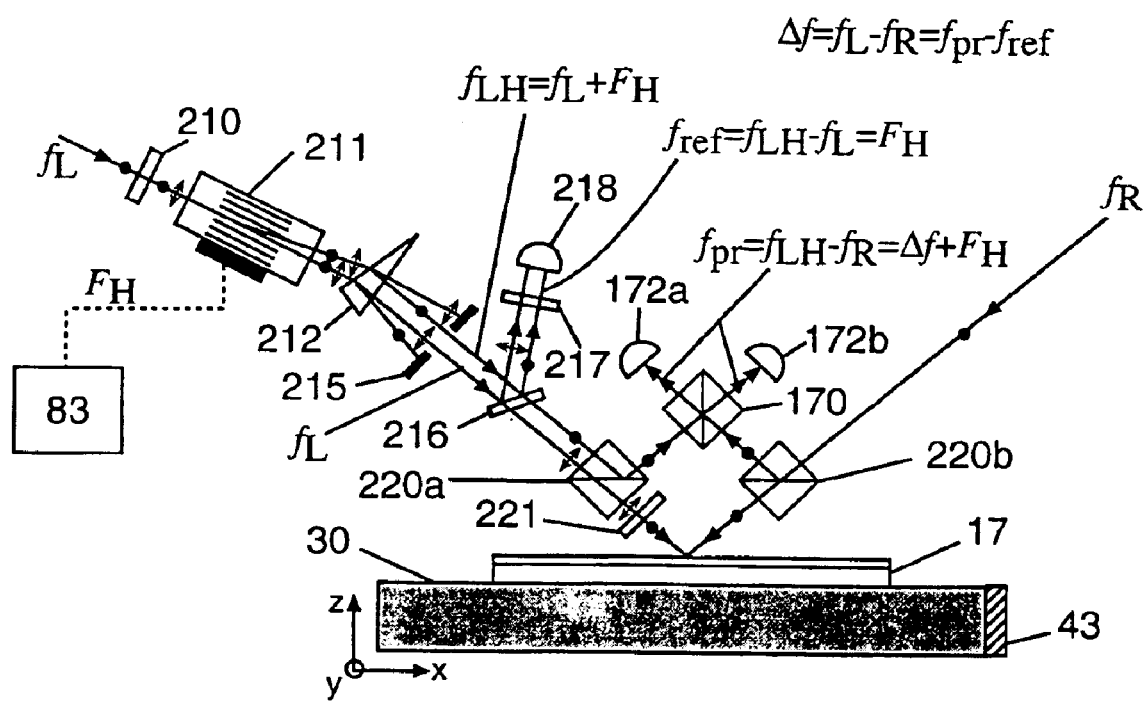
FIG. 28 is a schematic block diagram of an exemplary embodiment of a heterodyne PRI using a method that avoids the use of a separate heterodyne beam by employing an in-line AO modulator and birefringent crystal.

An alternative PRI is depicted in FIG. 28, which avoids the need for fiber optics and an external source of heterodyne light. In the figure, s-polarized beams (E-vector normal to paper plane) are indicated by a dot, and p-polarized beams (E-vector parallel to paper plane) by a double-headed arrow. Left beam of frequency $f_L$ is incident on half-wave plate 210, which rotates beam polarization into 45-degree p and s portions. The beam then impinges on AOM 211, driven by AOM controller 83 at RF frequency $F_H$. The AOM splits beam into zero-order beam of frequency $f_L$ and diffracted beam of frequency $f_{LH} = f_L + F_H$. Specially cut birefringent prism 212 collimates beams into s-polarized beam of frequency $f_{LH} = f_L + F_H$, and p-polarized beam of frequency $f_L$. Aperture 215 blocks extraneous s-polarized zero-order and p-polarized diffracted beams. Beamsplitter 216 deflects test portion of beams which are then mixed and interfered by 45-degree polarizer 217 onto detector 218, which detects reference signal $f_{ref} = f_{LH} - f_L = F_H$. Straight-through beam from beamsplitter 216 proceeds to polarizing beamsplitter 220a, which allows p-polarized main beam to travel straight through to substrate 17, while deflecting s-polarized test beam to combiner 170. The p-polarized main beam is converted to s-polarization by half-wave plate 221, impinging on substrate 17. Meanwhile, s-polarized right beam of frequency $f_R$ is split by beamsplitter 220b into main portion, which proceeds to substrate 17 to overlap and interfere with left beam, and test portion, which proceeds to combiner 170. The combiner interferes left and right test beams on detectors 172, which measured signal $f_{pr} = f_{LH} - f_R = \Delta f + F_H$. Controller 35 subtracts signals $f_{pr}$ and $f_{ref}$ to obtain $\Delta f = f_L - f_R = f_{pr} - f_{ref}$.

Figure 29A:
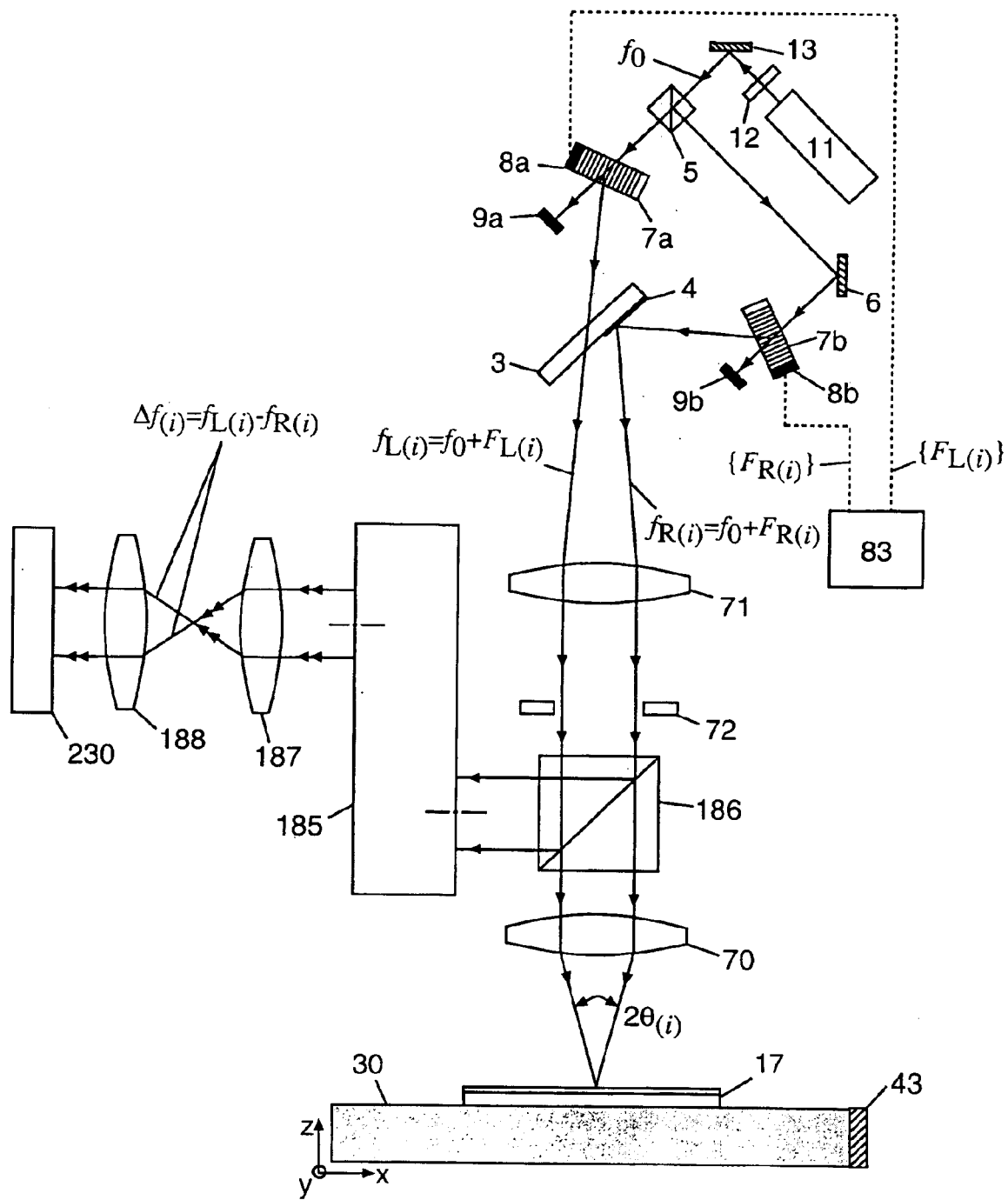
FIG. 29a is a schematic block diagram of an exemplary embodiment of a writing interferometer utilizing a homodyne phase-reference interferometer with a mirror beamsplitter to interfere left and right writing interferometer arms with each other on an imaging detector.

A PRI can also be used with writing interferometers employing an objective lens, such as depicted in FIG. 23. With reference to FIG. 29a, a homodyne PRI is depicted. The writing interferometer is identical to that in FIG. 23, except that pickoff beamsplitter 186 has been inserted in the objective lens to split small beam test portions which impinge on mirror interferometer 185, described previously and depicted in FIG. 22d. Mirror interferometer 185 causes left input beam of frequency $f_{L(i)}$ to interfere with right input beam of frequency $f_{R(i)}$, and vice versa, creating output beams of frequency difference $\Delta f_{(i)} = f_{L(i)} - f_{R(i)}$. Output beams are imaged by objective lens, comprising lenses 187 and 188, onto position-sensitive detector 230, such as a linear diode array. Each position on the detector corresponds to a different spatial frequency component in the image, allowing simultaneous real-time measurement of the amplitude and relative phase of each component.

Figure 29B:
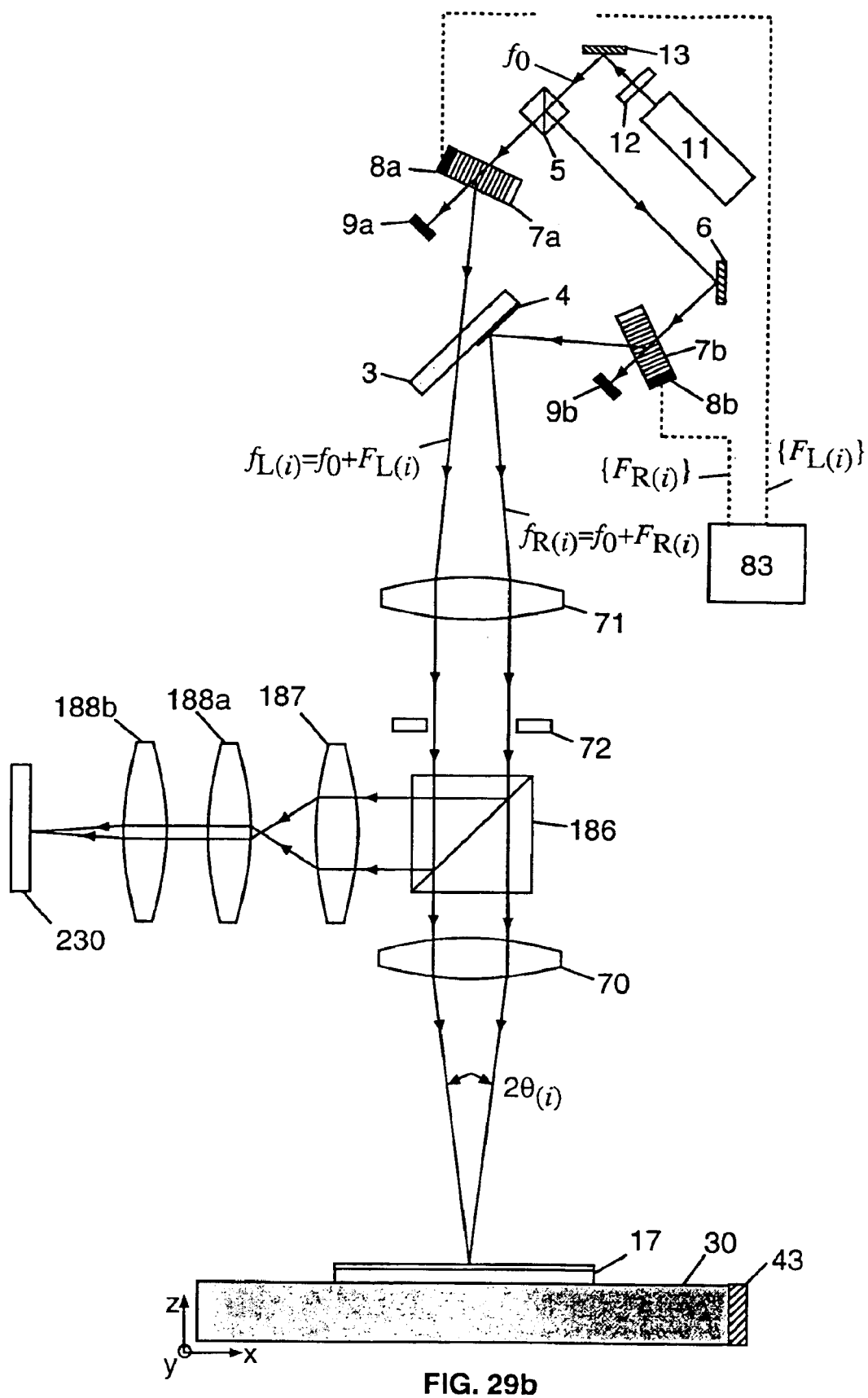
FIG. 29b is a schematic block diagram of an exemplary embodiment of a writing interferometer utilizing a homodyne phase-reference interferometer that forms a magnified image on an imaging detector.

With reference to FIG. 29b, an alternative homodyne PRI is depicted. The writing interferometer is identical to that in FIG. 29a, except that mirror interferometer 185 has been removed. Test beams split from main writing beams by beamsplitter 186 are imaged onto imaging detector 230, such as a CCD array, by objective lens 187 and 188. Objective lens 187 and 188 forms a magnified virtual image of image on substrate 17, which can then be analyzed to determine image period, phase, and fringe rotation.

Figure 30:
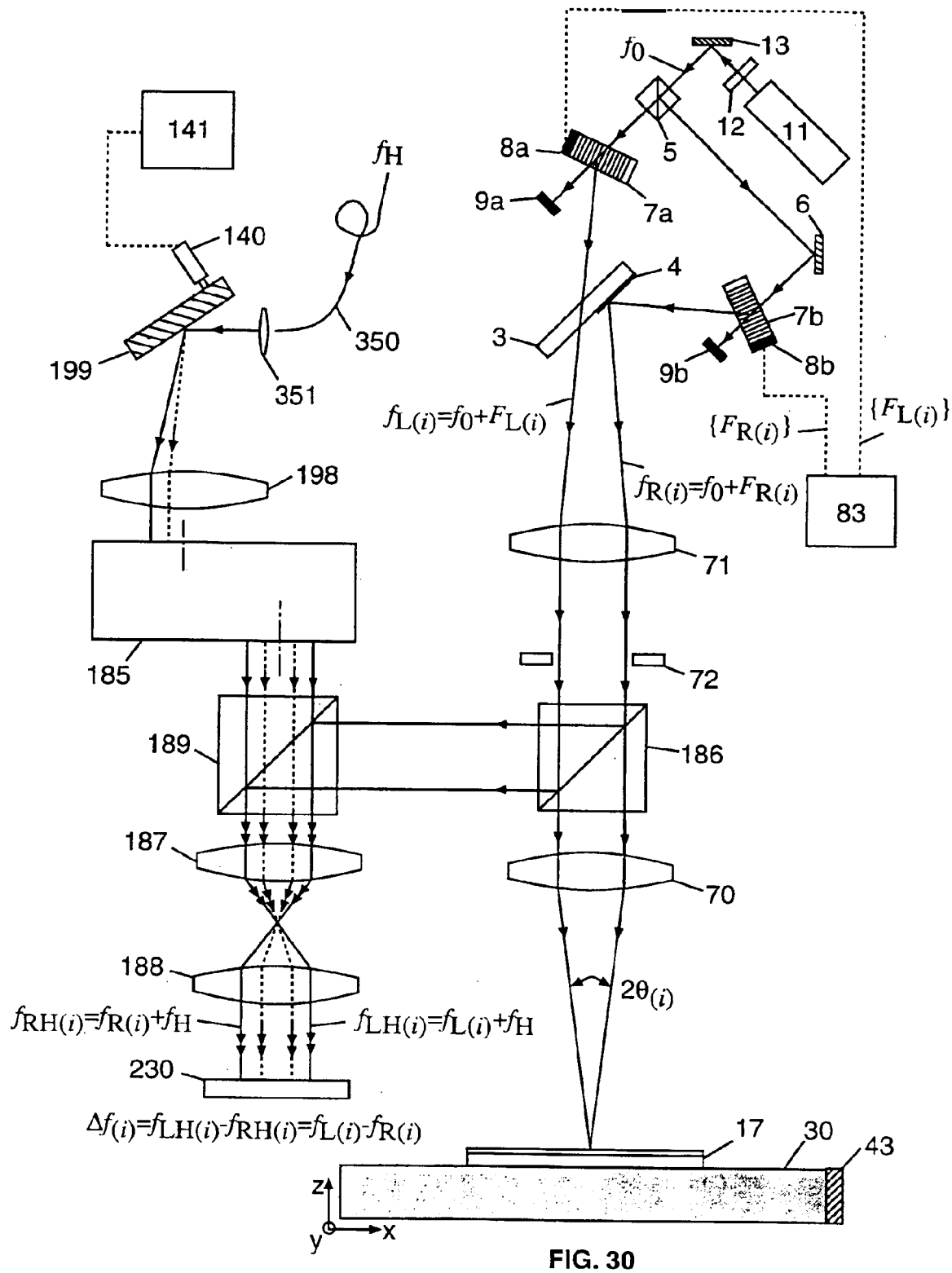
FIG. 30 is a schematic block diagram of an exemplary embodiment of a writing interferometer utilizing a heterodyne phase-reference interferometer that uses a mirror beamsplitter to interfere variable-period heterodyne beams with split writing interferometer beams on an imaging detector.

With reference to FIG. 30, a heterodyne PRI is depicted. The writing interferometer is identical to that in FIG. 29, including pickoff beamsplitter 186. Mixing beamsplitter 189 mixes test beams from the writing interferometer with heterodyne beams from mirror interferometer 185. Heterodyne beams are generated as follows. Fiber 350 delivers heterodyne light of frequency $f_H$ to collimating lens 351. Light reflects from scanning mirror 199, which is rotated by actuator 140 under control of controller 141. Two example paths through the optic are indicated, one by solid line and one by dashed line. Each angle of deflection generates a heterodyne probe beam to test a specific spatial-frequency component in the writing image. Alternatively, an EOD or multi-order grating beamsplitter can be used in place of scanning mirror 199. An EOD would enable faster selection of spatial frequencies to test. A grating beamsplitter would enable probing multiple spatial frequencies simultaneously. Beam(s) from mirror 199 are collimated onto mirror interferometer 185 by lens 198. Mirror interferometer 185 generates pair(s) of heterodyne beams for testing the left and right components in the image. In the figure only the beam pair indicated by the solid line corresponds to the spatial frequency of the beams in the writing interferometer. Beamsplitter 189 mixes the test beams from writing interferometer with the heterodyne beams to generate beams with difference frequencies $f_{RH(i)}=f_{R(i)}-f_H$ in the right arm, and $f_{LH(i)}=f_{L(i)}-f_H$ for the left arm, which are imaged by objective lens, comprising lenses 187 and 188, onto position-sensitive detector 230, such as a linear diode array. Each position on the detector corresponds to a different spatial frequency component in the image, modulated by the heterodyne frequency. By subtracting frequency signals corresponding to the left and right components, the difference frequency for a specific spatial frequency can be obtained from $\Delta f_{(i)}=f_{LH(i)}-f_{RH(i)}=f_{L(i)}-f_{R(i)}$. Thus the amplitude and phase of each spatial frequency component in the image can be obtained.

Figure 31:
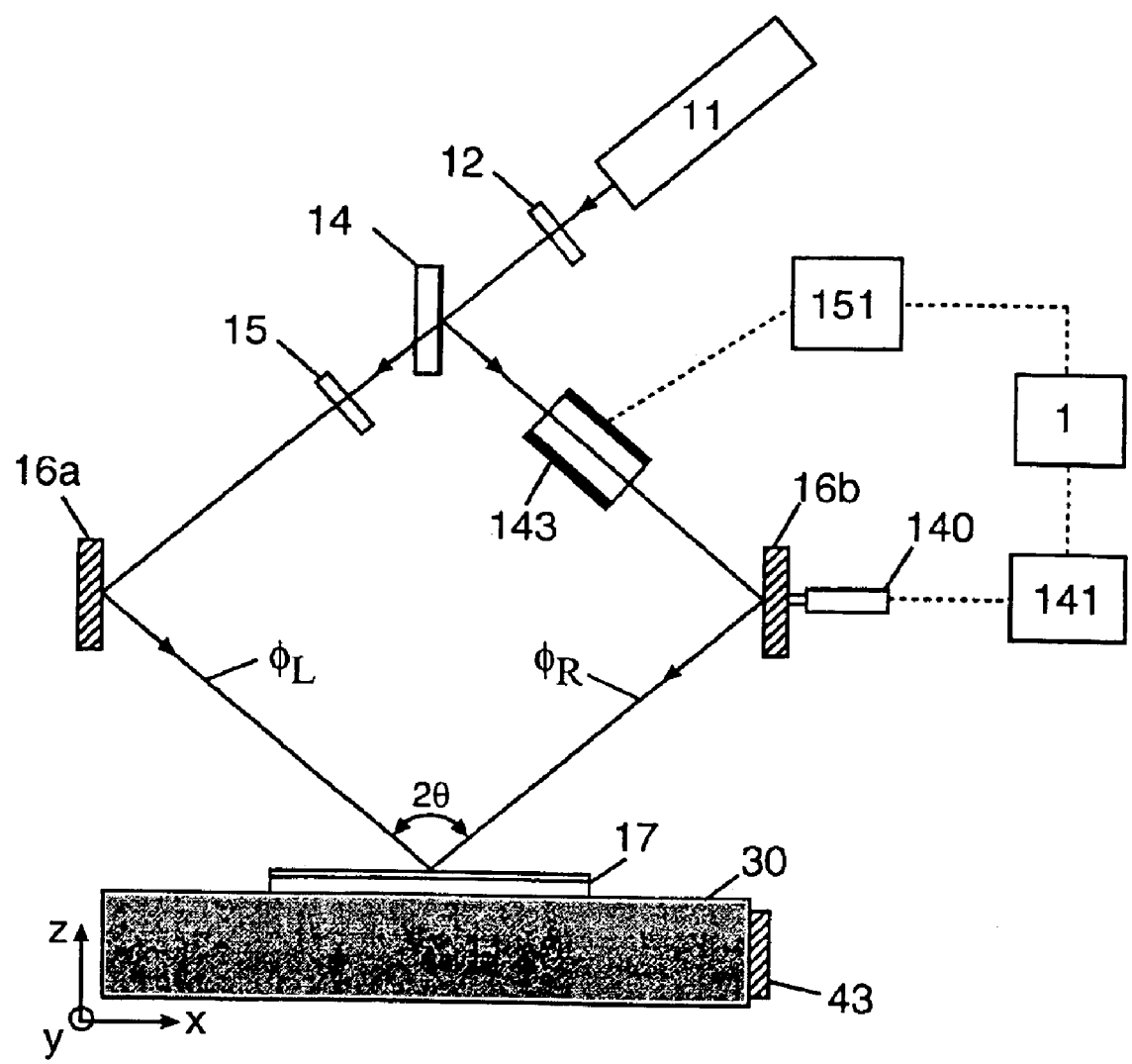
FIG. 31 is a schematic block diagram of an exemplary embodiment of a writing interferometer configured with a combination of actuator-controlled mirror and electro-optic (EO) phase shifters.

A discussion of ways that the phase, frequency, and period of spatial frequency components in the image can be obtained, and demonstrated several means for controlling image phase has now been provided. Several alternative and/or improved means of controlling image phase and frequency will now be described. With reference to FIG. 31, an improved method for controlling image phase over that depicted in FIG. 8c is described. In FIG. 8c, actuator 140, such as a piezoelectric actuator, is used to push mirror 16a, thus shortening the length of the right arm and shifting its phase. While electromechanical actuators generally have a large $\pm\pi N_\pi$ phase range, they are generally slow. On the other hand, electro-optic modulator (EOM) phase shifters can shift phase with megahertz bandwidth, but only over a narrow ($<2\pi$) phase range. In FIG. 31 both types are combined, which enables a design with superior performance. Beam from laser 11 travels through shutter/attenuator 12 and is split by beamsplitter 14 into right and left arms. Mirrors 16 recombine and interfere beams onto substrate 17. Right arm travels first through EOM phase shifter 143, and then reflects from mirror 16b, which is pushed by actuator 140. Master controller 1 sends signals to EOM controller 151 and actuator controller 141 in order to provide the desired image phase.

Figure 32:
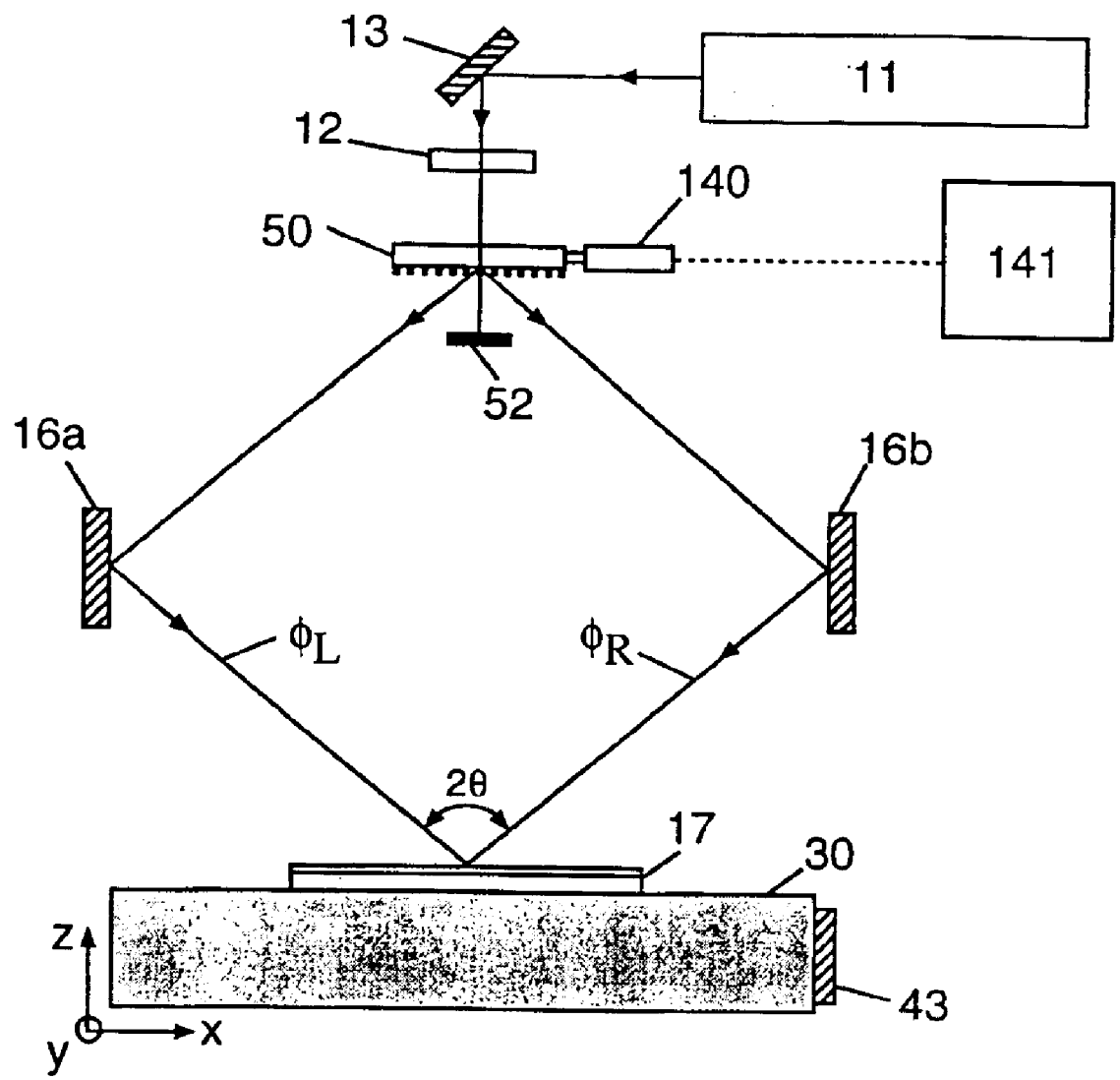
FIG. 32 is a schematic block diagram of an exemplary embodiment of a writing interferometer configured with grating beamsplitter pushed by mechanical actuator for the purpose of controlling image phase.

An alternative means of controlling image phase is depicted in FIG. 32. Beam from laser 11 reflects from mirror 13 and travels through shutter/attenuator 12. Beam is split by grating 50 into zero and ±m order diffracted beams. Zero-order beam is stopped by block 52 and diffracted beams are recombined and interfered on substrate 17 by mirrors 16. Actuator 140 pushes on grating 50 causing grating to move distance $\Delta x$ perpendicular to the incident beam. The motion of the grating causes right beam to change phase by amount $\Delta\phi_{Rm}=-2\pi m\Delta x/p$, and the left beam to change phase by amount $\Delta\phi_{Lm}=2\pi m\Delta x/p$, where p is the grating period. The phase shift of the image is thus $\Delta\phi_m=\Delta\phi_{Lm}-\Delta\phi_{Rm}=4\pi m\Delta x/p$.

Figure 33A:
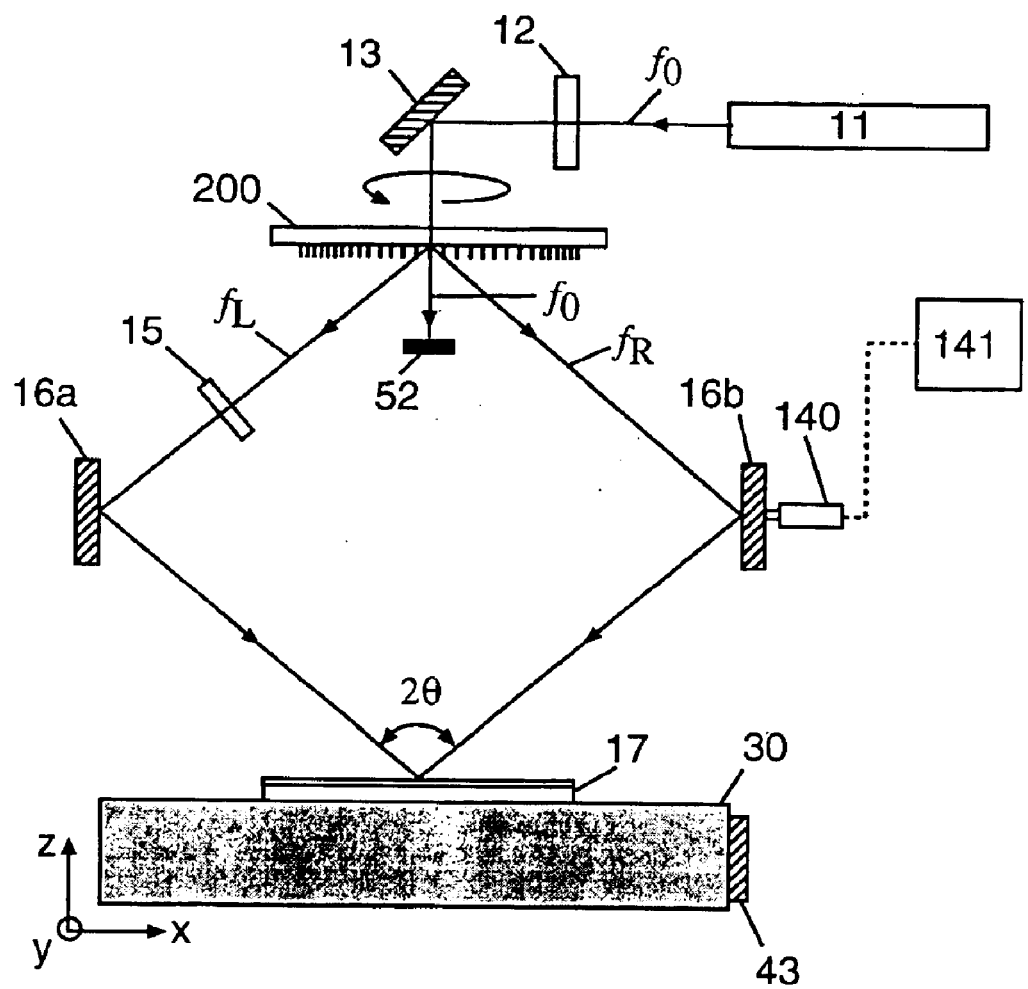
FIG. 33a is a schematic block diagram of an exemplary embodiment of a writing interferometer configured with a spinning grating disk and actuator-controlled mirror for the purpose of controlling image phase.
Figure 33B:
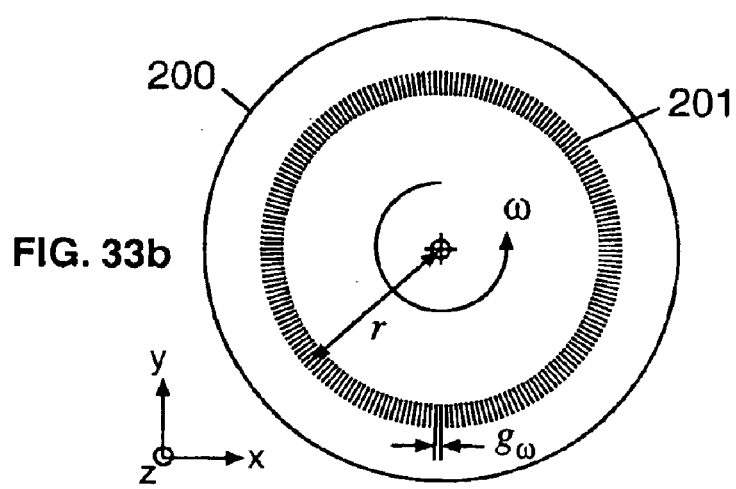
FIG. 33b is a plan view of a spinning grating disk.

An alternative design in depicted in FIG. 33, which utilizes a spinning circular grating rather than a linear one. The circular range allows an unbounded range of phase shifting, or a sustained Doppler shift by using continuous rotation. With reference to FIG. 33a, beam from laser 11 of frequency $f_0$ travels through shutter/attenuator 12, is turned by mirror 13, and diffracted by circular grating 200. Detail of circular grating 200 is depicted in FIG. 33b, showing grating region 201. Zero-order beam is stopped by block 52 and diffracted beams are recombined and interfered on substrate 17 by mirrors 16. Circular grating spins with angular velocity $\omega$ producing right beam of frequency $f_{R\omega}=-2\pi m\omega r/g_\omega$ and left beam of frequency $f_{L\omega}=2\pi m\omega r/g_{107}$, where m is the diffraction order, r is the radius of the grating, and $g_\omega$ is the grating period. The image frequency is thus $\Delta f_\omega=f_{L\omega}-f_{R\omega}=4\pi m\omega r/g_{107}$. Because of the difficulty of making rapid velocity changes to the spinning grating, actuator 140 is used to push mirror 16b in order to rapidly control small phase errors between the arms. Alternatively an EOM phase modulator could be used for even higher bandwidth.

Figure 34:
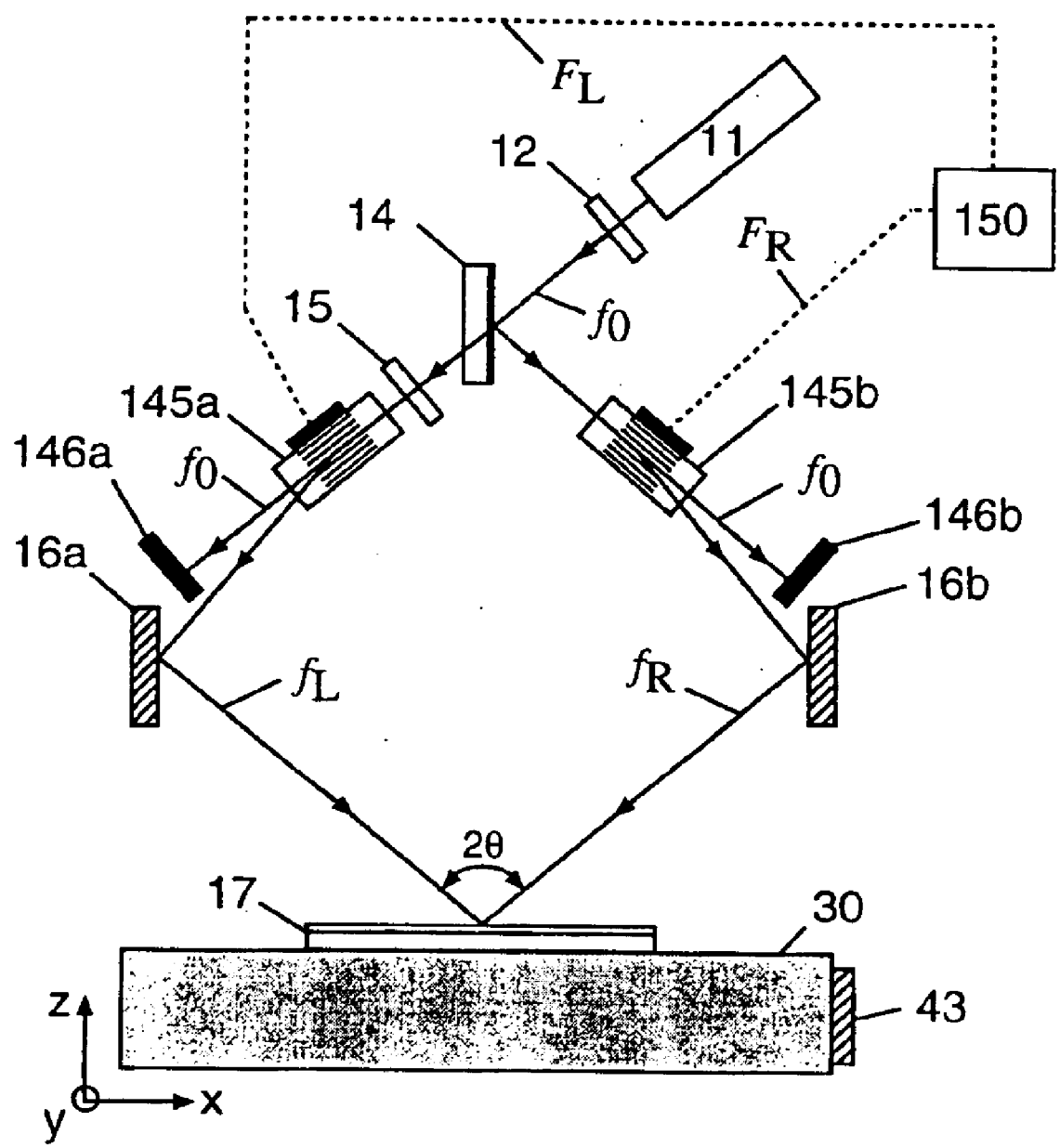
FIG. 34 is a schematic block diagram of an exemplary embodiment of a writing interferometer configured with acousto-optic (AO) frequency modulators in each arm for the purpose of controlling the image phase and frequency.

An improved design for generating continuous frequency shifts between the arms, which uses no moving parts, is depicted in FIG. 34. In this design, beam from laser 11 of frequency $f_0$ travels through shutter/attenuator 12 and is split into left and right arms by beamsplitter 14. Beams are then diffracted by AO modulators 145 into zero-order beams blocked by stops 146, and diffracted beams, which are directed to overlap and interfere at substrate 17 by mirrors 16. AO controller 150 sends RF frequency $F_R$ to right modulator and $F_L$ to left modulator, generating right beam of frequency $f_R=f_0+F_R$ and left beam of frequency $f_L=f_0+F_L$, with frequency difference $\Delta f=f_L-f_R$. While it is not strictly necessary to use AO modulators in both arms, the use of counterposing modulators ensures the left and right beams remain overlapped on substrate 17 even with large frequency shifts and thus large angular deflections of the diffracted beams.

Figure 35:
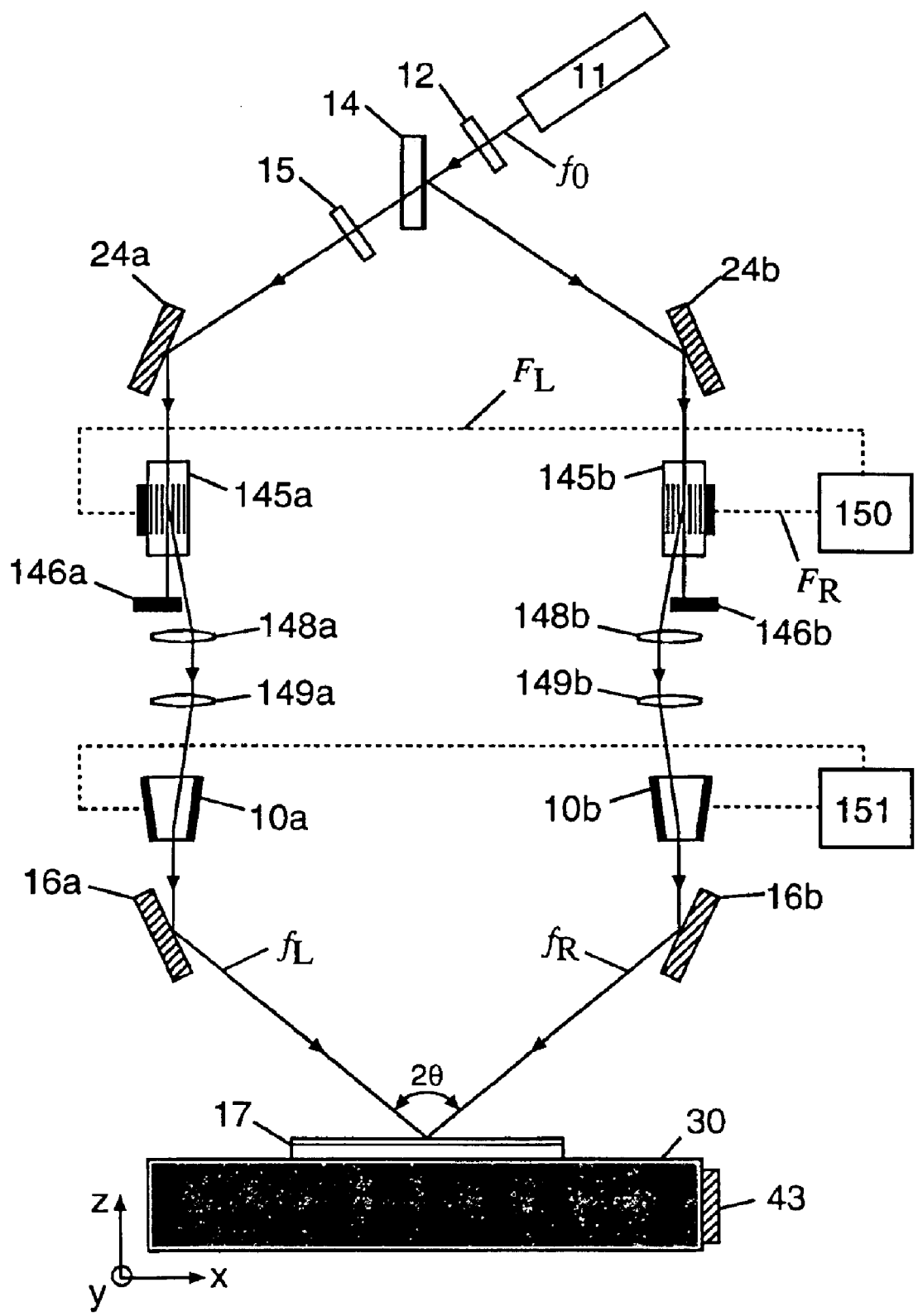
FIG. 35 is a schematic block diagram of an exemplary embodiment of a writing interferometer configured with acousto-optic (AO) frequency modulators and electro-optic (EO) beam deflectors in each arm, the AO modulators control image phase, while the EO deflectors remove the undesired beam deflections that are associated with frequency modulation.

While the use of counterposing modulators ensures overlap of the beams on substrate 17, independent of frequency shift, an undesirable consequence is a tilt of the fringes out of the y-z plane which will generate phase shifts due to substrate z-axis motion or topography. An improved design that eliminates this problem is depicted in FIG. 35. Beam from laser 11 of frequency $f_0$ travels through shutter/attenuator 12 and is split into left and right arms by beamsplitter 14. Turning mirrors 24 send beam through AO modulators 145. Zero-order beams are blocked by stops 146, and diffracted beams are imaged by lenses 148 and 149 onto EO deflectors 10. AO controller 150 sends RF frequency $F_R$ to right modulator and $F_L$ to left modulator, generating right beam of frequency $f_R=f_0+F_R$ and left beam of frequency $f_L=f_0+F_L$, with frequency difference $\Delta f=f_L-f_R$. Beams from AO modulators are deflected in angle, as a function of frequency shift. However, EO deflectors 10 under control of controllers 151 correct the undesired angular shifts. The frequency-shifted, angle-corrected beams are then directed to overlap and interfere at substrate 17 by mirrors 16.

In FIGS. 23a and 23b were depicted means for generating grating images using AO and EO deflectors and an objective lens recombiner. Both these designs have limitations in Doppler scanning applications. To review, in FIG. 23a an EO deflector was utilized, so this design cannot be used for Doppler scanning, while the design depicted in FIG. 23b utilizes a AO deflector, and so can be used. However, at the short UV wavelengths of interest for lithography, EO deflectors are generally capable of a much larger angular range of deflection than AO deflectors, when expressed as a ratio of the angular range divided by the angular divergence of the beam (the so-called number of resolvable spots, see Yariv and Yey, ibid., Chapter 10.2). The number of resolvable spots essentially determines the number of distinct spatial frequency components in the image that are available, and it is desirable to have this as large as possible.

Figure 36:
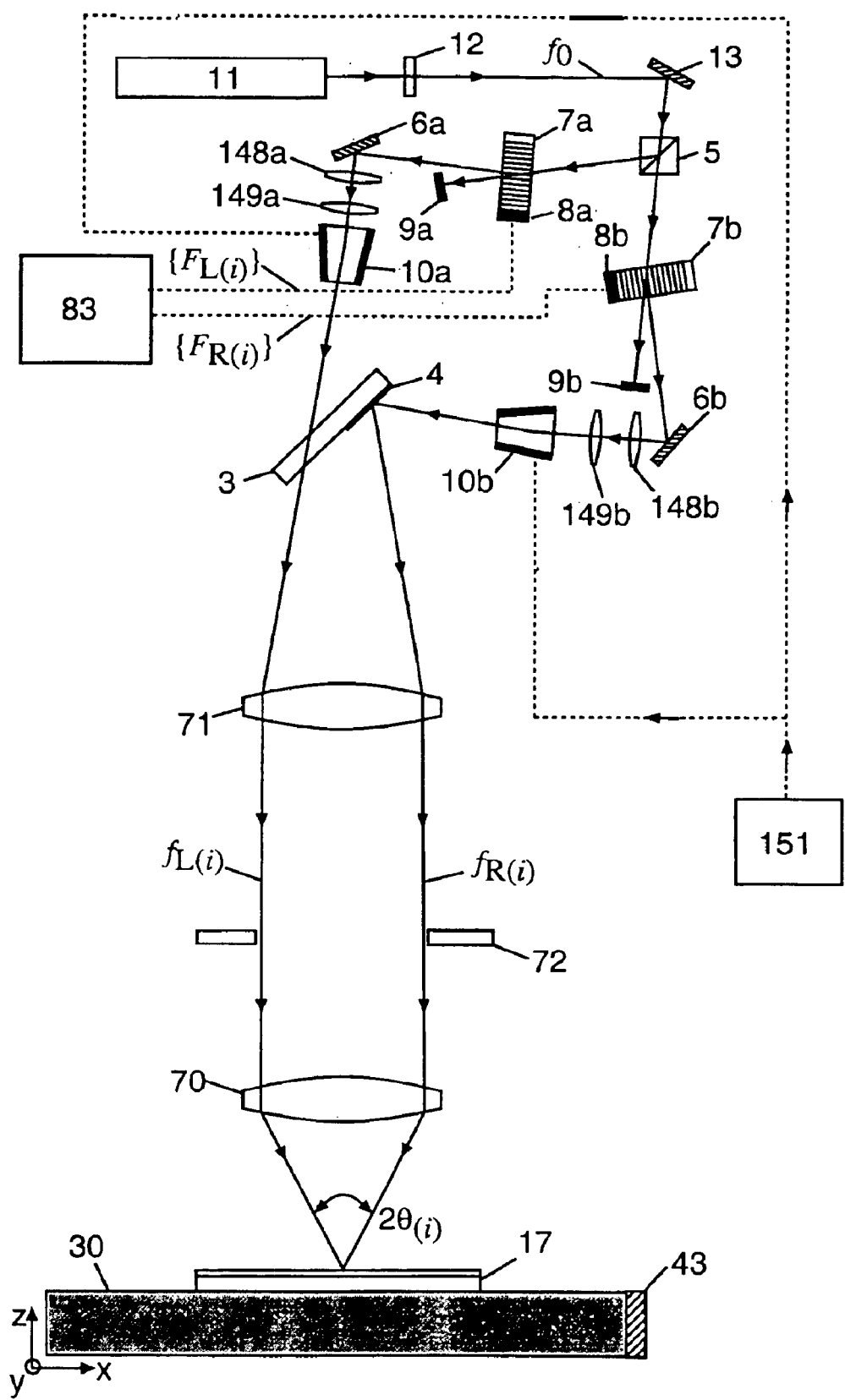
FIG. 36 is a schematic block diagram of an exemplary embodiment of a writing interferometer employing EO deflectors to control image period and AO deflectors to control image phase and frequency.

A design which combines elements of designs 23a and 23b is depicted in FIG. 36, which enjoys both a large number of resolvable spots and the capability of Doppler scanning. In this design beam from laser 11 of frequency $f_0$ travels through shutter/attenuator 12, is turned by mirror 13, and is split into left and right arms by beamsplitter 5. Beams are frequency shifted by AO modulators 7. Zero-order beams are blocked by stops 9, and diffracted beams are turned by mirrors 6 and imaged onto EO deflectors 10 by lenses 148 and 149. AO modulators 7 provide Doppler shifting and multiple angular beam generation over a small angular range, while EO modulators 13 deflect this set of beams through a much larger angular range. Beamsplitter 3 combines the left and right beams, which are then imaged onto the wafer as described previously.

Figure 37A:
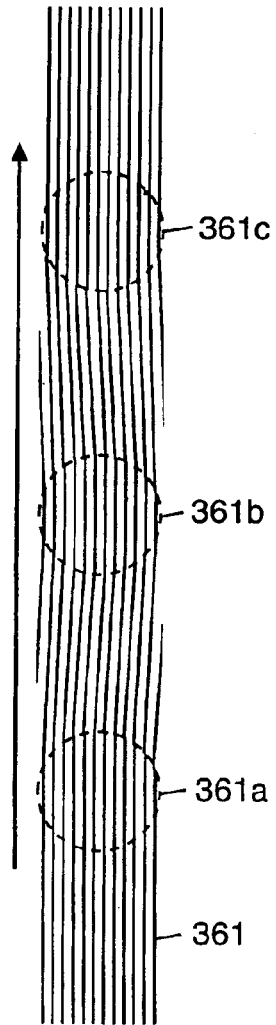
FIG. 37a shows the effect of dynamic image phase error on a grating stripe during substrate scanning.
Figure 37B:
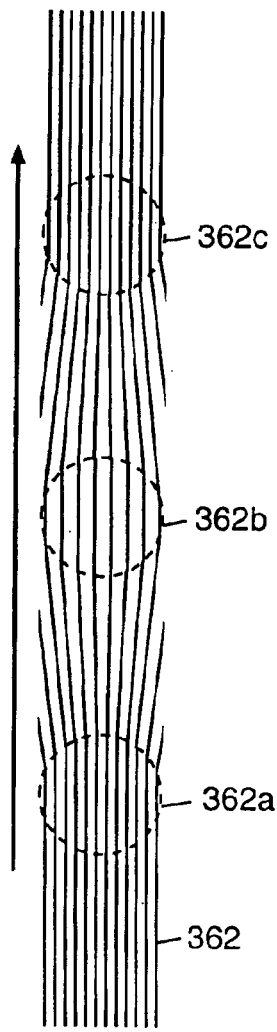
FIG. 37b shows the effect of dynamic image period error on a grating stripe during substrate scanning.
Figure 37C:
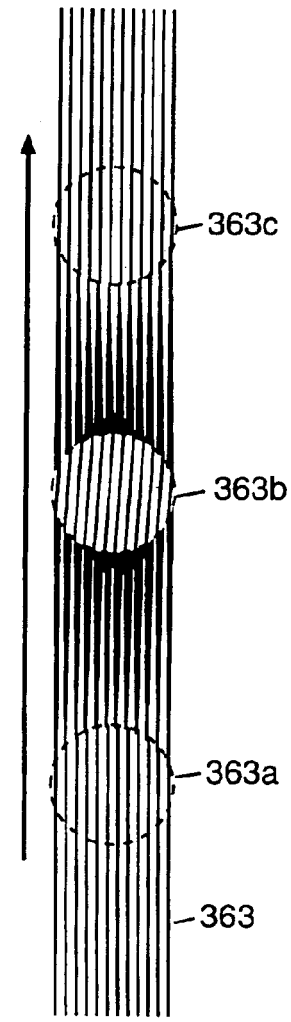
FIG. 37c shows the effect of dynamic image rotation error on a grating stripe during substrate scanning.

A description of ways that phase and frequency differences between the interferometer arms can be measured and controlled has been presented. In addition, undesired angular variations between the arms can compromise the quality of the grating image and lead to distortion and loss of contrast. Specifically, these are the angles that the left and right beams make with respect to the substrate surface. Eight degrees of freedom define the intersection of the two beams on the substrate: left beam $\theta_L$ and $\psi_L$ angles, left beam $x_L$ and $y_L$ lateral shift, right beam $\theta_R$ and $\psi_R$ angles, and right beam $x_R$ and $y_R$ lateral shift. These angles may vary due to vibration, air turbulence, thermal expansion, or mounting drift of optical components. FIG. 37 illustrates the consequences of phase and angle errors in the interferometer arms. FIG. 37$a$ depicts a grating distorted by time-dependant phase shifts between the arms. The stage moves from top to bottom, causing grating image to appear to move from bottom to top of the substrate, writing grating stripe 361. At an early-time point image 361$a$ has the desired phase. At a mid-time point, however, writing interferometer drift causes the phase of image 361$b$ to shift a half-period to the right. At a late-time point the phase of image 361$c$ shifts back to the desired position. The result is a grating stripe with an undesired position-dependent phase error.

FIG. 37$b$ depicts a distorted grating that would obtain due to time-dependent $2\theta$-angle (in-plane) arm rotations between the arms during scanning. The stage moves from bottom to top, writing grating stripe 362. At an early time point image 362$a$ moves along the desired path with the desired period. At a mid-time point, however, $2\theta$ error causes the period of image 362$b$ to decrease. At a late-time point the period of image 362$c$ returns to the desired value. The result is a grating stripe with undesired position-dependant period variations.

FIG. 37$c$ depicts a distorted grating that would obtain due to time-dependent $\psi$-angle (out-of-plane) arm rotations during scanning. The stage moves from bottom to top, writing grating stripe 363. At an early time point image 363$a$ moves along the desired path with image rotation aligned with the direction of motion. At a mid-time point, however, out-of-plane arm angular errors cause image 363$b$ to rotate clockwise. At a late-time point image 363$c$ has rotated back to the desired path. The result is a grating stripe with undesired position-dependant linewidth variations.

Figure 38A:
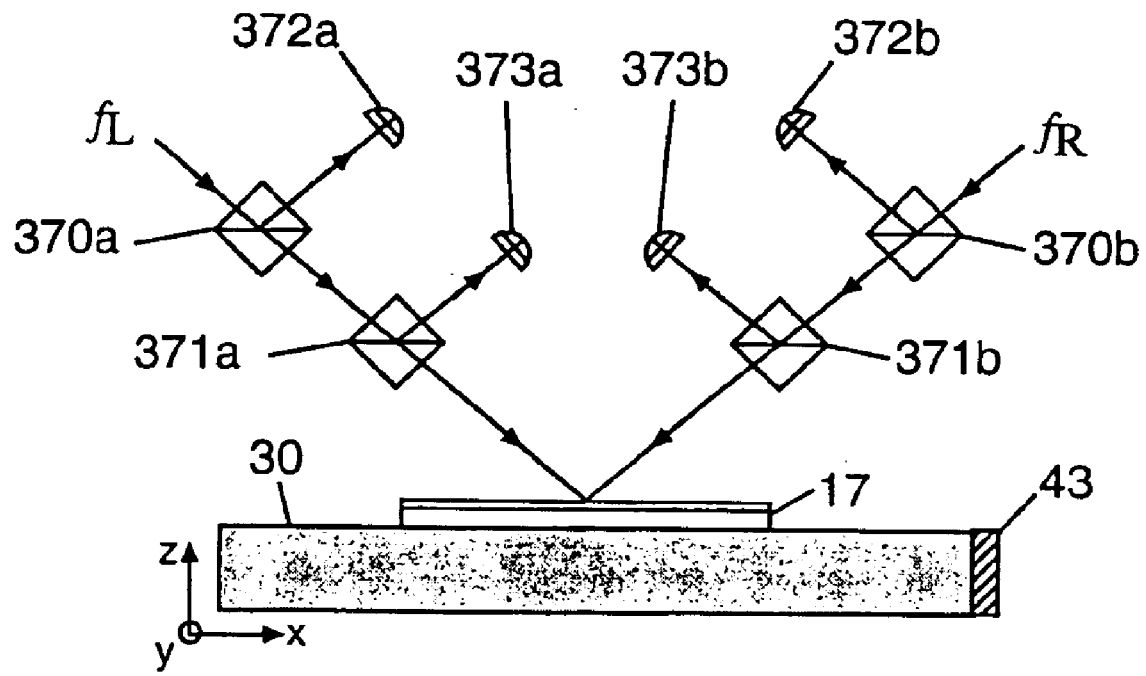
FIG. 38a is a schematic diagram showing a method for measurement of writing arm angles and deflections during writing.
Figure 38B:
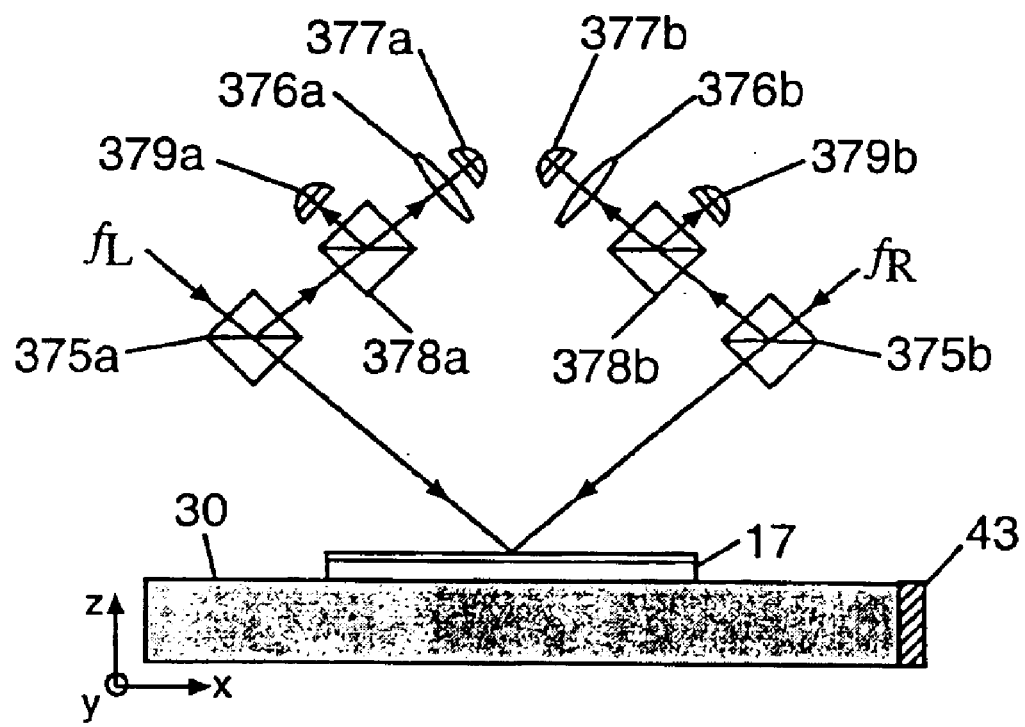
FIG. 38b is a schematic diagram showing an alternative method for measurement of writing arm angles and deflections during writing.

A variety of means may be employed to measure and correct for interferometer arm angular errors. FIG. 38 depicts a couple of direct homodyne methods for measuring beam angular errors. With reference to FIG. 38$a$, right and left interferometer beams are first split into main beams and weak first-test beams by beamsplitters 370, which impinge onto two-axis position-sensitive detectors 372. The main beam is split again by beamsplitters 371 into main beams and weak second-test beams that impinge on two-axis position-sensitive detectors 373. The sixteen signals from the position-sensitive detectors can be processed to extract the angles and lateral shifts of the beams on substrate 17, using well-known methods.

An alternative, more compact homodyne method is depicted in FIG. 38$b$. Right and left interferometer beams are split into main beams and weak test beams by beamsplitters 375. Test beams are split into lateral-shift test beams by beamsplitters 378, which impinge on two-axis position-sensitive detectors 379, and angular-shift test beams, which are focussed by lenses 376 onto two-axis position-sensitive detectors 377. The sixteen signals from the position-sensitive detectors can be processed to extract the angles and lateral shifts of the beams on substrate 17, using well-known methods.

Figure 39:
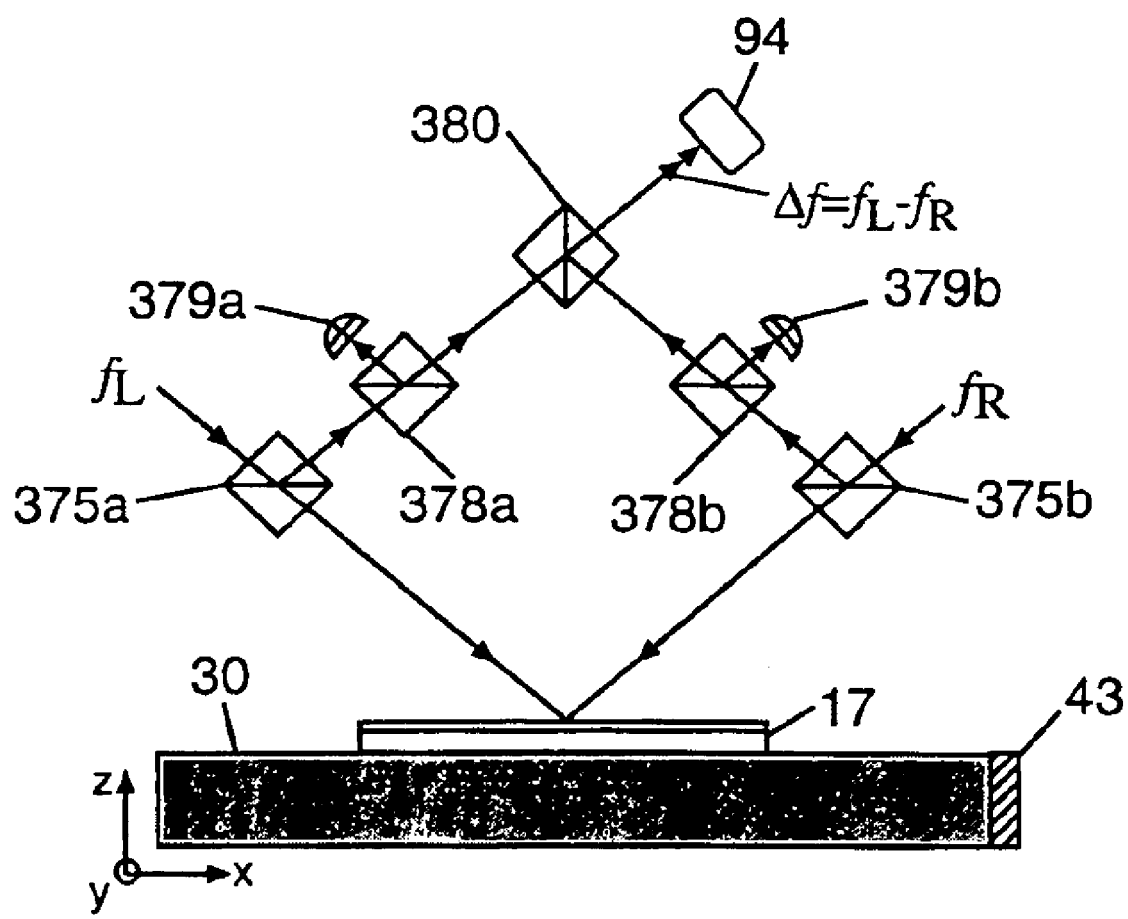
FIG. 39 is a schematic diagram showing a homodyne method for measurement of writing arm angles, deflections, and phase difference during writing.

An alternative homodyne method is depicted in FIG. 39 that utilizes interference to measure beam angular variations. Right and left interferometer beams are split into main beams and weak test beams by beamsplitter 375. Test beams are split into lateral-shift test beams by beamsplitters 378, which impinge on two-axis position-sensitive detectors 379, and angular-shift test beams, which are recombined and interfered by beamsplitter 380 onto imaging detector 94. Interference fringes on imaging detector 94 are analyzed to directly extract the $\theta$ and $\psi$ angle differences between the arms using well-known methods.

Figure 40:
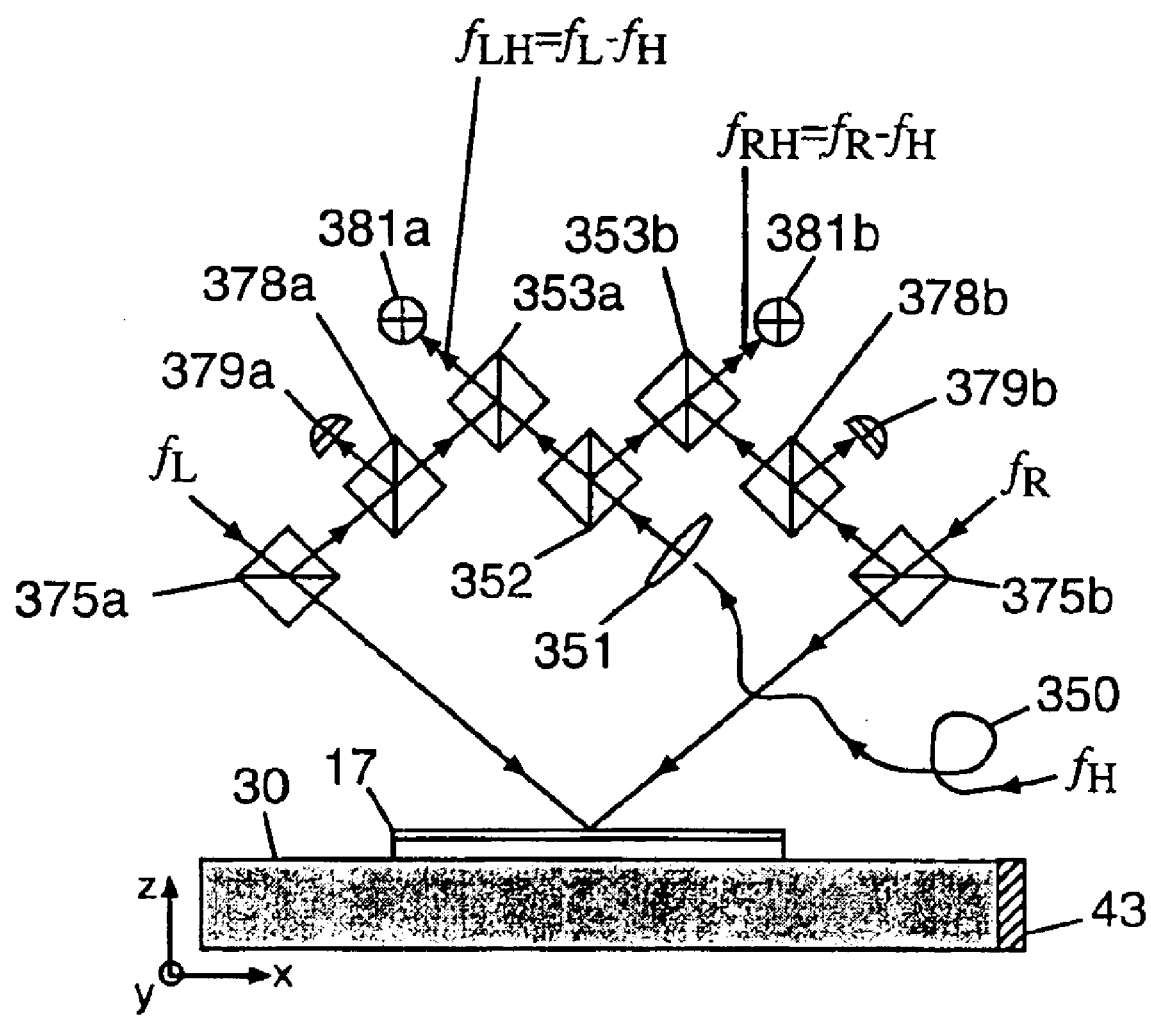
FIG. 40 is a schematic diagram showing a heterodyne method for measurement of writing arm angles, deflections, and phase difference during writing.

A heterodyne method can be utilized to measure beam angular variations, as depicted in FIG. 40. Right and left interferometer beams are split into main beams and weak test beams by beamsplitters 375. Test beams are split into lateral-shift test beams by beamsplitters 378, which impinge on two-axis position-sensitive detectors 379, and angular shift test beams, which proceed to the heterodyne interferometer. The heterodyne interferometer comprises optical fiber 350 that delivers light of frequency $f_H$ to lens 351, producing free-space beam impinging on beamsplitter 352. Mixing beamsplitters 353 then combine and interfere left and right heterodyne beams with left and right test beams on quadrant detectors 381. The frequency of light measured at detectors 377 is nominally $f_{LH}=f_L-f_H$ for the left arm and $f_{RH}=f_R-f_H$ for the right arm, however, small frequency shifts between different lateral sectors of each beam are possible which indicate beam rotation. Each detector quadrant yields a time-dependant signal that contains phase-shift information modulated at the heterodyne frequency. Each quadrant detector 381 can be used to determine beam angles $\theta$ and $\psi$ for the arm by measuring the frequency difference between opposing pairs of quadrants.

Figure 41A:
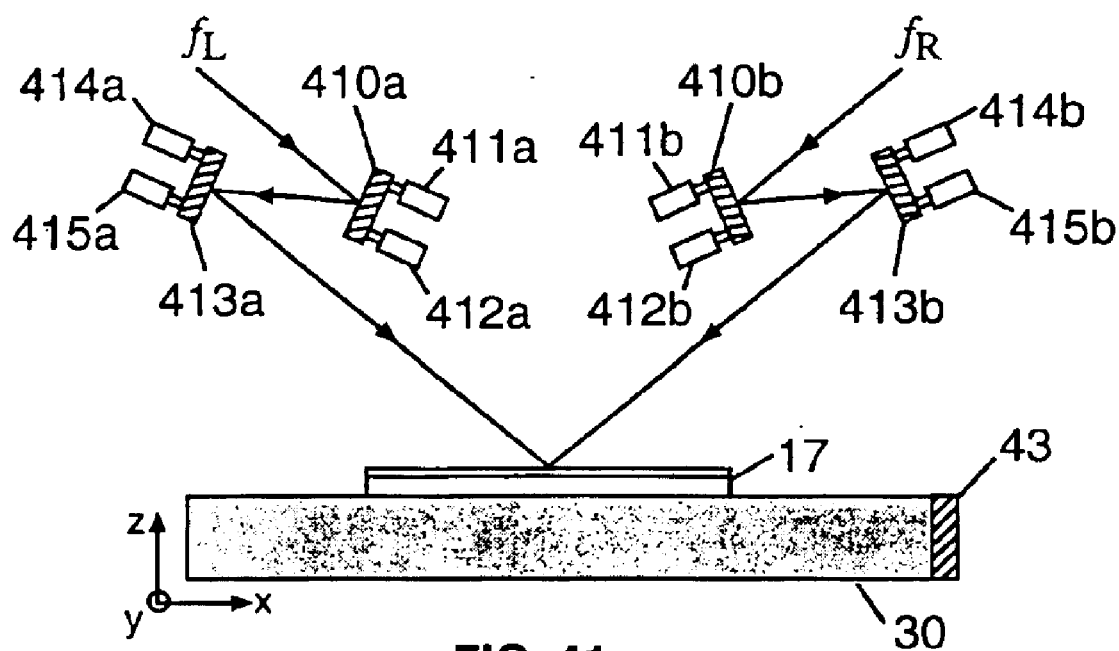
FIG. 41a is a schematic diagram showing a method employing actuator-controlled mirrors for manipulating writing arm angles and deflections during writing.
Figure 41B:
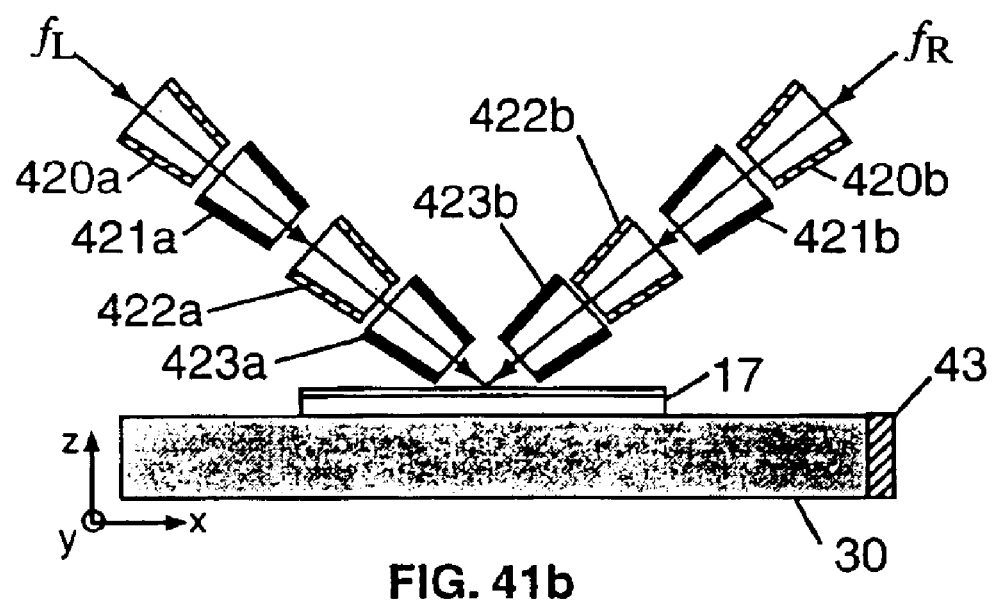
FIG. 41b is a schematic diagram showing a method employing electro-optic beam deflectors for manipulating writing arm angles and deflections during SBIL writing.

A description of ways that lateral and angular shifts between the interferometer alms can be measured has been presented. Ways that active optical components can be utilized to lock the beams on the substrate using the measured information will now be provided. Active optical components can also be used to compensate for stage 30 pitch and yaw errors that are known to stage x-y-$\gamma$ controller. With reference to FIG. 41$a$, a method of steering beams using actuated mirrors is depicted. Left and right beams reflect from first two-axis actuated mirrors 410, which are pushed by actuators 411 and 412, such as piezoelectric actuators, and then reflect from second two-axis actuated mirrors 413, which are pushed by actuators 414 and 415. Each mirror provides both $\theta$ and $\psi$ tilts. The combination of two mirrors in each arm allows correcting for all four beam lateral and angular degrees of freedom per arm.

An alternative method utilizing electro-optic deflectors (EOD), with much higher bandwidth, is depicted in FIG. 41$b$. Left and right beams pass through first $\theta$-axis EODs 420, and then through first $\psi$-axis EODs 421, and then through second $\theta$-axis EODs 422, and then through second $\psi$-axis EODs 423. The combination of four EODs in each arm allows correcting for all four beam lateral and angular degrees of freedom per arm.

A description of ways that errors due to writing interferometer arm phase and frequency shifts, and arm lateral and angular variations, can be measured and controlled has been presented. However, before the writing interferometer can be usefully employed to inscribe gratings on the substrate some means must be used to establish the period, phase, and direction of the image fringes with respect to the stage interferometer axes. Image period and phase must be accurately measured in order to ensure that fringes in the image remain locked to the substrate during stage motion. This is accomplished by the use of special detectors and/or optics traveling with the stage which serve as probes of the grating image. This process is referred to as initiating phase lock between the writing and stage interferometers. In practice, phase locking is established at a set of locations outside of the substrate but still on the substrate stage, and at times before and after an episode of writing. During writing the position of the image fringes with respect to the substrate is inferred from the assumption of dimensional rigidity of the chuck and information from the stage and phase reference interferometers. Phase drift between the stage and writing interferometers is expected due to thermal expansion and other disturbances, and needs to be periodically rechecked. A stable thermal environment and the use of phase-shift history reduces the frequency that phase locking needs to be re-established.

The basic phase-locking concept is illustrated in FIG. 42. Detailed descriptions of various alternative ways of phase locking are described in FIGS. 43–52. With reference to FIG. 42, an interferometer configuration similar to that depicted in FIG. 2a is depicted, with some additional components. In FIG. 42a the interferometer is first depicted as it would appear during writing onto substrate 17. This configuration is called writing mode. However, several critical alignments and measurements need to be performed before writing can commence. In particular, the left and right beams need to fully overlap on substrate 17 for high-contrast fringes to be obtained, and the grating direction, period, and phase need to be determined.

Figure 42A:
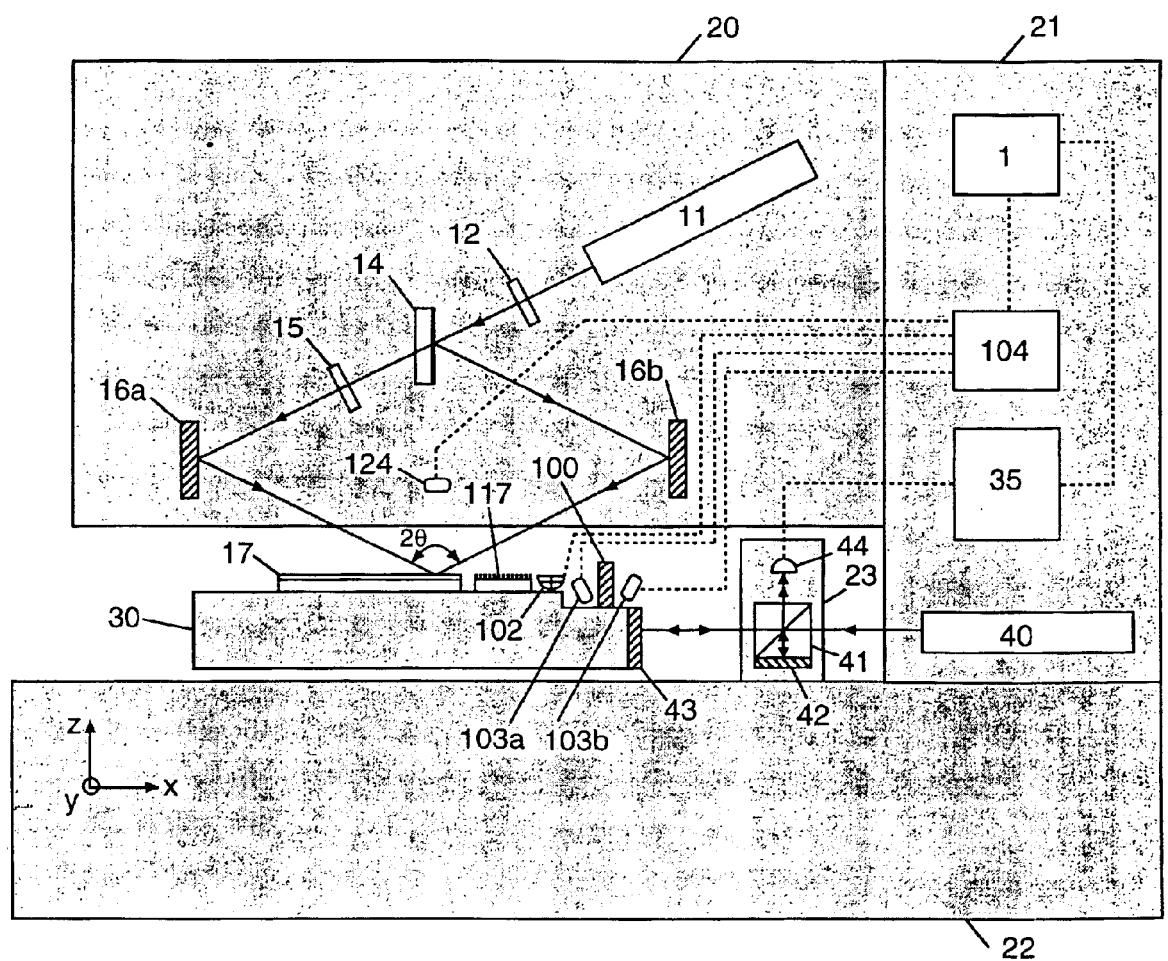
FIG. 42a is a schematic block diagram of an exemplary embodiment of a SBIL system configured as a writing interferometer (not showing phase-reference interferometer and optics for manipulating writing-arm angle, deflection, and phase), demonstrating the location of components on substrate stage for the purpose of measuring image period, angle, and phase, used when configured as a reading interferometer.
Figure 42B:
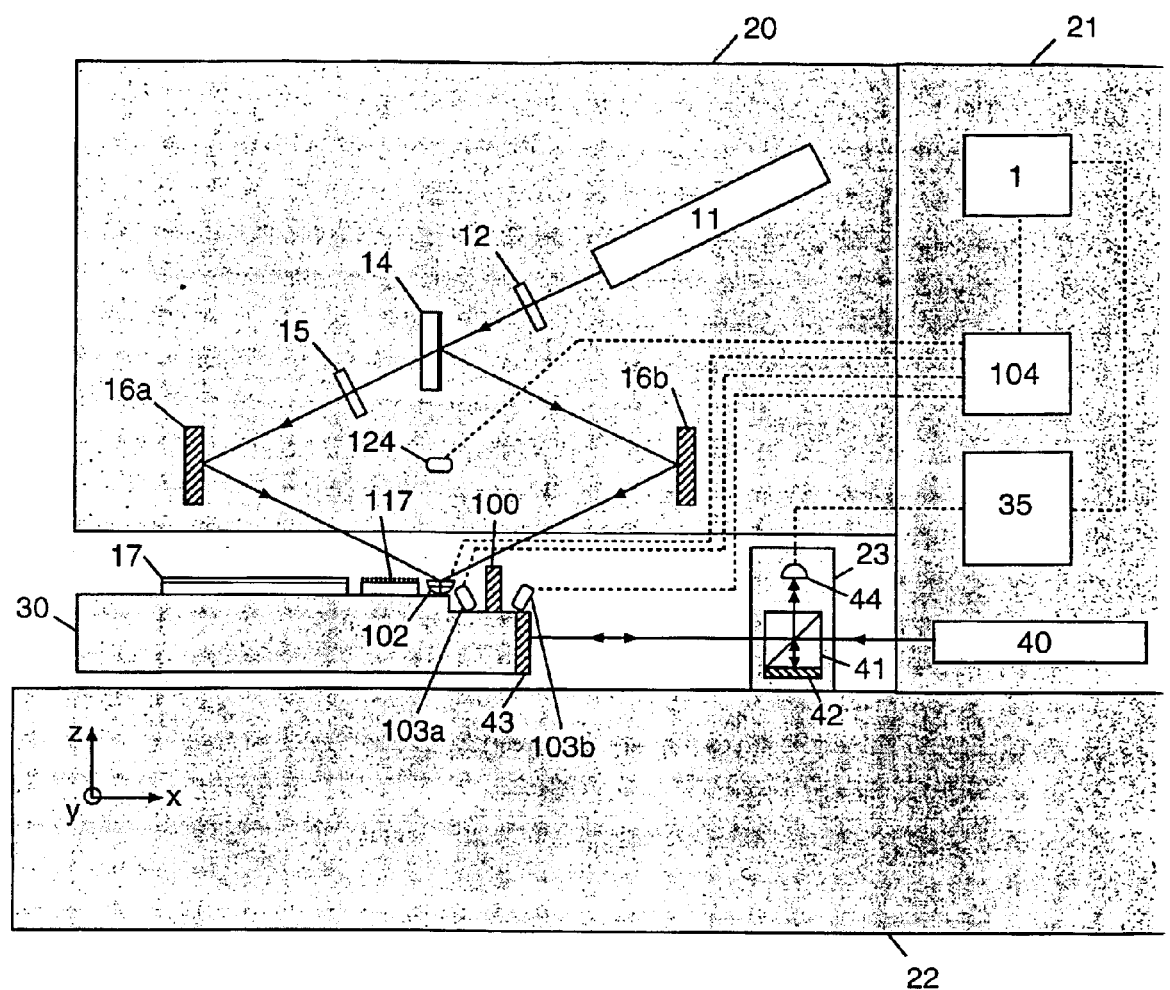
FIG. 42b is a schematic block diagram of an exemplary embodiment of a SBIL system, as it would appear when stage has been moved such that beams impinge on position-sensitive detector for the purpose of beam centering and overlapping.

The first alignment step is to adjust the writing interferometer such that the plane of incidence made by the left and right beams is perpendicular to the x-y plane of motion of the substrate, and that the bisector of the 2θ angle is also normal to this plane. (It is assumed that substrate 17 has been adjusted to lie parallel to the x-y plane.) This can be accomplished using well-known optical methods. This alignment insures that the fringe planes are perpendicular to the substrate surface. The next step is to fully overlap the left and right beams on the substrate. FIG. 42b depicts the interferometer in a configuration where stage 30 has been moved such that two-axis position-sensitive detector 102, such as a quadrant photodiode, is at the beam intersection, which is useful for the purpose of establishing left and right beam overlap.

Figure 42C:
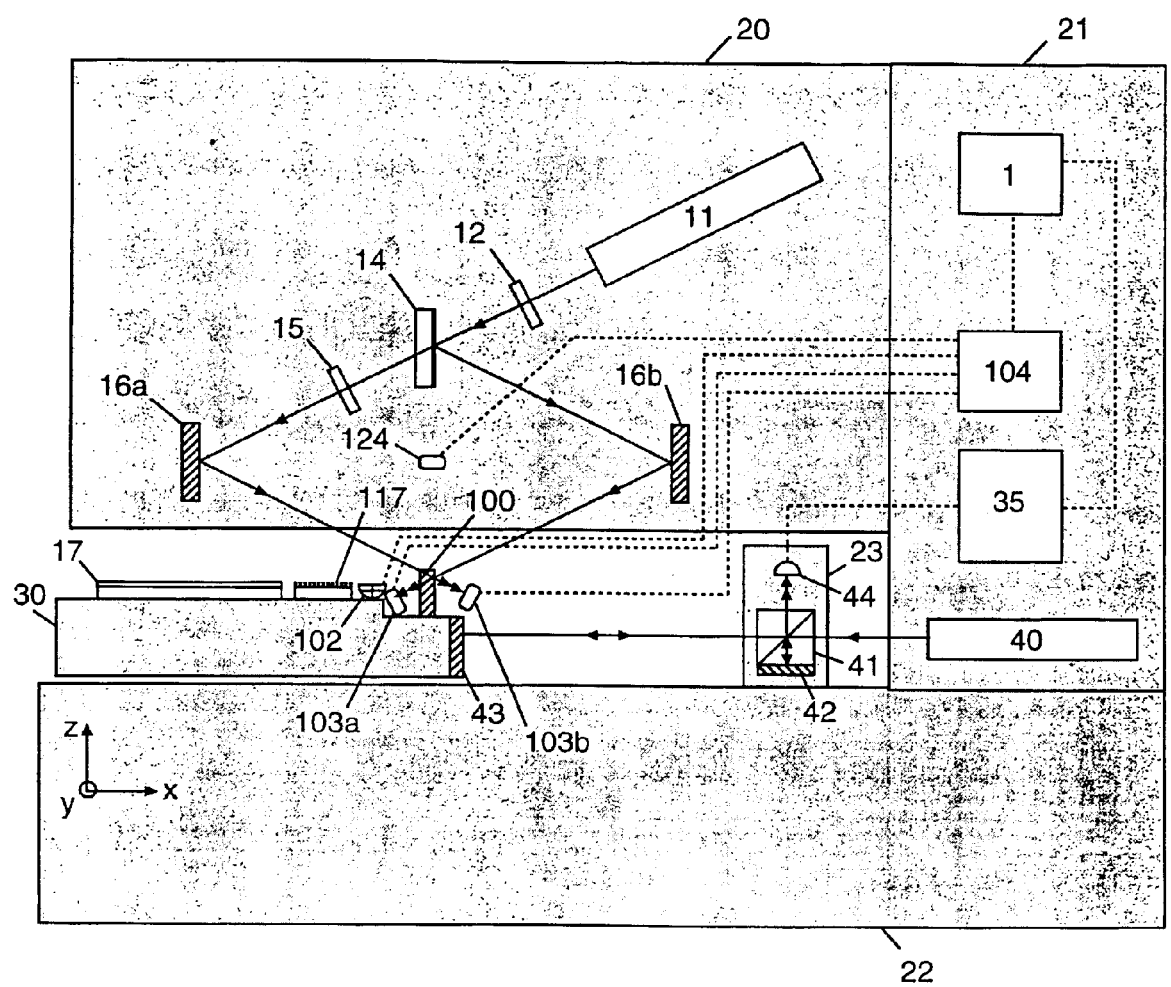
FIG. 42c is a schematic block diagram of an exemplary embodiment of a SBIL system configured as a reading interferometer, the stage has been moved such that beams impinge on phase-sensing beamsplitter and detector(s), for the purpose of measuring image period, rotation, and phase.

The next alignment task is to ensure that the stage motion direction during writing is accurately parallel to the fringes in the grating image. Errors in determining stage motion parallelism lead directly to a loss of contrast in the written grating, as depicted in FIG. 7c. FIG. 42c depicts the interferometer in reading-mode configuration, where stage 30 has been moved such that reference beamsplitter 100 causes left and right beams to interfere on imaging detectors 103. Beamsplitter 100 has been mounted such that its face is accurately perpendicular to the x-y plane. The face of beamsplitter 100 constitutes a reference surface to which the direction of motion during scanning needs to be strictly parallel. The first step of initiating phase locking is to establish stage motion directions that are accurately parallel (x') and perpendicular (y') to this face. Beamsplitter 100 is first adjusted in angle until a flat interference fringe is obtained on imaging detectors 103. Alternatively, the left and right beams may be angle adjusted to achieve is the same result. This ensures that the image fringe planes are parallel to the reference surface. Stage 30 is started at position $(x_0,y_0)$ and then moved a distance $\Delta y$ parallel to the y-axis. Since the y-axis is unlikely to be perfectly parallel to the face of beamsplitter 100, a sinusoidal signal is observed by detectors 103 while the stage is moving, with a phase shift $\Delta\phi_D = (8\pi\Delta y/\lambda) \sin \theta \sin \epsilon$, where $\lambda$ is the laser wavelength, $\theta$ is the half-angle between the interfering beams, and $\epsilon$ is the angle between the face of beamsplitter 100 and the y-axis. This equation can be solved for $\epsilon$, with an accuracy limited by the flatness of the reference surface and the noise of the phase measurement process.

The next task is to accurately determine the period and phase of the fringes in the image using the stage interferometer as a dimensional reference. Stage 30 is started at position $(x_0,y_0)$ and is then moved to position $(\Delta x,\Delta x \sin \epsilon)$ causing sinusoidal signals observed on detectors 103. The phase shift $\Delta\phi_D$ of signal is then measured, and the period of the image is then calculated from $p = 2\pi\Delta x/\Delta\phi_D$. The image phase zero is then determined by noting a point $x = x_\phi$ where the signal crosses zero voltage. (Because of the periodic nature of the fringes, the phase zero point is indeterminate to an integer multiple of the period, i.e., $x_\phi \pm np = x_\phi$.

Figure 42D:
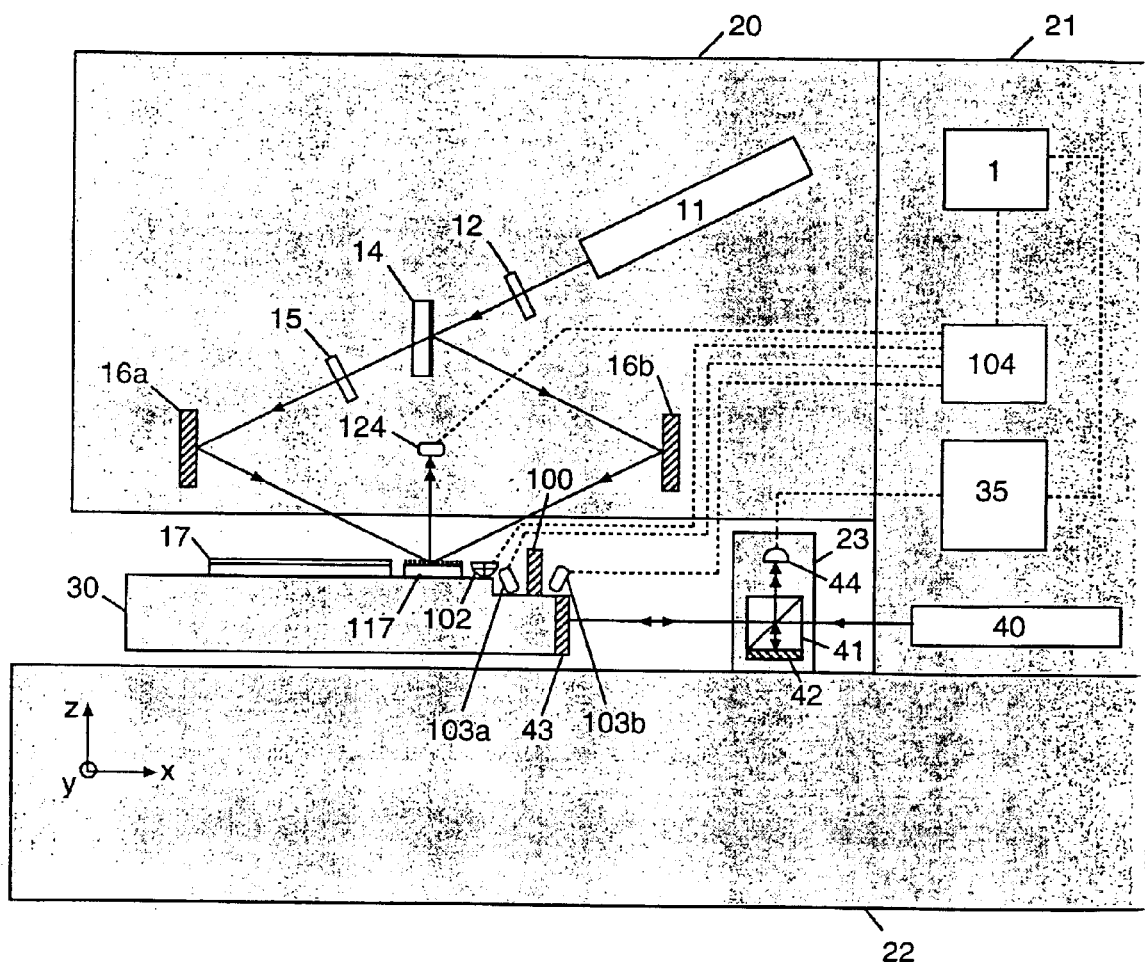
FIG. 42d is a schematic block diagram of an exemplary embodiment of a SBIL system configured as a reading interferometer, the stage has been moved such that beams impinge on phase-sensing grating and detector(s), for the purpose of measuring image rotation and phase.

An alternative procedure for measuring image phase is depicted in FIG. 42d. Here stage 30 has been moved to place test-grating 117 under the grating image. The test-grating period has been selected such that first-order diffracted beams from left and right arms overlap and interfere on imaging detector 124 with flat fringes. Stage 30 is moved in the x-direction causing a sinusoidal signal to be observed by detector 124. The phase of the signal accurately determines the phase of the image, while the period of the signal accurately measures the period of the grating.

At this point all information necessary to begin grating writing has been obtained. The image period, phase, and angle, as measured by the stage interferometer, are known, and can be re-measured periodically if necessary to correct for optic shifts or thermal drifts. In the following sections preferred methods for re-setting phase lock between stage and writing interferometer are described.

In the following sections, where FIGS. 43–52 are described, for clarity only the substrate stage and phase-reference interferometer (PRI) portions of the reading/writing interferometer are depicted in the figures. For example, with regards to FIG. 25, these would be the portions attached to substrate stage 30 and components attached to PRI optical block 175.

Figure 43A:
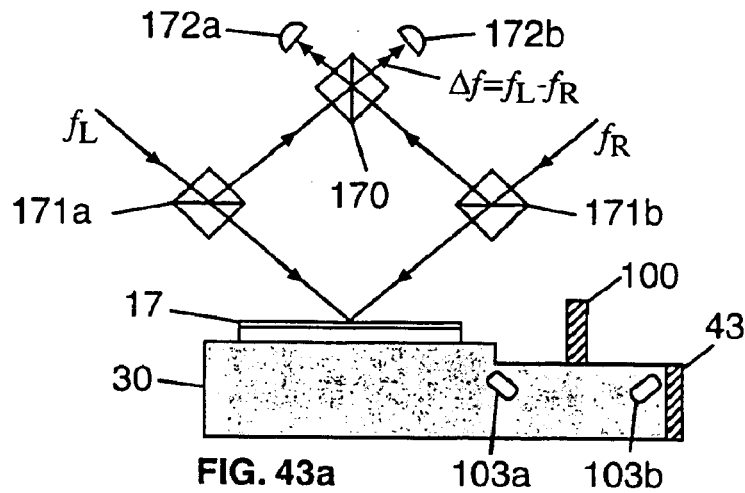
FIG. 43a is a schematic block diagram of an exemplary embodiment of a SBIL system similar to as depicted in FIG. 25, configured in writing-interferometer mode, showing detail of substrate stage and phase-reference interferometer, reading-interferometer optics are idle in this mode.

With reference to FIG. 43, homodyne and in-line heterodyne methods of detecting image phase using a stage beamsplitter are described. In FIG. 43a the system is depicted in writing mode. The phase-reference interferometer, comprising beamsplitters 171, beammixer 170, and detectors 172, measures image frequency $\Delta f = f_L - f_R$, which is used to maintain phase lock between the writing interferometer and substrate 17, as described previously.

Figure 43B:
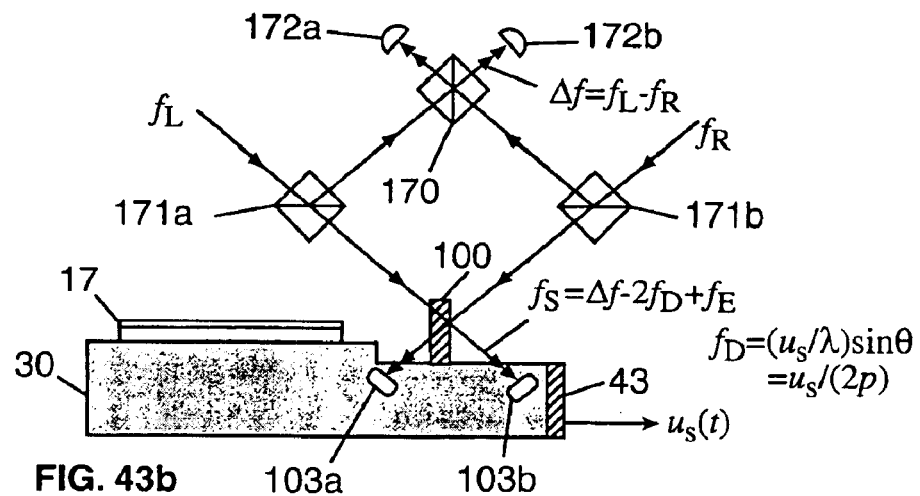
FIG. 43b is a schematic block diagram showing the same system as FIG. 43a configured in reading-interferometer mode, showing detail of substrate stage and phase-reference interferometer, image phase detection is performed using a homodyne scheme.

In FIG. 43b a homodyne phase-locking system is depicted. The system is depicted in reading mode, where stage 30 is moving in the +x direction with velocity $u_S(t)$, which is known from the stage interferometer electronics. Detectors 172 measure image frequency $\Delta f$. The reading interferometer, comprising beamsplitter 100 and imaging detectors 103, measures stage frequency $f_S = \Delta f - 2f_D + f_E$, where $f_D = (u_S/\lambda) \sin \theta = u_S/(2p)$ is the Doppler frequency and $f_E(t)$ is the time-dependant frequency error between the phase reference and reading interferometers, such as caused by thermal expansion. Typically $f_E$ is very small (disturbances are slowly varying) and can be ignored when measuring period if $f_D \gg f_E$, obtaining $p=u_S/(\Delta f-f_S)$. The phase error is obtained from $$\phi_E(t) = 2\pi \int_{t_0}^{t} f_E(\tau)d\tau + \phi_0,$$

where $f_E=f_S-\Delta f+2f_D$ and $\phi_E=\phi_0$ at $t=_0$.

Figure 43C:
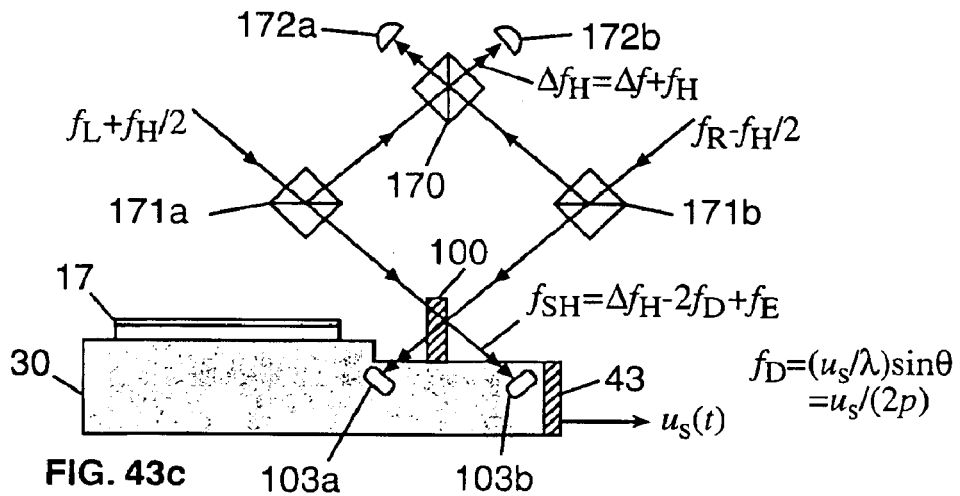
FIG. 43c is a schematic block diagram showing the same system as FIG. 43a configured in reading-interferometer mode, showing detail of substrate stage and phase-reference interferometer, image phase detection is performed using an in-line heterodyne scheme, where a writing-interferometer configuration such as depicted in FIG. 34 is used to provide Doppler shifting of the writing arms.

Detectors 103 in FIGS. 43a–43c may be substituted for different types of detectors, depending on details of the reading interferometer design. When designed to be used in a homodyne mode, the use of 2D imaging detectors for detectors 103 allows direct imaging of fringes, and thus allows direct measurement of changes of θ and ψ angles between the arms. This is especially useful during initial alignment. However, when the reading interferometer is designed to be used in heterodyne mode, fringes on detectors 103 will typically be moving too rapidly to be accurately imaged. In this case, heterodyne quadrant detector schemes, discussed earlier and depicted in FIG. 40, are more useful.

With reference to FIG. 43c, an in-line heterodyne phase locking scheme is depicted. In this embodiment the optical configuration is identical to that depicted in FIG. 43b, except that the left arm has been up-shifted by frequency $f_H/2$ and the right arm has been down-shifted by frequency $f_H/2$. These frequency shifts could be affected by designs depicted in FIGS. 34–36. Detectors 172 measure heterodyne image frequency $\Delta f_H=\Delta f+f_H$, while detectors 103 measure stage frequency $f_{SH}=\Delta f_H-2f_D+f_E$. The method for measuring the image period and phase error is identical to that described previously and depicted in FIGS. 43a and 43b. Here the period of the image is obtained from $p=u_S/(\Delta f_H-f_{SH})$ and the frequency error from $f_E=f_{SH}-\Delta f_H+2f_D$. The advantage of heterodyne frequency shifting the signals, measured by the phase reference and reading interferometers, is the immunity to low-frequency noise. The in-line heterodyne technique can be used with all other types of stage beam combiners, such as pinholes, optical fibers, gratings, or prisms, as described hereinafter.

Figure 44A:
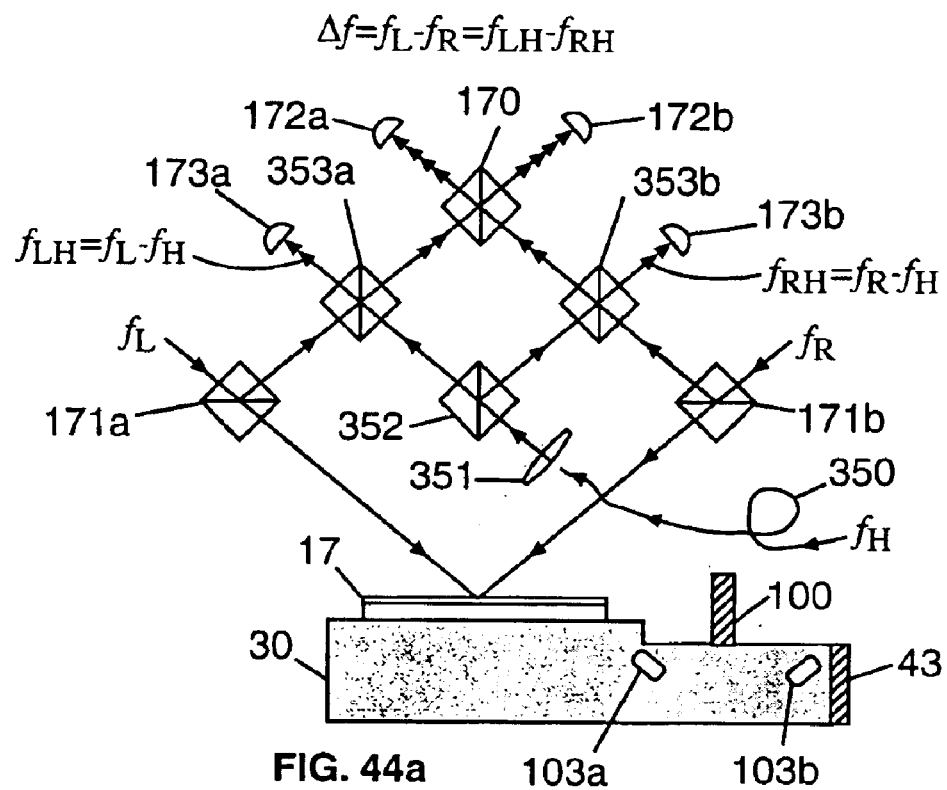
FIG. 44a is a schematic block diagram of an exemplary embodiment of a SBIL system similar to as depicted in FIG. 27a and 27b, configured in writing-interferometer mode, showing detail of substrate stage and heterodyne phase-reference interferometer, reading-interferometer optics are idle in this mode.

The heterodyne phase-reference interferometer described previously and depicted in FIG. 27b needs to be modified slightly in design and usage when used in conjunction with in-line heterodyne phase locking. In FIG. 44a the interferometer is depicted in writing mode. Left and right arms are split by beamsplitters 171 into weak test beams and main beams that impinge and interfere on substrate 17. Test beams proceed to the mixing interferometer comprising optical fiber 350 delivering heterodyne light of frequency $f_H$, collimating lens 351, beamsplitter 352, and mixing beamsplitter cubes 353. An AO modulator, as depicted in FIG. 27c could generate heterodyne light. Beamsplitters 353 mix heterodyne beams with test beams on detectors 173, generating signal $f_{LH}=f_L-f_H$ in left detector 173a, and signal $f_{RH}=f_R-f_H$ in right detector 173b. The image frequency is calculated from $\Delta f=f_L-f_R=f_{LH}-f_{RH}$.

Figure 44B:
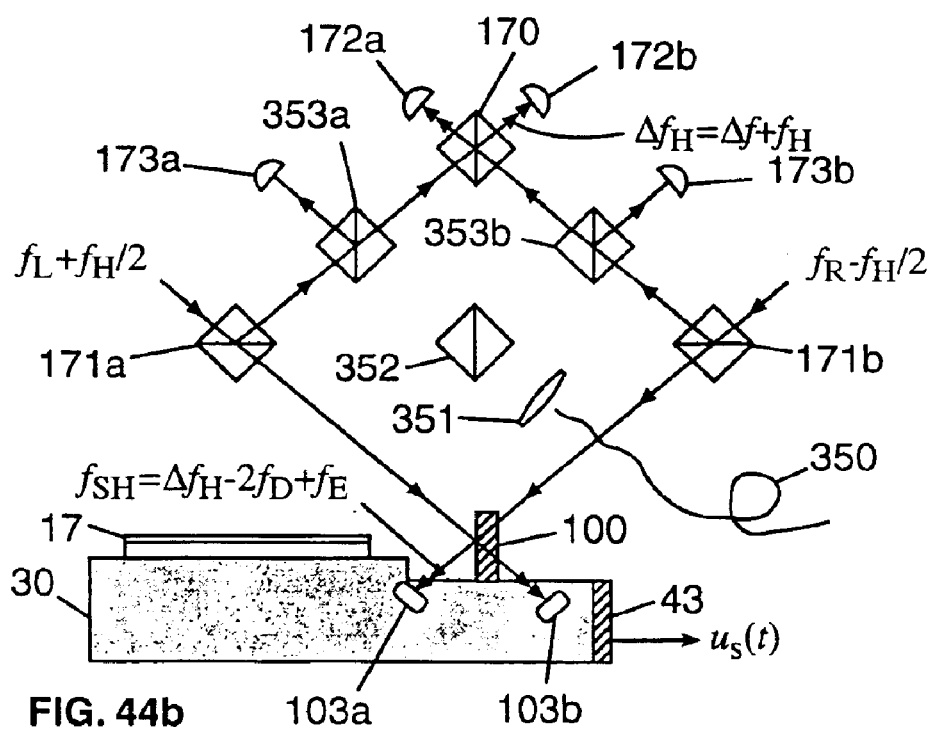
FIG. 44b is a schematic block diagram showing the same system as FIG. 44a configured in reading-interferometer mode, image phase detection is performed using an in-line heterodyne scheme, where a writing-interferometer configuration such as depicted in FIG. 34 is used to provide Doppler shifting of the writing arms.

In FIG. 44b the interferometer is depicted in reading mode. In this case heterodyne light in fiber 350 is turned off, and the interferometer functions identically to the in-line heterodyne interferometer depicted in FIG. 43c and described previously, and the image period and frequency error are calculated as described.

Figure 45A:
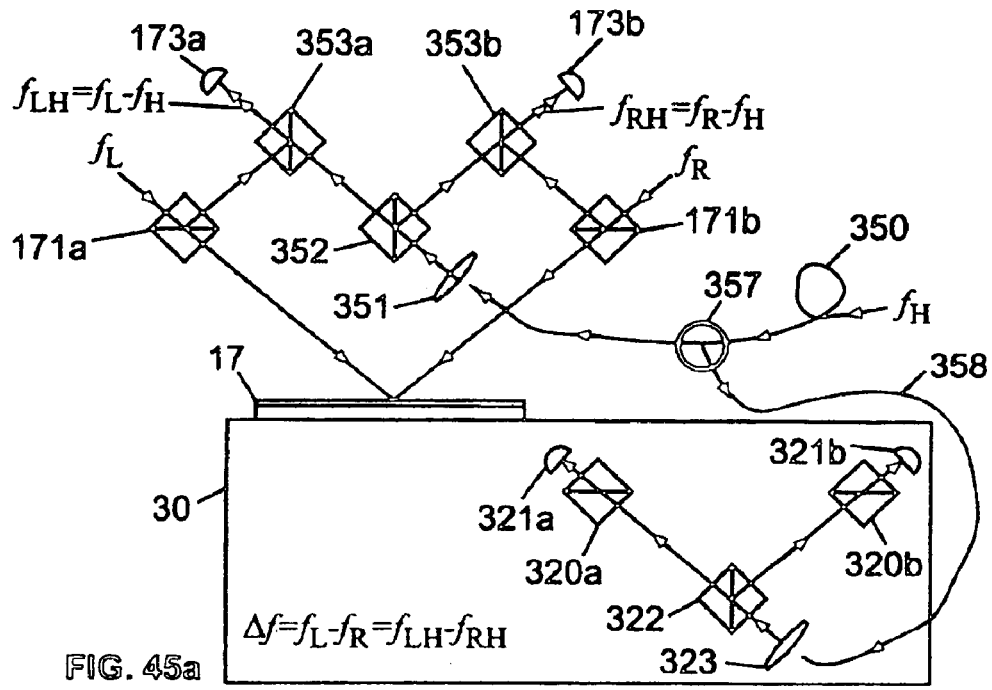
FIG. 45a is a schematic block diagram of an exemplary embodiment of a SBIL system in writing mode, showing heterodyne phase-reference interferometer identical as depicted in FIG. 27b and 27c, and components of an idle heterodyne reading-interferometer attached to the stage.

Now a method is described of phase-locking writing and stage interferometers utilizing a heterodyne interferometer on the stage. This method has the advantage that the phase reference signal needs never to be interrupted, and that no in-line frequency shifting in the arms is required. With reference to FIG. 45a, the interferometer is depicted in writing mode. The design features a heterodyne phase-reference interferometer identical to that depicted in FIG. 27b and described previously. However, in this design, heterodyne light in fiber 350 is split off with fiber beamsplitter 357 into fiber spur 358 that travels to a reading interferometer attached to stage 30, comprising lens 323, beamsplitters 322, mixers 320, and detectors 321. During the time that the interferometer is configured in writing mode, as shown in FIG. 45a, no signal is measured by the reading interferometer.

Figure 45B:
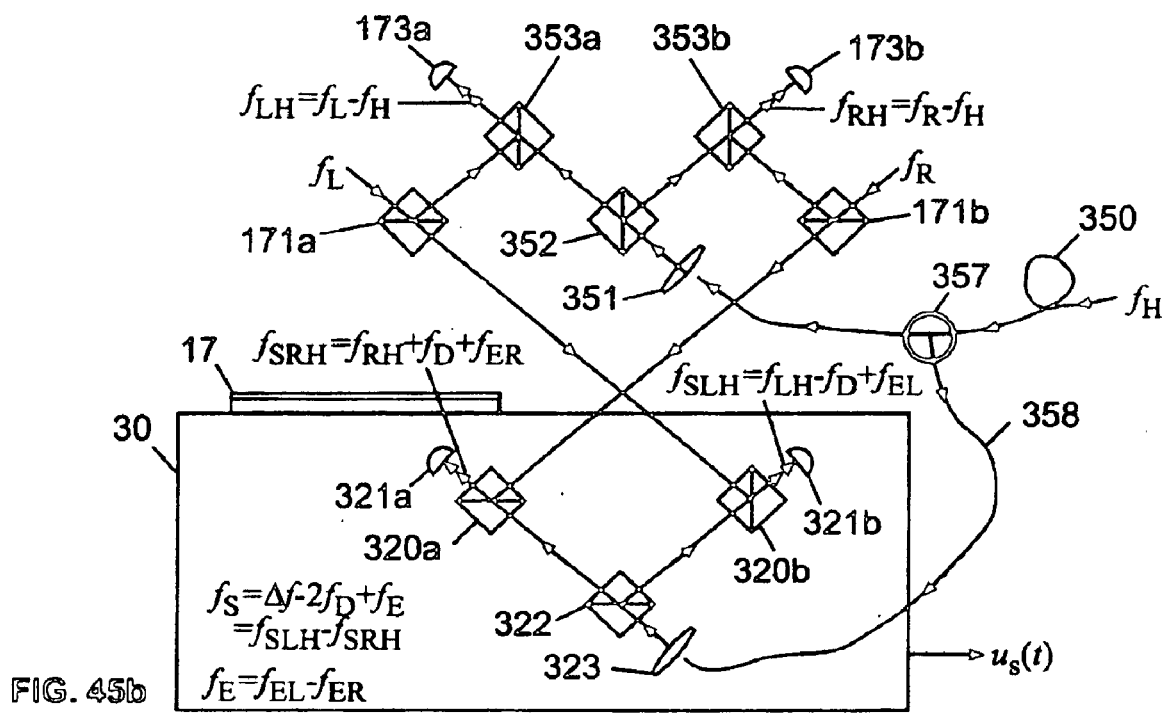
FIG. 45b is a schematic block diagram showing the same system as FIG. 45a in reading mode, where image phase is read using a heterodyne scheme.

FIG. 45b depicts the interferometer in reading mode. In this case the stage has been moved such that the beams no longer intersect at substrate 17, but rather impinge on the heterodyne reading interferometer. The left beam of frequency $f_L$ and right beam of frequency $f_R$ are allowed to cross and impinge on beamsplitters 320, which mix the beams from the reading arms with heterodyne light of frequency $f_H$, which are then measured by detectors 321. Heterodyne light is provided by spur fiber 358 described previously, which delivers light of frequency $f_H$ onto collimating lens 323. Beam from lens 323 is then split into two beams by beamsplitter 322 that travel to mixing beamsplitters 320, as described previously. At all times the phase reference interferometer provides image frequency $\Delta f=f_L-f_R=f_{LH}-f_{RH}$, where $f_{LH}=f_L-f_H$ is measured by left phase reference detector 171a and $f_{RH}=f_R-f_H$ is measured by right phase reference detector 171b. During image measurement the left-arm detector 321b measures signal $f_{SLH}=f_{LH}-f_D+f_{EL}$ and the right-arm detector 321a measures signal $f_{SRH}=f_{RH}+f_D+f_{ER}$, where $f_D=(u_S/\lambda)\sin\theta=u_S/(2p)$ is the Doppler frequency for stage velocity $u_S$, and $f_{EL}$ and $f_{ER}$ are the left and right arm frequency errors, respectively. The stage frequency is calculated from $f_S=f_{SLH}-f_{SRH}=\Delta f-2f_D+f_E$, where $f_E=f_{EL}-f_{ER}$. The period of the image is obtained from $p=u_S/(\Delta f-f_S)$ and the frequency error from $f_E=f_S-\Delta f+2f_D$.

Alternatively to the use of a beamsplitter 100 attached to stage 30, as shown previously in FIG. 42, a number of other means of measuring image period and phase in reading mode are possible, as depicted in FIG. 46. The cases depicted in FIG. 46 show only the region near the overlap of the reading/writing interferometer arms. In all cases the depicted objects are attached to stage 30. Fringe-detection schemes depicted in FIGS. 46(a–c,e) use beamsplitters, lenses and other optical components, which may possibly introduce phase errors into the measurement due to the figure quality of the optics. Detection schemes depicted in FIGS. 46(d,f–h) have the advantage that they directly image individual fringes, introducing minimal phase measurement error, although at the expense of reduced signal.

Figure 46A:
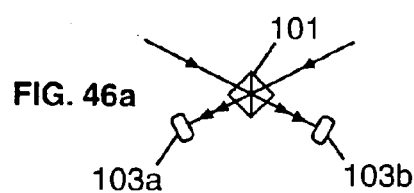
FIG. 46a is a schematic diagram of an exemplary embodiment of a reading interferometer using beamsplitter cube and detectors to measure phase between left and right beams.
Figure 46B:
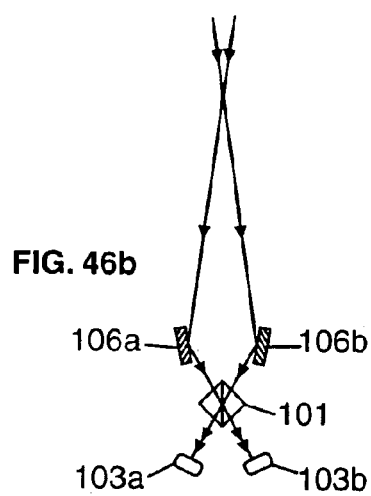
FIG. 46b is a schematic diagram of an exemplary embodiment of a reading interferometer using redirecting mirrors, beamsplitter cube, and detectors to measure phase between left and right beams.
Figure 46C:
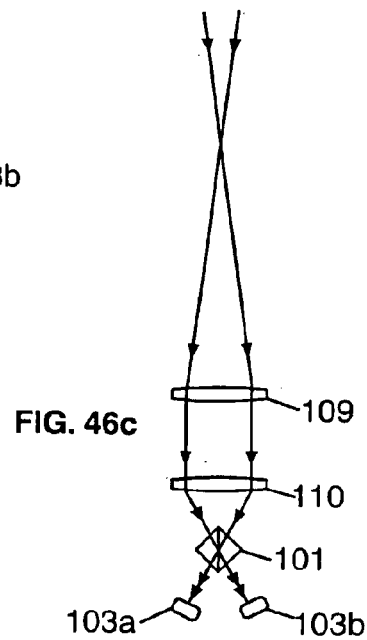
FIG. 46c is a schematic diagram of an exemplary embodiment of a reading interferometer using objective lens, beamsplitter cube, and detectors to measure phase between left and right beams.

FIG. 46a depicts cube beamsplitter 101 that interferes left and right beams onto detectors 103. The advantage of cube beamsplitter 101 over flat beamsplitter 100 used in FIG. 42 is the larger range of accessible angles and better immunity to thermal fluctuations. For large periods, corresponding to small 2θ angles, beam occlusion prevents the use of beamsplitters. FIG. 46b depicts the use of mirrors 106 to open the beam-crossing angle, thus decreasing beam occlusion. FIG. 46c depicts an alternative method of decreasing beam occlusion by using lenses 109 and 110.

Figure 46D:
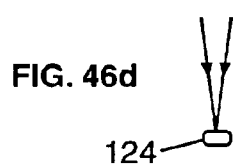
FIG. 46d is a schematic diagram of an exemplary embodiment of a reading interferometer that utilizes detector to measure phase between left and right beams.
Figure 46E:
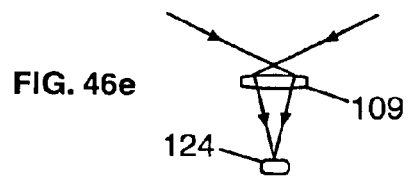
FIG. 46e is a schematic diagram of an exemplary embodiment of a reading interferometer using lens and detector to measure phase between left and right beams.
Figure 46F:
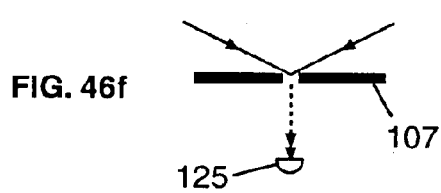
FIG. 46f is a schematic diagram of an exemplary embodiment of a reading interferometer using pinhole and detector to measure phase between left and right beams.
Figure 46G:
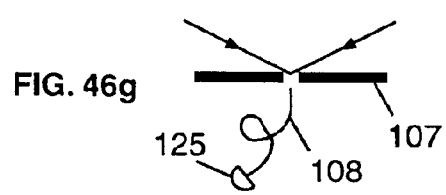
FIG. 46g is a schematic diagram of an exemplary embodiment of a reading interferometer using pinhole, optical fiber, and detector to measure phase between left and right beams.
Figure 46H:
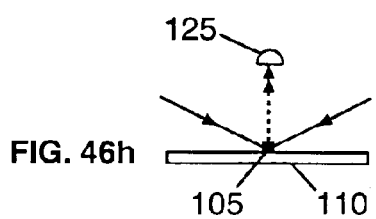
FIG. 46h is a schematic diagram of an exemplary embodiment of a reading interferometer using scatterer and detector to measure phase between left and right beams.

FIG. 46d depicts a detector 124 that is able to detect individual fringes in the image. FIG. 46e depicts lens 109 that magnifies fringes in the image such that individual fringes can more easily be detected by detector 124. FIG. 46f depicts an aperture 107 that is sufficiently small to allow individual fringes to be observed by detector 125. FIG. 46g depicts an aperture 107 that is sufficiently small to allow individual fringes to be picked up by fiber 108 and delivered to detector 125. FIG. 46h depicts a small asperity 105 on the surface of plate 110 which is sufficiently small to allow individual fringes to be scattered onto detector 125. In FIGS. 46(f–h), larger signals could be obtained by using a lens to collect and focus light from the aperture or asperity.

Many alternative means for measuring image period and phase can be described that use is reflective prisms or corner cubes attached to stage 30. The most useful are depicted in FIGS. 47 and 48. In the figures, prism 1118 is attached to stage 30, and travels with velocity us, while all other components are attached to optical bench 20 (see FIG. 42). In many of the following FIGS. 47–52, the optical components and beams comprising the phase reference interferometer have been suppressed for clarity.

Figure 47A:
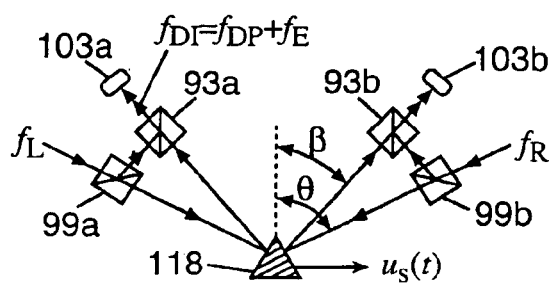
FIG. 47a shows a schematic diagram of an exemplary embodiment of a reading interferometer utilizing stage prism mirror, image phase is measured by interfering beams from each arm with beams from the same arm reflected from the prism.

With reference to FIG. 47a, incident left and right reading beams are split by beamsplitters 99 into reference beams that proceed to beamsplitters 93, and test beams that proceed to prism 118. Test beams reflect from prism 118 onto beamsplitters 93, are mixed with reference beams, and measured by detectors 103. Detectors 103 measure signal $f_{SI}=f_{DP}+f_E$, where Doppler frequency $f_{DP}=(u_S/\lambda)(\sin\theta+\sin\beta)$, $f_E$ is the error frequency, $u_S$ is the stage velocity, $\theta$ is the azimuthal angle and $\beta$ is the angle between the reflected beams and the stage normal. The period of the image is obtained from $p=(\frac{1}{2})/(f_{DP}/u_S+\sin\beta/\lambda)$ and the frequency error from $f_E=f_{SI}-f_{DP}$. A disadvantage of all methods depicted in FIG. 47 is that an accurate determination of p and $f_E$ requires an accurate determination of angle $\beta$.

Figure 47C:
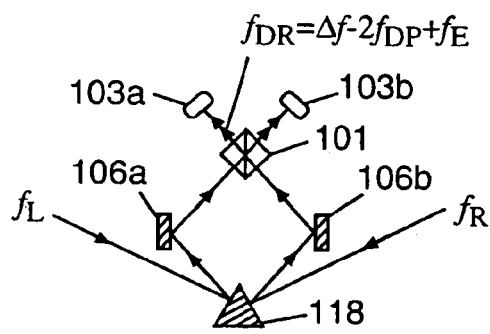
FIG. 47c is a schematic diagram of an exemplary embodiment of a reading interferometer utilizing stage prism mirror, image phase is measured by interfering beams from each arm reflected from prism with beams from the opposite arm reflected from prism.
Figure 47B:
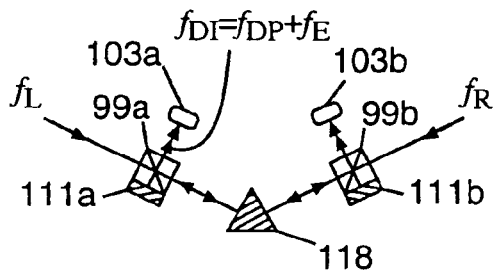
FIG. 47b is a schematic diagram of an exemplary embodiment of a reading interferometer utilizing stage prism mirror, image phase is measured by interfering beams from each arm with beams from the same arm reflected from the prism, in the special case that the incident and reflected beams from the prism are coincident.

FIG. 47b depicts a configuration similar to FIG. 47a, except that prism 118 has been designed such that $\beta=\theta$. In this case, incident left and right reading beams are split by beamsplitters 99 into reference beams, which reflect from mirrors 111 back to detectors 103, and test beams that proceed to prism 118. Test beams reflect from prism 118 back to beamsplitters 111, and are mixed with reference beams onto detectors 103, measuring signal $f_{SI}=f_{DP}+f_E$ where $f_{DP}=2\sin\theta u_S/\lambda$. The period of the image is obtained from $p=u_S/f_{DR}$ and the frequency error from $f_E=f_{SI}-f_{DP}$.

An alternative configuration that mixes left and right Doppler-shifted beams is depicted in FIG. 47c. Here incident left and right reading beams reflect from prism 118 and are directed by mirrors 106 onto beamsplitter 101, which mixes left and right beams onto detectors 103, measuring signal $f_{SR}=\Delta f-2f_{DP}+f_E$. The period of the image is obtained from $p=(\frac{1}{2})/(f_{DP}/u_S+\sin\beta/\lambda)$ and the frequency error from $f_E=f_{SR}-\Delta f+2f_{DP}$.

Figure 47D:
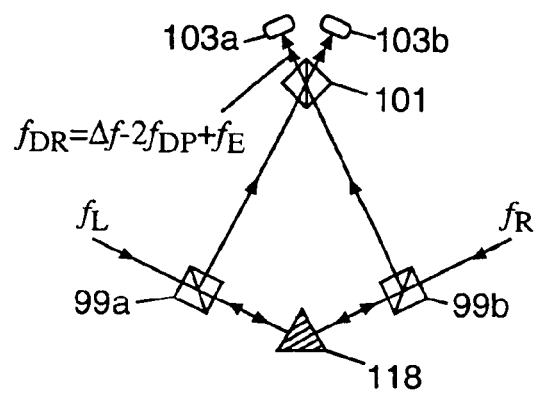
FIG. 47d is a schematic diagram of an exemplary embodiment of a reading interferometer utilizing stage prism mirror, image phase is measured by interfering beams from each arm reflected from prism with beams from the opposite arm reflected from prism, in the special case that the incident and reflected beams from the prism are coincident.

FIG. 47d depicts a configuration similar to FIG. 47c, except that prism 118 has been designed such that $\beta=\theta$. Here incident left and right reading beams transmit through beamsplitters 99 and reflect from prism 118 back to beamsplitters 99, which direct them to beamsplitter 101, mixing left and right beams onto detectors 103, measuring signal $f_{SR}=\Delta f-2f_{DP}+f_E$. The period and frequency errors are determined identically as the method depicted in FIG. 47c.

Figure 48A:
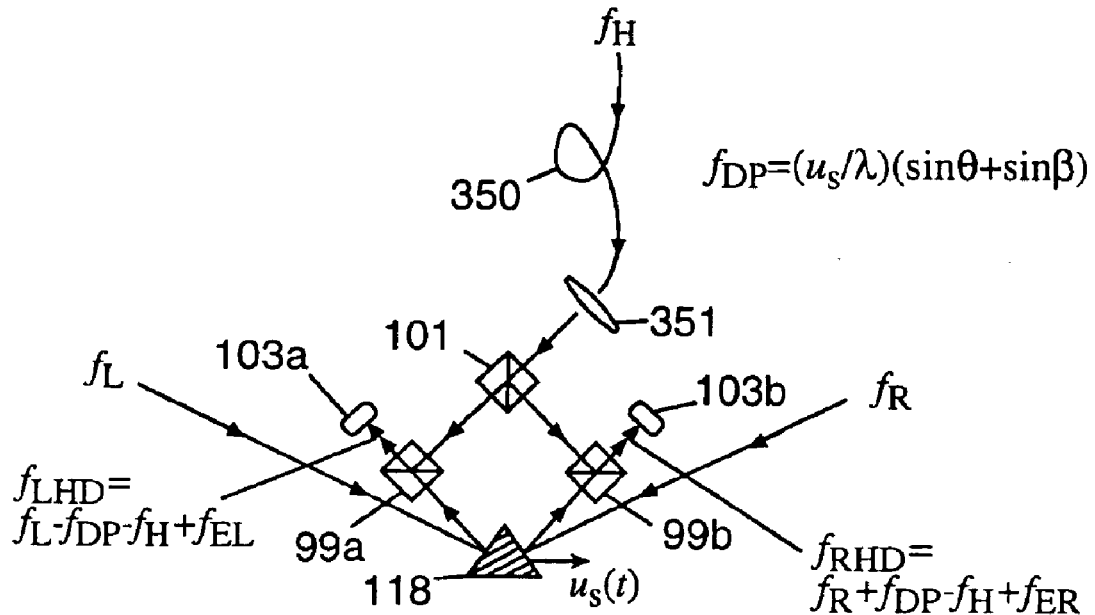
FIG. 48a is a schematic diagram of an exemplary embodiment of a heterodyne reading interferometer utilizing stage prism mirror, image phase is measured by interfering beams from each arm reflected from prism with heterodyne beams.

FIG. 48 depicts heterodyne methods of measuring image period and phase using a chuck prism. With reference to FIG. 48a, incident left and right reading beams are reflected by prism 118, attached to stage 30, becoming test beams that transmit through beam mixers 99 to detectors 103. Heterodyne light of frequency $f_H$ is brought through fiber 350 and collimated by lens 351 into free-space beam that is split by beamsplitter 101 into left and right reference beams. Reference beams are mixed with test beams by mixers 99 onto detectors 103. Left detector 103a measures signal $f_{LHD}=f_L-f_{DP}-f_H+f_{EL}$ and right detector 99b measures signal $f_{RHD}=f_R+f_{DP}-f_H+f_{ER}$. The difference frequency is calculated from $f_{SR}=f_{LHD}-f_{RHD}=\Delta f-2f_{DP}+f_E$, where $f_{DP}=(u_S/\lambda)(\sin\theta+\sin\beta)$. The period of the image is obtained from $p=(\frac{1}{2})/(f_{DP}/u_S+\sin\beta/\lambda)$ and the frequency error from $f_E=f_{EL}-f_{ER}=f_{SR}-\Delta f+2f_{DP}$.

Figure 48B:
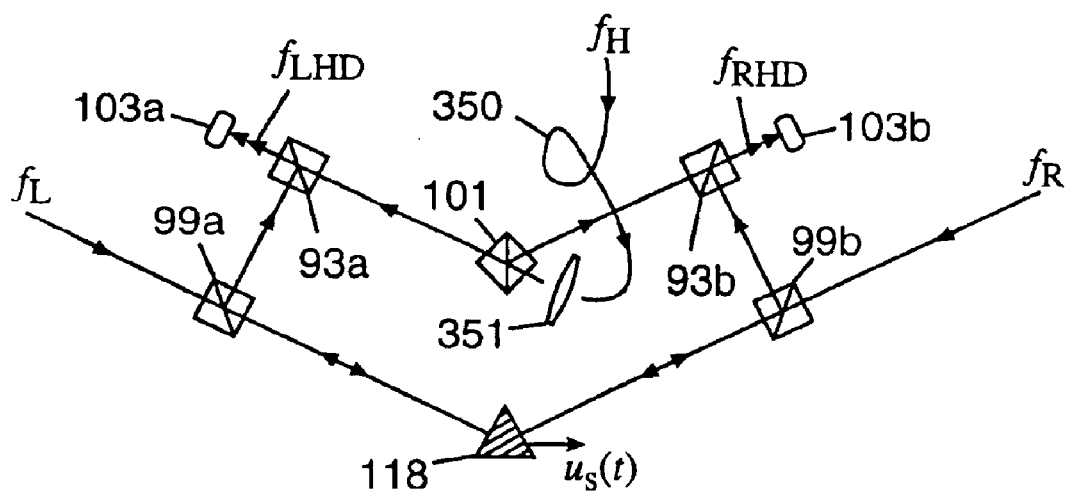
FIG. 48b is a schematic diagram of an exemplary embodiment of a heterodyne reading interferometer utilizing stage prism mirror, image phase is measured by interfering beams from each arm reflected from prism with heterodyne beams, in the special case that the incident and reflected beams from the prism are coincident.

FIG. 48b depicts a configuration similar to FIG. 48a, except that prism 118 has been designed such that $\beta=\theta$. Here incident left and right reading beams transmit through beamsplitters 99 and reflect from prism 118 back to beamsplitters 99, which reflect beams to mixers 93. Heterodyne light of frequency $f_H$ is brought through fiber 350 and collimated by lens 351 into free-space beam that is split by beamsplitter 101 into left and right reference beams. Reference beams are mixed with test beams by mixers 93 onto detectors 103. The period and frequency errors are determined identically as the method depicted in FIG. 48a.

Many alternative means for measuring image phase can be described that utilize gratings attached to stage 30. Both reflection and transmission grating designs can be described. The most useful reflection grating designs are depicted in FIGS. 49 and 50. In the figures, grating 117 is attached to stage 30, and travels with velocity $u_S$, while all other components are attached to optical bench 20 (see FIG. 42), although alternative designs can be described where the these components are attached to, and travel with, stage 30.

With reference to FIG. 49a, an interferometer configuration is depicted which measures image phase by interfering light from each arm diffracted by the grating with light from the same arm reflected from the grating. In the figure only beams generated by the right arm of the writing interferometer are depicted. Light from right arm impinges on grating 117 and splits into reflected zero-order and diffracted nth-order beams. Zero-order beam reflects from splitter 99a and transmits through mixer 93a, forming reference beam of frequency $f_R$. The nth-order diffracted beam from substrate 117 reflects from mixer 93a, forming test beam of frequency $f_{Rn}=f_R+f_{Dn}+f_E$. Test and reference beams interfere and are measured by detector 103a, generating signal $f_{Sn1}=f_{Dn}+f_E$, where $f_{Dn}=nu_S/g$ and g is the grating period. The frequency error is obtained from $f_E=f_{Sn1}-f_{Dn}$.

With reference to FIG. 49b, an interferometer configuration is depicted which measures image phase by interfering light from each arm diffracted by the grating with light from the opposite arm. In the figure only beams generated by the right arm of the writing interferometer are depicted. Light from right arm impinges on grating 117 and splits into reflected zero-order and diffracted nth-order beams. The nth-order beam reflects from mixer 93a, forming test beam of frequency $f_{Rn}$. Left beam reflects from splitter 99a and transmits through mixer 93a, forming reference beam of frequency $f_L$. Test and reference beams interfere and are measured by detector 103a, generating signal $f_{Sn2}=\Delta f-f_{Dn}+f_E$. The frequency error is obtained from $f_E=f_{S2n}+f_{Dn}-\Delta f$.

With reference to FIG. 49c, an interferometer configuration is depicted which measures image phase by interfering light from each arm diffracted by the grating with light from the opposite arm diffracted by the grating. Light from left arm impinges on grating 117 and splits into reflected zero-order and diffracted mth-order beams of frequency $f_{L2m}=f_L-f_{Dm}+f_{EL}$. Diffracted beam reflects from mirror 106b through mixer 99 onto detectors 103. Meanwhile, light from right arm impinges on grating 117 and splits into reflected zero-order and diffracted nth-order beams of frequency $f_{R2n}=f_R+f_{Dn}+f_{ER}$. Diffracted beam reflects from mirror 106a through mixer 99 onto detectors 103. Detectors 103 measure signal $f_{S3nm}=\Delta f+f_{Dn}+f_{Dm}+f_E$. The frequency error is obtained from $f_E=f_{EL}-f_{ER}=f_{S3nm}+f_{Dn}+f_{Dn}-\Delta f$.

With reference to FIG. 49d, an interferometer configuration is depicted which measures image phase by interfering light from each arm diffracted by the grating with light from the opposite arm diffracted by the grating, where the diffracted beams are coincident. Light from left arm impinges on grating 117 and splits into reflected zero-order and diffracted mth-order beams, while light from right arm impinges on grating 117 and also splits into reflected zero-order and diffracted nth-order beams, where the diffracted beams are coincident in angle. Diffracted beams impinge on detector 124, which measures signal $f_{S3nm}$. The frequency error is obtained from $f_E = f_{EL} - f_{ER} = f_{S3nm} + f_{Dn} + f_{Dm} - \Delta f$.

With reference to FIG. 49e, an interferometer configuration is depicted which measures image phase by interfering light from each arm diffracted by the grating with light from the same arm. In the figure only beams generated by the left arm of the writing interferometer are depicted. Light from left arm is split by beamsplitter 99a into reference and test beams. Test beam impinges on substrate 117 and is nth-order diffracted, acquiring frequency $f_{Ln}$, and is reflected by beamsplitter 93a to detector 103a. Reference beam transmits through beamsplitter 93a, mixing and interfering with test beam. Detector 103a measures signal $f_{S1n} = f_{Dn} + f_E$. The frequency error is obtained from $f_E = f_{Sn1} - f_{Dn}$.

With reference to FIG. 49f, an interferometer configuration is depicted which measures image phase by interfering light from each arm diffracted by the grating with light from the opposite arm reflected by the grating. In the figure only beams generated by the left arm of the writing interferometer are depicted. Light from left arm transmits through beamsplitter 99a, diffracts from substrate 117, now acquiring frequency $f_{Ln}$, and reflects from beamsplitter 93a onto detector 103a. Light from right arm reflects from substrate 117, reflects from beamsplitter 99a, and transmits through beamsplitter 93a onto detector 103a. Detector 103a measures signal $f_{S2n}$. The frequency error is obtained from $f_E = f_{S2n} + f_{Dn} - \Delta f$.

With reference to FIG. 49g, an interferometer configuration is depicted which measures image phase by interfering light from each arm diffracted by the grating with light from the opposite arm reflected by the grating, where the incident, diffracted, and reflected beams are coincident. Beams from reading arms transmit through beamsplitters 99 and are split into reflected and diffracted beams by substrate 117. Reflected beams are directed by opposite beamsplitters 99 to detectors 103, while diffracted beams are reflected by same-side beamsplitters 99 to detectors 103. Detectors 103 measure signal $f_{S2n}$. The frequency error is obtained from $f_E = f_{S2n} + f_{Dn} - \Delta f$.

With reference to FIG. 49h, an interferometer configuration is depicted which measures image phase by interfering light from each arm diffracted by the grating with light from the opposite arm reflected by the grating, where the diffracted and reflected beams are coincident, and cast into a different plane than the incident beams by tilting the plane of incidence. Light from reading arms is split into reflected and diffracted beams by substrate 117. Diffracted beams from each arm interfere with reflected beams from opposite arm onto detectors 103, measuring signal $f_{S2n}$. The frequency error is obtained from $f_E = f_{S2n} + f_{Dn} - \Delta f$.

FIG. 50 depicts a heterodyne method of measuring image phase using a reflection grating. Incident left and right writing beams are diffracted by grating 117, attached to stage 30, becoming test beams that reflect from beam mixers 99 to detectors 103. Heterodyne light of frequency $f_H$ is delivered by fiber 350 and collimated by lens 351 into free-space beam that is split by beamsplitter 101 into left and right reference beams. Reference beams are mixed with test beams by mixers 99 onto detectors 103. Left detector 103a measures signal $f_{LHGn} = f_L - f_{Dn} - f_H + f_{EL}$ and right detector 99b measures signal $f_{RHGm} = f_R + f_{Dm} - f_H + f_{ER}$. The stage frequency is calculated $f_{SGmn} = f_{LHGn} - f_{RHGm} = \Delta f - f_{Dn} - f_{Dm} + f_E$. The frequency error is obtained from $f_E = f_{EL} - f_{ER} = f_{SGmn} + f_{Dn} + f_{Dm} - \Delta f$.

Many alternative means for measuring image phase can be described that utilize transmission gratings attached to stage 30. The most useful are depicted in FIGS. 51 and 52. In the figures, grating 117 and all other optical components shown are attached to stage 30, and travel with velocity $u_S$, although alternative designs can be described where the these components are attached to optical bench 20 (see FIG. 42).

With reference to FIG. 51a, an interferometer configuration is depicted which measures image phase by interfering light from each arm transmitted by the grating with light from the opposite arm diffracted from the grating, such that the zero order of each arm is coincident with a diffracted order of the opposite arm. Light from each arm is split by grating 117 into zero-order hand diffracted beams, which impinge on detectors 103. Light from opposite arms interfere and are measured by detectors 103, generating signal $f_S = \Delta f - 2f_D + f_E$. The frequency error is obtained from $f_E = f_S - \Delta f + 2f_D$.

With reference to FIG. 51b, an interferometer configuration is depicted which measures image phase by interfering light from each arm diffracted by the grating with light from the opposite arm diffracted by the grating, such that diffracted beams are coincident. Light from each arm is split by grating 117 into zero-order (not shown) and diffracted beams, which impinge on detector 124. Coincident diffracted light from opposite arms interfere and are measured by detectors 103, generating signal $f_S$. The frequency error is obtained from $f_E = f_S - \Delta f + 2f_D$.

With reference to FIG. 51c, an interferometer configuration is depicted which measures image phase by interfering light from each arm diffracted by the grating with light from the opposite arm diffracted by the grating, such that diffracted beams are not coincident. Light from each arm is split by grating 117 into zero-order (not shown) and diffracted beams, which are directed by mirrors 106 to beamsplitter 101, which in turn overlaps and interferes the diffracted beams from both arms onto detectors 103, generating signal $f_S$. The frequency error is obtained from $f_E = f_S - \Delta f + 2f_D$.

FIG. 52 depicts a heterodyne method of measuring image phase using a transmission grating. Incident left and right reading beams are diffracted by grating 117, attached to stage 30, becoming test beams that reflect from beam mixers 99 to detectors 103. The left beam of initial frequency $f_L$ is Doppler shifted to frequency $f_L - f_D + f_{EL}$, and the right beam of initial frequency $f_R$ is Doppler shifted to frequency $f_R + f_D + f_{ER}$. Heterodyne light of frequency $f_H$ is delivered by fiber 350 and collimated by lens 351 into free-space beam that is split by beamsplitter 101 into left and right reference beams. Reference beams are mixed with test beams by mixers 99 onto detectors 103. Left detector 103a measures signal $f_{SLH} = f_L - f_D - f_H + f_{EL}$ and right detector 99b measures signal $f_{SRH} = f_R + f_D - f_H + f_{ER}$. The difference frequency is calculated from $f_S = f_{SLH} - f_{SRH} = \Delta f - 2f_D + f_E$. The frequency error is obtained from $f_E = f_{EL} - f_{ER} = f_S \Delta f + 2f_D$.

The following is a glossary of terms for use with the description of the invention:

| | |
|---|---|
| IL | interference lithography, also known as interferometric lithography or holographic lithography |
| SBIL | scanning beam interference lithography |
| AIL | achromatic interference lithography |
| RF | radio frequency |
| UV | ultraviolet |
| writing interferometer | interferometer configured to write fringes on substrate |
| reading interferometer | interferometer configured to read periodic patterns on substrate |
| phase-reference interferometer (PRI) | subsystem of writing/reading interferometer designed to measure phase or frequency difference between the arms |
| homodyne PRI | PRI where the arms are mixed with each other |
| heterodyne PRI | PRI where each arm is mixed with a heterodyne beam |
| plane of incidence (POI) | plane made by left and right interferometer arms incident on substrate |
| image | periodic pattern on substrate resulting from intersection of writing interferometer beams |
| image plane | plane of substrate surface |
| image phase | phase difference between left and right interferometer arms |
| image frequency | frequency difference between left and right interferometer arms |
| angular heterodyne | optic which expands a small range of angles about a large angle offset into a range of angles about zero angle |
| $\theta$ | half the angle between the arms of reading/writing interferometer, also called the half angle or azimuthal angle |
| $\psi$ | rotation angle of the POI about the z axis, defined as the CCW angle between the x axis and the intersection of the POI with the x-y plane, corresponding to the rotation of fringes in the x-y plane, defined as the CCW angle between the y axis and the image fringes |
| $\zeta$ | tilt angle of POI from the z axis |
| $\lambda$ | wavelength of light in beams |
| $f = c/\lambda$ | frequency of light in beams |
| c | speed of light |
| $p = \lambda/(2\sin\theta)$ | grating period of image |
| $p_1, p_2, p_3, \ldots$ | period in first, second, third, etc . . . , scans |
| $\Delta p$ | period difference between adjacent scans |
| $q = 1/p$ | grating spatial frequency |
| x | x-coordinate of stage reference frame |
| y | y-coordinate of stage reference frame |
| z | z-coordinate of stage reference frame (grating image is fixed in stage frame at $x = y = z = 0$) |
| t | time |
| $x_S(t)$ | x-position of substrate center in stage frame |
| $y_S(t)$ | y-position of substrate center in stage frame |
| $z_S(t)$ | z-position of substrate surface at image center (stage frame $x = y = 0$) |
| $u_S(t) = dx_S/dt$ | x-axis velocity of substrate in stage frame |
| $v_S(t) = dy_S/dt$ | y-axis velocity of substrate in stage frame |
| $w_S(t) = dz_S/dt$ | z-axis velocity of substrate surface at image center (stage frame $x = y = 0$) |
| $x_L(t)$ | x-position of left beam center in stage frame |
| $y_L(t)$ | y-position of left beam center in stage frame |
| $x_R(t)$ | x-position of right beam center in stage frame |
| $y_R(t)$ | y-position of right beam center in stage frame |
| $\theta_{(i)}$ | angle between beams in writing/reading interferometer for ith pair of beams in single plane of incidence |
| N | number of beam pairs |
| $i = 1, 2, 3, \ldots, N$ | index for N beam pairs |
| d | beam diameter |
| $d_{par} = d/\cos\theta$ | image diameter on substrate in direction parallel to plane of incidence |
| $d_{perp} = d$ | image diameter on substrate in direction perpendicular to plane of incidence |
| $\Delta x = Mp \ll d_{par}$ | stage scanning increment, equals integer multiple M of period p |
| M | integer period increment |
| $x_0$ | desired stage x-axis position during scanning |
| $\delta x_S(t) = x_S(t) - x_0 \ll p$ | x-axis position error during scanning and condition for controlling stage lateral error |
| $\delta\phi(t) = 2\pi\delta x_S/p \ll 2\pi$ | grating phase error during scanning and condition for controlling grating phase error |
| $\gamma_0$ | desired stage yaw during scanning |
| $\delta\gamma_S(t) = \gamma_S(t) - \gamma_0 \ll p/d$ | stage yaw error during scanning and condition for controlling stage yaw error |
| $L \sim p/2$ | width of grating lines in image |
| $\delta L(t) = d\delta\gamma_S(t) \ll L$ | linewidth variation during scanning and condition for controlling stage yaw error |

-continued

| Symbol | Description |
|---|---|
| $\phi_L$ | phase of left writing-interferometer arm |
| $\phi_R$ | phase of right writing-interferometer arm |
| $\Delta\phi = \phi_L - \phi_R$ | phase difference between left and right interferometer arms, also known as image phase |
| $f_L = d\phi_L/dt/2\pi$ | frequency of left writing-interferometer arm |
| $f_R = d\phi_R/dt/2\pi$ | frequency of right writing-interferometer arm |
| $\Delta f = f_L - f_R = d\Delta\phi/dt/2\pi$ | frequency difference between left and right interferometer arms, also known as image frequency |
| $x_F(t) = p\Delta\phi/2\pi$ | fringe x-position |
| $u_F = dx_F/dt = p\Delta f$ | fringe x-velocity |
| $x_F(t) = x_S(t)$ | condition for stage x-position phase locking |
| $u_F(t) = u_S(t)$ | condition for stage x-velocity frequency locking |
| $\Delta\phi_K = 2\pi x_S(t)/p + C$ | locked image phase necessary to lock image to stage |
| $\delta\phi = \Delta\phi_K - \Delta\phi$ | image phase-lock error controlled to zero |
| $\Delta f_K = d\Delta\phi_K/dt/2\pi = u_S(t)/p$ | locked image frequency necessary to lock image to stage |
| $C$ | arbitrary phase constant |
| $X$ | X-coordinate of substrate reference frame |
| $Y$ | Y-coordinate of substrate reference frame |
| $Z$ | Z-coordinate of substrate reference frame |
| $R = (X^2 + Y^2)^{1/2}$ | radius coordinate of substrate reference plane |
| $\gamma$ | substrate rotation (yaw) |
| $\gamma_S(t)$ | substrate rotation (yaw) CW angle between X-Y and x-y axes |
| $\omega_S(t) = d\gamma_S/dt$ | substrate rotational velocity (spin) |
| $Z_W(X,Y)$ | map of image surface height |
| $X_B(t) = -x_S\cos\gamma_S + y_S\sin\gamma_S$ | X position of image center in substrate frame |
| $Y_B(t) = -x_S\sin\gamma_S - y_S\cos\gamma_S$ | Y position of image center in substrate frame |
| $Z_B(t) = Z_W(X_B, Y_B) = z_S(t)$ | Z position of substrate surface at image center |
| $U_B(t) = dX_B/dt = (x_S\omega_S + v_S)\sin\gamma_S + (y_S\omega_S - u_S)\cos\gamma_S$ | X velocity of image center in substrate frame |
| $V_B(t) = dY_B/dt = (y_S\omega_S - u_S)\sin\gamma_S - (x_S\omega_S + v_S)\cos\gamma_S$ | Y velocity of image center in substrate frame |
| $W_B(t) = \dfrac{dZ_B}{dt} = \dfrac{dZ_B}{dX_B}U_B + \dfrac{dZ_B}{dY_B}V_B$ | Z velocity of substrate surface at image center |
| $K$ | number of planes of incidence |
| $j = 1, 2, 3, \ldots, K$ | index for K planes of incidence |
| $N_j$ | number of beam pairs in plane of incidence (POI)j |
| $N$ | number of beam pairs for case $K = 1$ |
| $i = 1, 2, 3, \ldots, N_j$ | index for $N_j$ beam pairs |
| $(i, j)$ | indicates ith beam pair in jth plane of incidence |
| $(i)$ | indicates ith beam pair in single plane of incidence ($K = 1$) |
| (min) | beam pair corresponding to minimum $\theta$ angle (largest spatial frequency) |
| (max) | beam pair corresponding to maximum $\theta$ angle (smallest spatial frequency) |
| $a_{L(i,j)}$ | amplitude of left beam of ith beam pair in POIj |
| $\phi_{L(i,j)}$ | phase of left beam of ith beam pair in POIj |
| $f_{L(i,j)} = d\phi_{L(i,j)}/dt/2\pi$ | frequency of left beam of ith beam pair in POIj |
| $\theta_{L(i,j)}$ | azimuthal angle of left beam of ith beam pair in POIj |
| $\psi_{L(i,j)}$ | rotation angle of left beam of ith beam pair in POIj |
| $a_{R(i,j)}$ | amplitude of right beam of ith beam pair in POIj |
| $\phi_{R(i,j)}$ | phase of right beam of ith beam pair in POIj |
| $f_{R(i,j)} = d\phi_{R(i,j)}/dt/2\pi$ | frequency of right beam of ith beam pair in POIj |
| $\theta_{R(i,j)}$ | azimuthal angle of right beam of ith beam pair in POIj |
| $\psi_{R(i,j)}$ | rotation angle of right beam of ith beam pair in POIj |
| $a_{(i,j)} = a_{L(i,j)} + a_{R(i,j)} = 2a_{L(i,j)} = 2a_{R(i,j)}$ | image amplitude |
| $\psi_j = (\psi_{L(i,j)} + \psi_{R(i,j)})/2$ | rotation angle of POIj (constant) |
| $\zeta_j = (\psi_{L(i,j)} - \psi_{R(i,j)})/2$ | tilt of POIj (constant) |
| $\delta\psi_{L(i,j)}$ | rotation angle error of left beam out of POI |
| $\delta\psi_{R(i,j)}$ | rotation angle error of right beam out of POI |
| $\delta\psi_j(t) = (\delta\psi_{L(i,j)} + \delta\psi_{R(i,j)})/2 \ll p/d$ | POI rotation angle error due to incident angle variation and condition for image rotation angle control |
| $\delta\zeta_j(t) = (\delta\psi_{L(i,j)} - \delta\psi_{R(i,j)})/2$ | POI tilt angle error due to incident angle variations |
| $\theta_{(i,j)} = (\theta_{L(i,j)} + \theta_{R(i,j)})/2$ | image azimuthal angle |
| $\theta_{T(i,j)} = (\theta_{L(i,j)} - \theta_{R(i,j)})/2$ | image tilt angle |
| $\delta\theta_{L(i,j)}$ | azimuthal angle error of left beam in POI |
| $\delta\theta_{R(i,j)}$ | azimuthal angle error of right beam in POI |
| $\delta\theta_{(i,j)}(t) = (\delta\theta_{L(i,j)} + \delta\theta_{R(i,j)})/2 \ll (p/d)\tan\theta$ | condition for controlling image period change due to azimuthal angle change |
| $\delta\theta_{T(i,j)}(t) = (\delta\theta_{L(i,j)} - \delta\theta_{R(i,j)})/2 \ll (2p/d)^{1/2}$ | condition for controlling image period change due to fringe tilts |
| $\delta\theta(t) \ll 2p/\Delta z$ | condition for controlling image phase change due to fringe tilts and sample z variation |
| $p_{(i,j)} = \lambda/(2\sin\theta_{(i,j)})$ | image period |
| $\Delta\phi_{(i,j)} = \phi_{L(i,j)} - \phi_{R(i,j)}$ | relative image phase |
| $\Delta f_{(i,j)} = f_{L(i,j)} - f_{R(i,j)} = d\Delta\phi_{(i,j)}/dt/2\pi$ | relative image frequency |
| $\chi_{(i,j)} = \phi_{L(i,j)}$ | absolute image phase |
| $\xi_{(i,j)} = \xi_{L(i,j)} = d\chi_{(i,j)}/dt/2\pi$ | absolute image frequency |
| $Q_{(i,j)}(X,Y)$ | desired spatial frequency map |
| $P_{(i,j)}(X,Y) = 1/Q_{(i,j)}(X,Y)$ | desired period map |

-continued

| | |
|---|---|
| $\Theta_{(i,j)}(X,Y) = \sin^{-1}[\lambda/(2P_{(i,j)})]$ | desired azimuthal angle map |
| $A_{(i,j)}(X,Y)$ | desired amplitudes map |
| $\Gamma_j(X,Y) = \psi_j - (\psi_1 - \Gamma_1)$ | desired rotation angles map: CCW angle between Y axis and fringes |
| $\Phi_{(i,j)}(X,Y)$ | desired relative phase map |
| $\Xi_{(i,j)}(X,Y)$ | desired absolute phase map |
| $G_{(i,j)}(X,Y)$ | intensity profile of Gaussian beams projected onto substrate |
| T | time duration of exposure |
| $D_{(i,j)}(X,Y) = \int_0^T a_{(i,j)}^2(X_B, Y_B)G_{(i,j)}(X - X_B, Y - Y_B)dt$ | energy dose absorbed in resist |
| $\gamma_K(t) = \psi_j + \Gamma_j(X_B, Y_B)$ | locked rotation angle |
| $\omega_K(t) = \dfrac{d\gamma_K}{dt} = \dfrac{\partial \Gamma_j}{\partial X_B}U_B + \dfrac{\partial \Gamma_j}{\partial Y_B}V_B$ | locked spin |
| $x_K(t) = -X_B\cos\gamma_K - Y_B\sin\gamma_K$ | locked x position |
| $y_K(t) = X_B\sin\gamma_K - Y_B\cos\gamma_K$ | locked y position |
| $u_K(t) = \dfrac{dx_K}{dt} = -U_B\cos\gamma_K + X_B\omega_K\sin\gamma_K - V_B\sin\gamma_K - Y_B\omega_K\cos\gamma_K$ | locked x velocity |
| $v_K(t) = \dfrac{dy_K}{dt} = U_B\sin\gamma_K + X_B\omega_K\cos\gamma_K - V_B\cos\gamma_K + Y_B\omega_K\sin\gamma_K$ | locked y velocity |
| $a_{K(i,j)}(t) = A_{(i,j)}(X_B,Y_B)$ | locked amplitude |
| $p_{K(i,j)}(t) = P_{(i,j)}(X_B,Y_B)$ | locked period |
| $\theta_{K(i,j)} = \Theta_{(i,j)}(X_B,Y_B)$ | locked azimuthal angle |
| $\Delta\phi_{K(i,j)}(t) = \Phi_{(i,j)}(X_B,Y_B)$ | locked relative image phase |
| $\Delta f_{K(i,j)}(t) = d\Phi_{(i,j)}/dt/2\pi = Q_{(i,j)}(X_B,Y_B)[U_B(t)\cos\Gamma_j + V_B(t)\sin\Gamma_j]$ | locked relative image frequency |
| $\chi_{K(i,j)}(t) = \Xi_{(i,j)}(X_B, Y_B) + \dfrac{2\pi}{\lambda}\int_0^t \cos\Theta_{(i,j)}(X_B, Y_B)W_B d\tau$ | locked absolute image phase |
| $\xi_{K(i,j)}(t) = \dfrac{d\Xi_{(i,j)}}{dt} + \dfrac{2\pi}{\lambda}\cos\Theta_{(i,j)}(X_B, Y_B)W_B$ | locked absolute image frequency |
| $f_0$ | laser frequency |
| $F_{(i)}$ | RF frequency |
| $\Lambda_{(i)} = S/F_{(i)}$ | sound wavelength |
| S | sound velocity in AO modulator crystal |
| $f_{(i)} = f_0 + F_{(i)}$ | first order Bragg frequency |
| $\theta_{B(i)} = \lambda F_{(i)}/S$ | Bragg angle of first order beam |
| $\theta_{(min)}$ | minimum angle available |
| $\theta_{(max)}$ | maximum angle available |
| $f_{R(i,j)} = f_0 + F_{R(i,j)}$ | first order Bragg frequency in right arm |
| $f_{L(i,j)} = f_0 + F_{L(i,j)}$ | first order Bragg frequency in left arm |
| $N_\pi$ | $\pi$-phase limit for phase shifting device |
| $V_\pi$ | voltage corresponding to $\pi$ phase shift |
| $t_{FB}$ | flyback time |
| $f_H = f_0 + F_H$ | heterodyne frequency of light |
| $F_H$ | heterodyne RF frequency |
| $f_{LH} = f_L - f_H$ | left arm heterodyne frequency |
| $f_{RH} = f_R - f_H$ | right arm heterodyne frequency |
| $\Delta f = f_L - f_R = f_{LH} - f_{RH}$ | image frequency (arms frequency difference) |
| $f_{ref} = f_{LH} - f_L = F_H$ | reference heterodyne frequency |
| $f_{pr} = f_{LH} - f_R = \Delta f + F_H$ | arms phase difference heterodyne frequency |
| $\Delta f = f_L - f_R = f_{pr} - f_{ref}$ | image frequency (arms frequency difference) |
| m | diffraction order |
| $\Delta\phi_{Rm} = -2\pi m\Delta x/p$ | phase shift in right arm due to moving grating |
| $\Delta\phi_{Lm} = 2\pi m\Delta x/p$ | phase shift in left arm due to moving grating |
| $\Delta\phi_m = \Delta\phi_{Lm} - \Delta\phi_{Rm} = 4\pi m\Delta x/p$ | image phase shift of due to moving grating |
| $f_{R\omega} = -2\pi m\omega r/g_\omega$ | frequency shift in right arm due to spinning grating |
| $f_{L\omega} = 2\pi m\omega r/g_\omega$ | frequency shift in left arm due to spinning grating |
| $\Delta f_\omega = f_{L\omega} - f_{R\omega} = 4\pi m\omega r/g_\omega$ | frequency shift due to spinning grating |
| $\omega$ | spin speed of disk beamsplitter grating |
| r | radius of disk beamsplitter grating |
| $g_\omega$ | period of grating on disk beamsplitter |
| $\Delta\phi_D = (8\pi\Delta y/\lambda)\sin\theta\sin\epsilon$ | phase shift due to moving substrate |
| $\epsilon$ | angle between y-axis and stage beamsplitter face |
| $x_\phi$ | point defined as zero phase $\phi = 0$ |
| x' | axis parallel to beamsplitter face |
| y' | axis perpendicular to beamsplitter face |

-continued

| | |
|---|---|
| $\Delta f = f_L - f_R$ | image frequency (phase reference frequency) |
| $f_S = \Delta f - 2f_D + f_E$ | stage frequency |
| $f_D = (u_S/\lambda)\sin\theta = u_S/(2p)$ | Doppler frequency |
| $p = u_S/(\Delta f - f_S)$ | period relationship for homodyne case |
| $f_E = f_S - \Delta f + 2f_D$ | frequency error for homodyne case |
| | phase error |
| $\phi_E(t) = 2\pi \int_{t_0}^{t} f_E(\tau)d\tau + \phi_0$ | |
| $t_0$ | start time |
| $\phi_0$ | phase at $t = t_0$ |
| $\Delta f_H = \Delta f + f_H$ | heterodyne image frequency |
| $f_{SH} = \Delta f_H - 2f_D + f_E$ | heterodyne stage frequency |
| $p = u_S/(\Delta f_H - f_{SH})$ | period relationship for heterodyne case |
| $f_E = f_{SH} - \Delta f_H + 2f_D$ | frequency error for heterodyne case |
| $f_{SLH} = f_{LH} - f_D + f_{EL}$ | left heterodyne stage frequency |
| $f_{SRH} = f_{RH} - f_D + f_{ER}$ | right heterodyne stage frequency |
| $f_S = f_{SLH} - f_{SRH} = \Delta f - 2f_D + f_E$ | stage frequency |
| $f_{EL}$ | left arm frequency error |
| $f_{ER}$ | right arm frequency error |
| $f_E = f_{EL} - f_{ER} = f_S - \Delta f + 2f_D$ | frequency error |
| $f_{DP} = (u_S/\lambda)(\sin\theta + \sin\beta)$ | Doppler frequency reflected from stage prism |
| $\beta$ | angle of beam reflected from prism |
| $f_{SI} = f_{DP} + f_E$ | measured stage prism Doppler frequency mixed with incident |
| $f_{SR} = \Delta f - 2f_{DP} + f_E$ | measured stage prism Doppler frequency mixed with reflected |
| $p = (1/2)/(f_{DP}/u_S + \sin\beta/\lambda)$ | relationship for period in prism case |
| $f_E = f_{SI} - f_{DP}$ | relationship for frequency error in prism incident case |
| $f_E = f_{SR} - \Delta f + 2f_{DP}$ | relationship for frequency error in prism reflected case |
| $f_{LHD} = f_L - f_{DP} - f_H + f_{EL}$ | left hand heterodyne frequency from prism |
| $f_{RHD} = f_R + f_{DP} - f_H + f_{ER}$ | right hand heterodyne frequency from prism |
| $f_E = f_{EL} - f_{ER} = \Delta f_{SR} - \Delta f + 2f_{DP}$ | relationship for frequency error in heterodyne prism case |
| $f_{Rn} = f_R + f_{Dn} + f_E$ | frequency of nth order (right) beam diffracted from grating |
| $f_{Ln} = f_L - f_{Dn} + f_E$ | frequency of nth order (left) beam diffracted from grating |
| $f_{R2n} = f_R + f_{Dn} + f_{ER}$ | frequency of nth order (right) beam diffracted from grating |
| $f_{L2m} = f_L - f_{Dm} + f_{EL}$ | frequency of mth order (left) beam diffracted from grating |
| $f_{Dn} = nu_S/g$ | nth order Doppler frequency from grating |
| $g$ | grating period |
| $f_{S1n} = f_{Dn} + f_E$ | stage frequency from grating (1st type) |
| $f_E = f_{Sn1} - f_{Dn}$ | relationship for determining frequency error (1st type) |
| $f_{S2n} = \Delta f - \Delta f - f_{Dn} + f_E$ | frequency signal from grating (2nd type) |
| $f_E = f_{S2n} + f_{Dn} - \Delta f$ | relationship for determining frequency error (2nd type) |
| $f_{S3nm} = \Delta f - f_{Dn} - f_{Dm} + f_E$ | frequency signal from grating (3rd type) |
| $f_E = f_{EL} - f_{ER} = f_{S3nm} + f_{Dn} + f_{Dm} - \Delta f$ | relationship for determining frequency error (3rd type) |
| $f_{LHGn} = f_L - f_{Dn} - f_H + f_{EL}$ | left hand grating Nth order heterodyne frequency |
| $f_{RHGm} = f_R + f_{Dm} - f_H + f_{ER}$ | right hand grating Mth order heterodyne frequency |
| $f_{SGmn} = f_{LHGn} - f_{RHGm} = \Delta f - f_{Dn} - f_{Dm} + f_E$ | heterodyne difference frequency from grating |
| $f_E = f_{EL} - f_{ER} = f_{SGmn} + f_{Dn} + f_{Dm} - \Delta f$ | relationship for frequency error in heterodyne grating case |

Although the present invention has been shown and described with respect to several preferred embodiments thereof, various changes, omissions and additions to the form and detail thereof, may be made therein, without departing from the spirit and scope of the invention.

What is claimed is:

1. A method of writing patterns onto workpieces, comprising:

directing a plurality of beams to converge and substantially overlap in a common region on a workpiece, each beam being mutually coherent with at least one other of said beams such that, in the region of overlap, overlapping beams form interference fringes to define a writing image;

relatively moving, while writing patterns onto said workpiece, said workpiece with respect to said writing image;

measuring the phase of said interference fringes of said writing image with respect to points on said workpiece; and controlling, while writing patterns onto said workpiece and using the measured phase of said interference fringes of said writing image, the phases of said beams to correct for phase errors of said interference fringes of said writing image.

2. The method according to claim 1 further comprising controlling, while writing patterns onto said workpiece, positions, periods and/or angles of said interference fringes.

3. The method according to claim 2, wherein said controlling the positions, periods and/or angles of said interference fringes comprises sensing, while writing patterns onto said workpiece, positions, phases, periods and/or angles of said interference fringes in order to provide feedback for correcting the positions, phases, periods and/or angles of said interference fringes.

4. The method according to claim 2, wherein said controlling the positions, periods and/or angles of said interference fringes comprises controlling angles of said beams.

5. The method according to claim 4, wherein said controlling the positions, periods and/or angles of said interference fringes comprises sensing angles and/or phases of said beams in order to provide feedback for correcting the positions, periods and/or angles of said interference fringes.

6. The method of claim 2, wherein said controlling the positions, periods and/or angles of said interference fringes comprises sensing, while writing patterns onto said workpiece, relative position and/or rotation of said workpiece in order to provide feedback for correcting the positions, periods and/or angles of said interference fringes.

7. The method according to claim 1, wherein said relatively moving said workpiece with respect to said writing image comprises moving said workpiece.

8. The method according to claim 1, wherein said relatively moving said workpiece with respect to said writing image comprises moving said writing image.

9. The method according to claim 1, wherein said relatively moving said workpiece with respect to said writing image comprises moving said interference fringes.

10. The method according to claim 1, further comprising controlling the relative position and/or rotation of said interference fringes with respect to said workpiece.

11. The method according to claim 10, wherein said controlling said interference fringes comprises sensing a relative position and/or rotation of said workpiece in order to provide feedback for correcting the positions, periods and/or angles of said interference fringes.

12. The method according to claim 10, wherein said controlling said interference fringes comprises sensing the positions, phases, periods and/or angles of said interference fringes in order to provide feedback for correcting the positions, phases, periods and/or angles of said interference fringes.

13. The method according to claim 10, wherein said controlling said interference fringes comprises sensing angles and/or phases of said beams in order to provide feedback for correcting the positions, phases, periods and/or angles of said interference fringes.

14. The method according to claim 1 further comprising controlling amplitudes and contrasts of said interference fringes.

15. The method according to claim 14, wherein said controlling amplitudes and contrasts of said interference fringes comprises sensing the amplitudes and contrasts of said interference fringes in order to provide feedback for correcting the amplitudes and contrasts of said interference fringes.

16. The method according to claim 14, wherein said controlling the amplitudes and contrasts of said interference fringes comprises controlling the intensities of said beams.

17. The method according to claim 16, wherein said controlling the intensities of said beams comprises sensing the intensities of said beams in order to provide feedback for correcting the intensities of said beams.

18. The method according to claim 1, wherein said relatively moving said workpiece with respect to said writing image comprises moving with respect to relative translation, rotation and/or tilt.

19. The method according to claim 1, further comprising controlling the relative position and/or rotation of said interference fringes with respect to said workpiece such that said interference fringes are substantially stationary in the reference frame of said workpiece.

20. The method according to claim 1, further comprising controlling, prior to writing patterns onto said workpiece, positions, periods and/or angles of said interference fringes.

21. The method according to claim 20, wherein said controlling the positions, periods and/or angles of said interference fringes comprises sensing, prior to writing patterns onto said workpiece, positions, phases, periods and/or angles of said interference fringes in order to provide feedback for correcting the positions, periods and/or angles of said interference fringes.

22. The method according to claim 20, wherein said controlling the positions, periods and/or angles of said interference fringes comprises controlling angles of said beams.

23. The method according to claim 22, wherein said controlling the positions, periods and/or angles of said interference fringes comprises sensing angles and/or phases of said beams in order to provide feedback for correcting the positions, periods and/or angles of said interference fringes.

24. The method of claim 20, wherein said controlling the positions, periods and/or angles of said interference fringes comprises sensing, while writing patterns onto said workpiece, relative position and/or rotation of said workpiece in order to provide feedback for correcting the positions, periods and/or angles of said interference fringes.

25. A system for writing patterns onto workpieces, comprising:

means for directing a plurality of beams to converge and substantially overlap in a common region on a workpiece, each beam being mutually coherent with at least one other of said beams such that, in the region of overlap, overlapping beams form interference fringes to define a writing image;

means for relatively moving, while writing patterns onto said workpiece, said workpiece with respect to said writing image;

means for measuring the phase of said interference fringes of said writing image with respect to points on said workpiece; and means for controlling, while writing patterns onto said workpiece and using the measured phase of said interference fringes of said writing image, the phases of said beams to correct for phase errors of said interference fringes of said writing image.

26. The system according to claim 25, further comprising means for controlling the relative position and/or rotation of said interference fringes with respect to said workpiece.

27. The system according to claim 25, further comprising means for controlling the relative position and/or rotation of said interference fringes with respect to said workpiece such that said interference fringes are substantially stationary in the reference frame of said workpiece.

28. The system according to claim 25, further comprising means for controlling, while writing patterns onto said workpiece, positions, periods and/or angles of said interference fringes.

29. The system according to claim 25, further comprising means for controlling, prior to writing patterns onto said workpiece, positions, periods and/or angles of said interference fringes.

30. The system according to claim 28, wherein said means for controlling the positions, periods and/or angles of said interference fringes comprises means for sensing, while writing patterns onto said workpiece, positions, phases, periods and/or angles of said interference fringes in order to provide feedback for correcting the positions, periods and/or angles of said interference fringes.

31. The system according to claim 28, wherein said means for controlling the positions, periods and/or angles of said interference fringes comprises means for sensing, prior to writing patterns onto said workpiece, positions, phases, periods and/or angles of said interference fringes in order to provide feedback for correcting the positions, periods and/or angles of said interference fringes.

* * * * *